(12) United States Patent
Inoue et al.

(10) Patent No.: US 8,772,082 B2
(45) Date of Patent: Jul. 8, 2014

(54) LIGHT-EMITTING ELEMENT AND LIGHT-EMITTING DEVICE

(71) Applicant: Semiconductor Energy Laboratory Co., Ltd., Kanagawa-ken (JP)

(72) Inventors: Hideko Inoue, Kanagawa (JP); Nobuharu Ohsawa, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/912,430

(22) Filed: Jun. 7, 2013

(65) Prior Publication Data

US 2013/0273680 A1  Oct. 17, 2013

Related U.S. Application Data

(63) Continuation of application No. 13/196,312, filed on Aug. 2, 2011, now Pat. No. 8,461,580, which is a continuation of application No. 12/618,002, filed on Nov. 13, 2009, now Pat. No. 7,999,254.

(30) Foreign Application Priority Data

Nov. 17, 2008  (JP) ................. 2008-293731

(51) Int. Cl.
*H01L 51/30* (2006.01)
*H01L 51/40* (2006.01)
*H01L 51/00* (2006.01)
*H01L 51/50* (2006.01)
*C09K 11/06* (2006.01)
*H05B 33/14* (2006.01)
*H01L 51/56* (2006.01)

(52) U.S. Cl.
CPC .............. *H01L 51/56* (2013.01); *H01L 51/009* (2013.01); *H01L 51/5036* (2013.01); *C09K 11/06* (2013.01); *H01L 51/0085* (2013.01); *C09K 2211/1007* (2013.01); *H05B 33/14* (2013.01); *C09K 2211/1044* (2013.01); *C09K 2211/185* (2013.01)
USPC 438/99; 257/40; 257/E51.001; 257/E51.018; 257/E51.019; 257/E51.026

(58) Field of Classification Search
USPC ............... 438/99; 257/40, E51.001, E51.018, 257/E51.019, E51.026
See application file for complete search history.

(56) References Cited

U.S. PATENT DOCUMENTS

| | | | |
|---|---|---|---|
| 6,838,019 B2 | 1/2005 | Kuo et al. | |
| 7,652,283 B2 | 1/2010 | Inoue et al. | |
| 7,737,277 B2 | 6/2010 | Ionkin et al. | |
| 7,939,821 B2 | 5/2011 | Inoue et al. | |
| 7,960,038 B2 | 6/2011 | Ohsawa et al. | |
| 2004/0127710 A1 | 7/2004 | Park et al. | |
| 2005/0221123 A1 | 10/2005 | Inoue et al. | |
| 2005/0253135 A1 | 11/2005 | Stossel et al. | |
| 2006/0127696 A1 | 6/2006 | Stossel et al. | |
| 2006/0263636 A1* | 11/2006 | Ohsawa et al. | 428/690 |
| 2007/0034854 A1* | 2/2007 | Inoue et al. | 257/13 |
| 2007/0222376 A1 | 9/2007 | Ohsawa et al. | |
| 2007/0244320 A1 | 10/2007 | Inoue et al. | |
| 2008/0176102 A1* | 7/2008 | Thompson et al. | 428/690 |
| 2008/0286604 A1 | 11/2008 | Inoue et al. | |
| 2010/0007273 A1* | 1/2010 | Djurovich et al. | 313/504 |
| 2010/0019669 A1* | 1/2010 | Akino et al. | 313/504 |
| 2010/0117068 A1* | 5/2010 | Inoue et al. | 257/40 |
| 2010/0277060 A1* | 11/2010 | Schaefer et al. | 313/504 |
| 2010/0305083 A1* | 12/2010 | Batinic-Haberle et al. | 514/184 |
| 2010/0308308 A1* | 12/2010 | Fuchs et al. | 257/40 |
| 2011/0298360 A1 | 12/2011 | Ohsawa et al. | |

FOREIGN PATENT DOCUMENTS

| | | |
|---|---|---|
| CN | 1866576 A | 11/2006 |
| CN | 1911943 A | 2/2007 |
| CN | 101270133 A | 9/2008 |
| EP | 2 254 173 | 11/2006 |
| EP | 1 873 163 A1 | 1/2008 |
| EP | 2 254 173 A1 | 11/2010 |

| | | | |
|---|---|---|---|
| JP | 2002-105055 | 4/2002 | |
| JP | 2003-129045 | 5/2003 | |
| JP | 2006-120762 | 5/2006 | |
| JP | 2007-284432 | 11/2007 | |
| JP | 2009-1546 | 1/2009 | |
| JP | 4657320 B2 | 3/2011 | |
| WO | WO 2004/037836 A1 | 5/2004 | |
| WO | WO 2006/098460 A1 | 9/2006 | |
| WO | WO 2006/104177 A1 | 10/2006 | |
| WO | WO 2007/133523 A2 | 11/2007 | |
| WO | WO 2008/143113 A1 | 11/2008 | |

OTHER PUBLICATIONS

Office Action re Chinese application No. CN 200910223199.3, dated Jul. 2, 2013 (with English translation).
Tao, X.T. et al, "Metal Complex Polymer for Second Harmonic Generation and Electroluminescence Applications," Applied Physics Letters, vol. 70, No. 12, Mar. 24, 1997, pp. 1503-1505.
O'Brien, D.F. et al., "Improved Energy Transfer in Electrophosphorescent Devices," Applied Physics Letters, vol. 74, No. 3, Jan. 18, 1999, pp. 442-444.
Tsutsui, T. et al., "High Quantum Efficiency in Organic Light-Emitting Devices with Iridium-Complex as a Triplet Emissive Center," Japanese Journal of Applied Physics, vol. 38/Part 2, No. 12B, Dec. 15, 1999, pp. L1502-L1504.
Baldo, M.A. et al., "High-Efficiency Fluorescent Organic Light-Emitting Devices Using a Phosphorescent Sensitizer," Nature, vol. 403, Feb. 17, 2000, pp. 750-753.
Thompson, M.E. et al., "Phosphorescent Materials and Devices," Proceedings of the 10th International Workshop on Inorganic and Organic Electroluminescence (EL'00), Dec. 4, 2000, pp. 35-38.
Adachi, C. et al, "High-Efficiency Red Electrophosphorescence Devices," Applied Physics Letters, vol. 78, No. 11, Mar. 12, 2001, pp. 1622-1624.
Duan, J-P. et al., "New Iridium Complexes as Highly Efficient Orange-Red Emitters in Organic Light-Emitting Diodes," Advanced Materials, vol. 15, No. 3, Feb. 5, 2003, pp. 224-228.
Slater, J.W. et al, "Cyclometallated Nitrogen Heterocycles," Journal of Organo Metallic Chemistry, vol. 688, Aug. 2003, pp. 112-120.
Zhang, G-L et al., "Synthesis and Phosphorescence of a New Iridium(III) Pyrazine Complex," Wuli Huaxue Xuebao (Acta Phys.—Chimica Sinica), vol. 19, No. 10, Oct. 19, 2003, pp. 889-891 (with English Abstract and English Translation).
Zhang, G-L et al., "Synthesis and Luminescence Property of a New Yellow Phosohorescent Iridium(III) Pyrazine Complex," Chemical Journal of Chinese Universities, vol. 25, No. 3, Mar. 1, 2004, pp. 397-400 (with English Abstract and English Translation).
Taiwanese Office Action re Application No. TW 98137403, dated Mar. 11, 2014.

* cited by examiner

*Primary Examiner* — Victor A Mandala
(74) *Attorney, Agent, or Firm* — Husch Blackwell LLP

(57) ABSTRACT

To provide a light-emitting element, a light-emitting device, and an electronic device each formed using the organometallic complex represented by General Formula (G1) as a guest material and a low molecule compound as a host material.

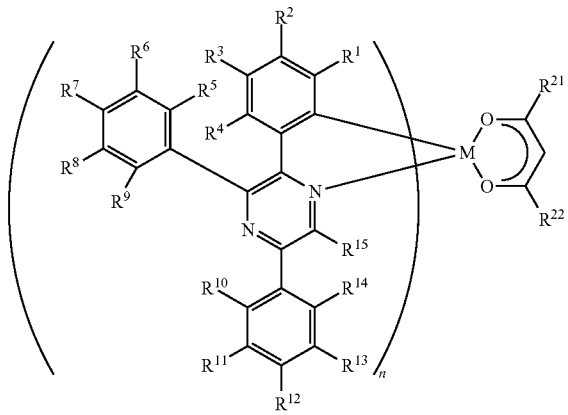

(G1)

18 Claims, 25 Drawing Sheets

LIGHT-EMITTING ELEMENT AND LIGHT-EMITTING DEVICE

This application is a continuation of application Ser. No. 13/196,312 filed on Aug. 2, 2011 which is a continuation of application Ser. No. 12/618,002 filed on Nov. 13, 2009 (now U.S. Pat. No. 7,999,254 issued Aug. 16, 2011), which are both incorporated by reference herein.

BACKGROUND OF THE INVENTION

1. Field of the Invention

The present invention disclosed hereinafter relates to a light-emitting element using a phosphorescent compound. Further, the present invention relates to a light-emitting device using the light-emitting element and an electronic device using the light-emitting device.

2. Description of the Related Art

In recent years, a light-emitting element using a light-emitting organic compound or inorganic compound as a light-emitting substance has been actively developed. In particular, a light-emitting element called an EL element having a simple structure in which a light-emitting layer including a light-emitting substance is provided between electrodes, has attracted attention as a next-generation flat panel display element because of its characteristics such as a thin shape, light-weight, high response speed, and direct current driving at a low voltage. In addition, a display using such a light-emitting element has a feature that it is excellent in contrast and image quality, and has a wide viewing angle. Further, since such a light-emitting element is a plane light source, the light-emitting element is considered to be applicable to a light source such as a backlight of a liquid crystal display and lighting.

In a case of using a light-emitting organic compound as a light-emitting substance, the emission mechanism of a light-emitting element is a carrier-injection type. In other words, by application of voltage with a light-emitting layer interposed between electrodes, carriers (holes and electrons) are injected from the electrodes to be recombined, and thus a light-emitting substance is excited. Light is emitted when the excited state returns to a ground state. There are two types of the excited states which are possible: a singlet excited state (S*) and a triplet excited state (T*). In addition, the statistical generation ratio thereof in a light-emitting element is considered to be $S^*:T^*=1:3$.

In general, the ground state of a light-emitting organic compound is a singlet state. Light emission from a singlet excited state (S*) is referred to as fluorescence where electron transition occurs between the same multiplicities. On the other hand, light emission from a triplet excited state (T*) is referred to as phosphorescence where electron transition occurs between different multiplicities. Here, in general, at room temperature, a compound capable of converting a singlet excited state into light emission (hereinafter referred to as a fluorescent compound) does not exhibit light emission from the triplet excited state (phosphorescence) and exhibits only light emission from the singlet excited state (fluorescence). Accordingly, the internal quantum efficiency (the ratio of generated photons to injected carriers) in a light-emitting element using a fluorescent compound is assumed to have a theoretical limit of 25% based on $S^*:T^*=1:3$.

On the other hand, when a compound which converts an energy difference between a triplet excited state and a ground state (a triplet excitation energy) into light emission and exhibits phosphorescence (hereinafter referred to as a phosphorescent compound) is used, internal quantum efficiency can be theoretically 75% to 100%. In other words, emission efficiency can be 3 to 4 times as much as that of the fluorescence compound. From these reasons, in order to achieve a light-emitting element with high efficiency, a light-emitting element using a phosphorescent compound has been proposed (see Non-Patent Document 1, for example). Note that in Non-Patent Document 1, an iridium complex is used, in which a ligand is 2-(2'-benzo[4,5-a]thienyl)pyridine ([btp$_2$Ir(acac)]), as a phosphorescent compound.

The present inventors propose a light-emitting element using an organometallic complex represented by Structural Formula (50) below, which is (acetylacetonato)bis(2,3,5-triphenylpyrazinato)iridium(III) (abbr.: [Ir(tppr)$_2$(acac)]) (Patent Document 1). By fabrication of a light-emitting element using the organometallic complex represented by Structural Formula (50), a light-emitting element which can exhibit red light emission with high emission efficiency can be obtained.

[Chemical Formula 1]

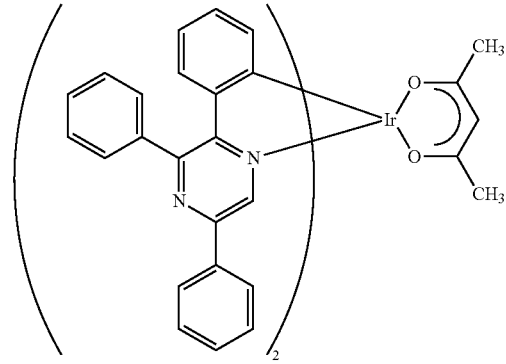

(50)

REFERENCE

Patent Document

[Patent Document 1]
Japanese Published Patent Application No. 2007-284432.
[Non-Patent Document]
[Non-Patent Document 1]
Adachi et al., HIGH-EFFICIENCY RED ELECIROPHOS-PHORESCENCE DEVICES, *APPL. PHYS. LETT.* (*APPLIED PHYSICS LETTERS*), VOL. 78, NO. 11, March 2001, PR 1622-1624.

DISCLOSURE OF INVENTION

An organometallic complex disclosed in Non-Patent Document 1 emits orange light; thus, when the organometallic complex is applied to a full-color display or the like, color purity of red is poor, which is a disadvantage in terms of color reproducibility. In contrast, in the case where the light emission color is in a dark red region, in other words, where the emission wavelength is extremely long, an organometallic complex is advantageous in terms of color reproducibility; however, in a region of red light emission with low luminous efficiency (cd/A), the emission efficiency is decreased.

In view of the above problems, an object is to provide a light-emitting element which exhibits red light emission with high luminous efficiency. In addition, another object is to provide a light-emitting element having a light emission peak in the vicinity of 620 nm since the light which perceived by a person as a favorable red light has a wave length of approximately 620 nm (preferably 620 nm to 625 nm). It is still another object to provide a light-emitting device and an electronic device with reduced power consumption.

SUMMARY OF THE INVENTION

One embodiment of a structure of the invention disclosed in this specification is a light-emitting element that includes, between a pair of electrodes, a layer including an organometallic complex represented by following General Formula (G1) and a low molecular compound. The organometallic complex is a guest material, and the low molecular compound is a host material.

[Chemical Formula 2]

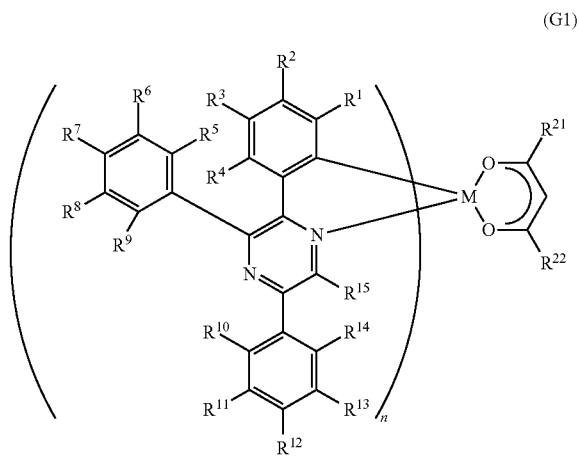

(G1)

Note that, in the formula, $R^1$ to $R^{15}$ individually represent hydrogen or an alkyl group having 1 to 4 carbon atoms. In addition, one of $R^{21}$ and $R^{22}$ represents an alkyl group having 2 to 10 carbon atoms and the other represents an alkyl group having 1 to 10 carbon atoms. M is a central metal and represents either an element belonging to Group 9 or an element belonging to Group 10. In addition, n is 2 when the central metal is an element belonging to Group 9, and n is 1 when the central metal is an element belonging to Group 10.

One embodiment of a structure of the invention disclosed in this specification is a light-emitting element that includes, between a pair of electrodes, a layer including an organometallic complex represented by following General Formula (G2) and a low molecular compound. The organometallic complex is a guest material, and the low molecular compound is a host material.

[Chemical Formula 3]

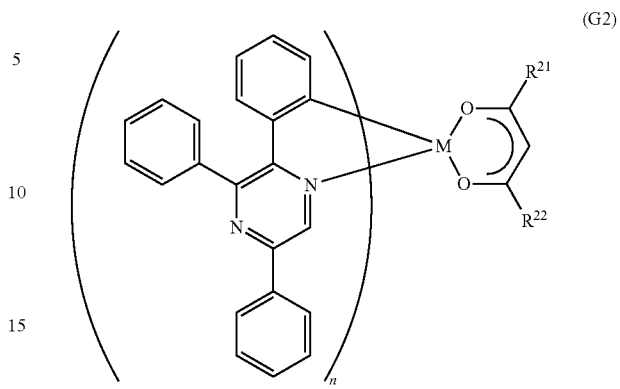

(G2)

Note that, in the formula, one of $R^{21}$ and $R^{22}$ represents an alkyl group having 2 to 10 carbon atoms and the other represents an alkyl group having 1 to 10 carbon atoms. M is a central metal and represents either an element belonging to Group 9 or an element belonging to Group 10. In addition, n is 2 when the central metal is an element belonging to Group 9, and n is 1 when the central metal is an element belonging to Group 10.

In order to obtain phosphorescence more efficiently from the organometallic complex represented by above General Formula (G1) or (G2), a heavy metal is preferably used as a central metal in terms of a heavy atom effect. Thus, in the above organometallic complexes, one preferable embodiment is an organometallic complex in which the central metal M is iridium or platinum. Particularly when the central metal M is iridium, thermal and chemical stability of the organometallic complex is improved and morphology of a thin film becomes more stable. Thus, iridium is particularly preferable to be used as the central metal M.

A light-emitting element according to an embodiment of the present invention can realize high emission efficiency; accordingly, a light-emitting device (such as an image display device) using this light-emitting element can realize low power consumption. Thus, an embodiment of the present invention includes a light-emitting device and an electronic device using the light-emitting element according to an embodiment of the present invention.

With the above structure, at least one of the above problems can be resolved.

Note that the light-emitting device in this specification includes image display devices and lighting devices using a light-emitting element. Further, the category of the light-emitting device includes a module including a light-emitting element attached with a connector such as a module attached with an anisotropic conductive film, tape automated bonding (TAB) tape, or a tape carrier package (TCP); a module in which the top of the TAB tape or the TCP is provided with a printed wiring board; or a module in which an integrated circuit (IC) is directly mounted on a light-emitting element by a chip on glass (COG) method; and the like.

By implementation of the present invention, a light-emitting element with high emission efficiency can be provided. In addition, the present invention can provide a light-emitting element with which red light emission with high purity can be obtained.

Further, by manufacture of a light-emitting device using the light-emitting element described above, a light-emitting device with low power consumption can be provided. In addition, by application of such a light-emitting device to an electronic device, an electronic device with low power consumption and a long lifetime can be provided.

DETAILED DESCRIPTION OF THE INVENTION

Figure 1:
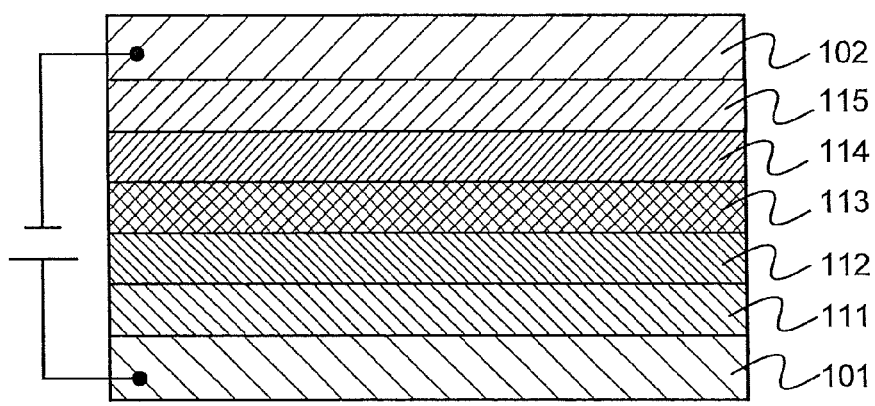
FIG. 1 illustrates a light-emitting element according to an embodiment of the present invention.

Hereinafter, embodiments of the present invention are described with reference to the accompanying drawings. Note that the invention disclosed in this specification is not limited to the following description because it will be easily understood by those skilled in the art that various changes and modifications can be made without departing from the spirit and scope of the present invention. Accordingly, the present invention is not to be taken as being limited to the described content of the embodiments included herein. In the drawings for explaining the embodiments, the same parts or parts having a similar function are denoted by the same reference numerals, and description of such parts is not repeated.

Embodiment 1

In this embodiment, an organometallic complex used for a light-emitting element is described.

One embodiment of the light-emitting element disclosed in this specification is a light-emitting element including an organometallic complex represented by following General Formula (G1).

[Chemical Formula 4]

(G1)

Note that, in the formula, $R^1$ to $R^{15}$ individually represent hydrogen or an alkyl group having 1 to 4 carbon atoms. In addition, one of $R^{21}$ and $R^{22}$ represents an alkyl group having 2 to 10 carbon atoms and the other represents an alkyl group having 1 to 10 carbon atoms. M is a central metal and represents either an element belonging to Group 9 or an element belonging to Group 10. In addition, n is 2 when the central metal is an element belonging to Group 9, and n is 1 when the central metal is an element belonging to Group 10.

In addition, the organometallic complex represented by General Formula (G1) is preferably an organometallic complex represented by following General Formula (G2).

[Chemical Formula 5]

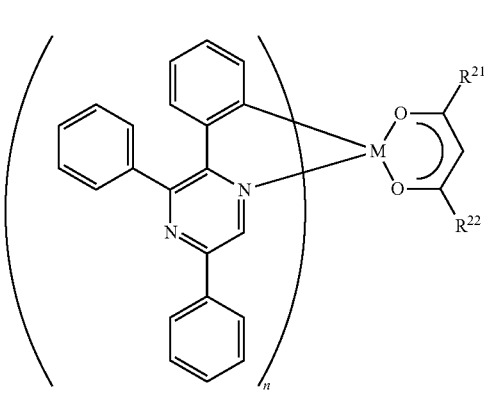
(G2)

Note that one of $R^{21}$ and $R^{22}$ represents an alkyl group having 2 to 10 carbon atoms and the other represents an alkyl group having 1 to 10 carbon atoms. M is a central metal and represents either an element belonging to Group 9 or an element belonging to Group 10. In addition, n is 2 when the central metal is an element belonging to Group 9, and n is 1 when the central metal is an element belonging to Group 10.

Specific examples of an organometallic complex to be used for a light-emitting element can be organometallic complexes represented by Structural Formulae (10) to (44). Note that an organometallic complex used for the light-emitting element is not limited thereto.

[Chemical Formula 6]

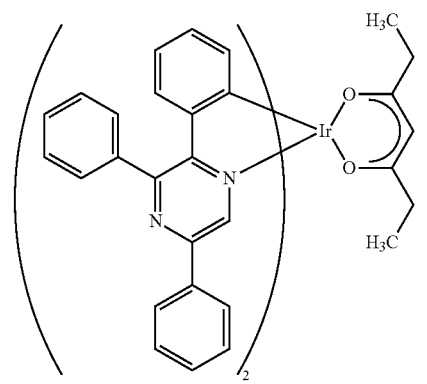
(10)

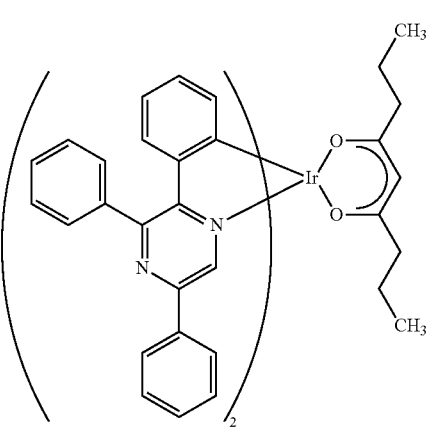
(11)

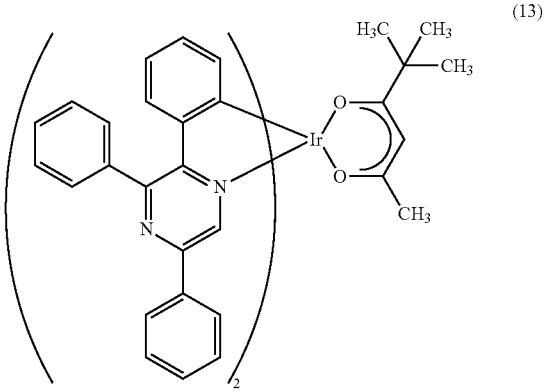
(12)

[Chemical Formula 7]

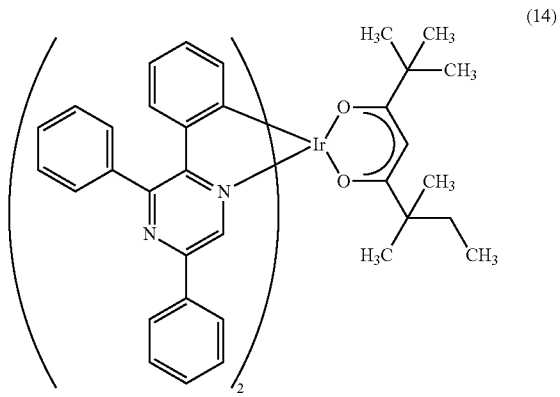
(13)

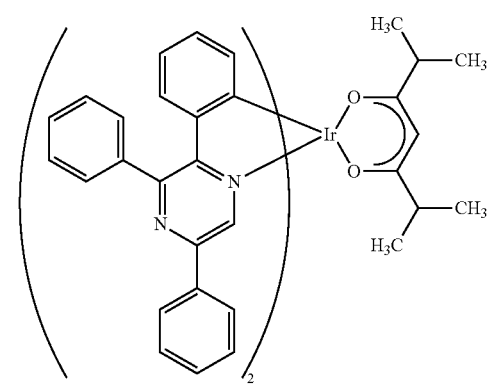
(14)

(15)

[Chemical Formula 8]
(16)
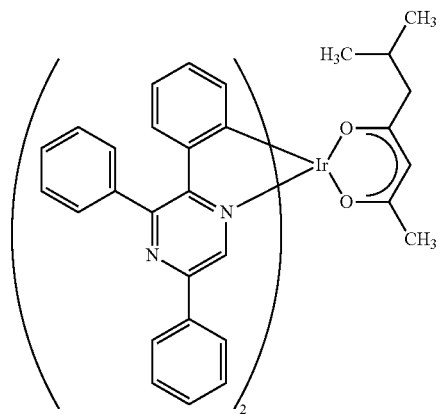
(17)
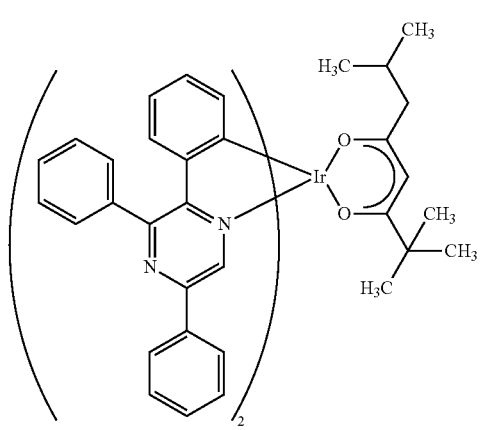
(18)
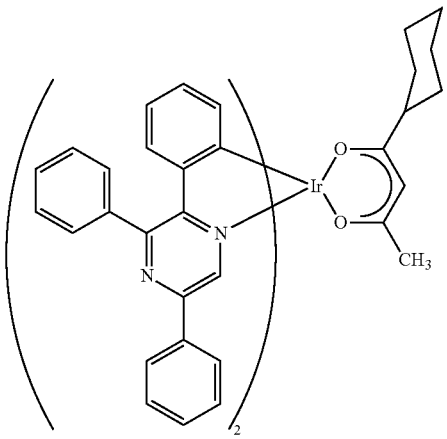
[Chemical Formula 9]
(19)
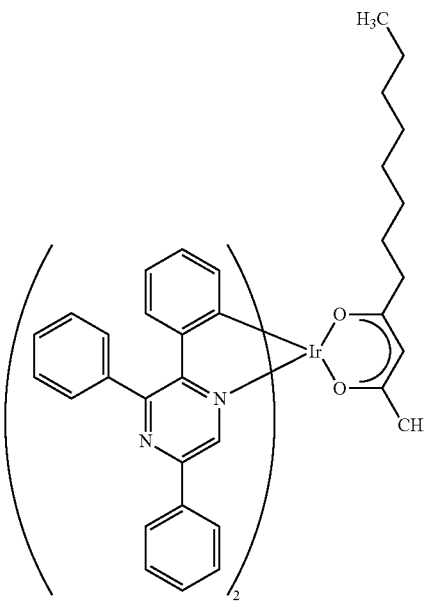
(20)
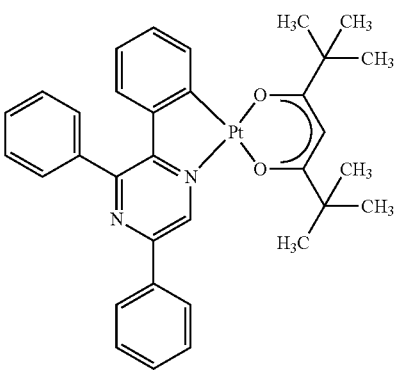
[Chemical Formula 10]
(21)
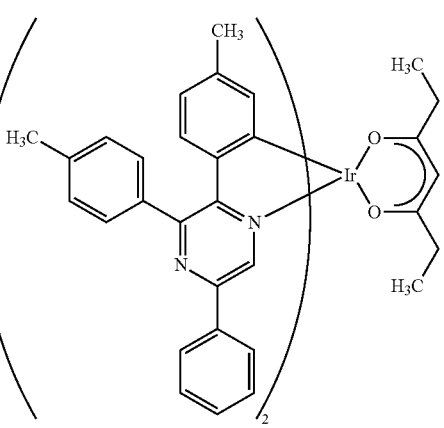

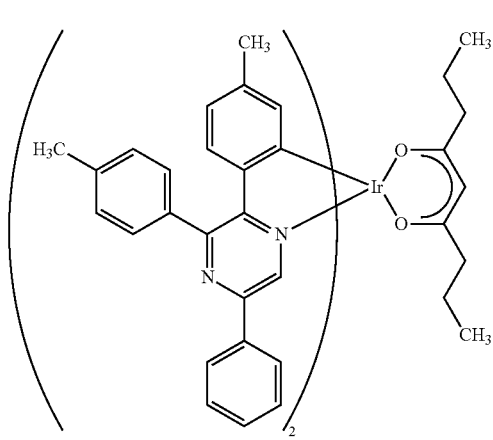
(22)
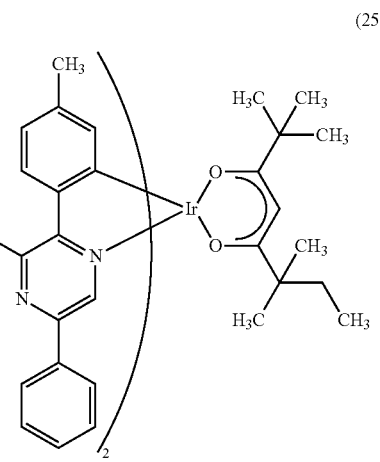
(25)
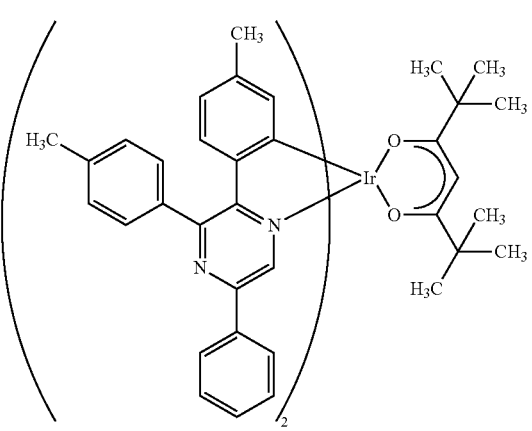
(23)
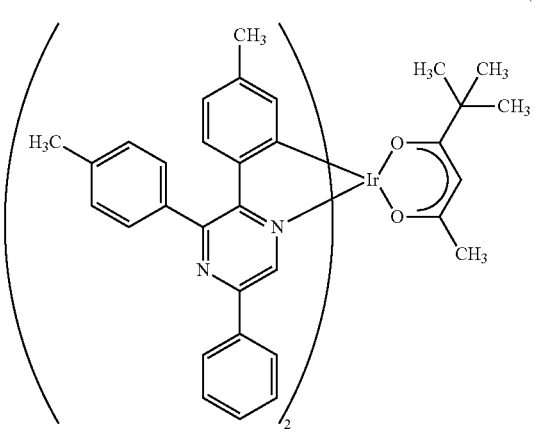
(26)
[Chemical Formula 11]
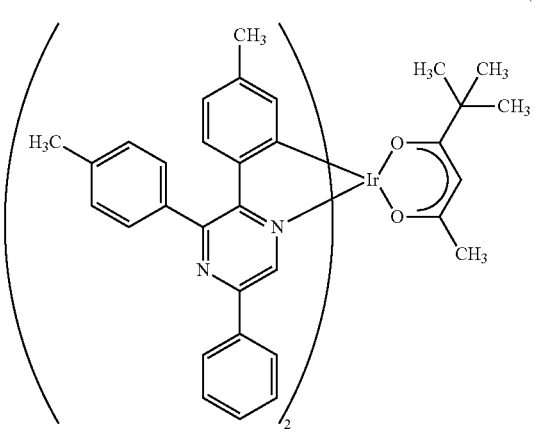
(24)
[Chemical Formula 12]
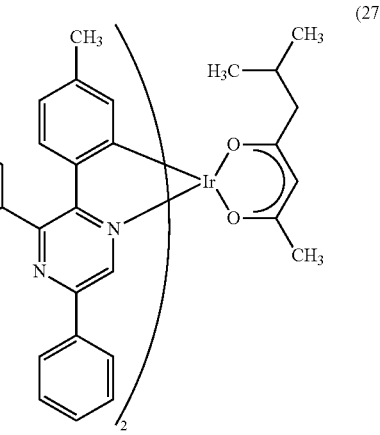
(27)

(28)
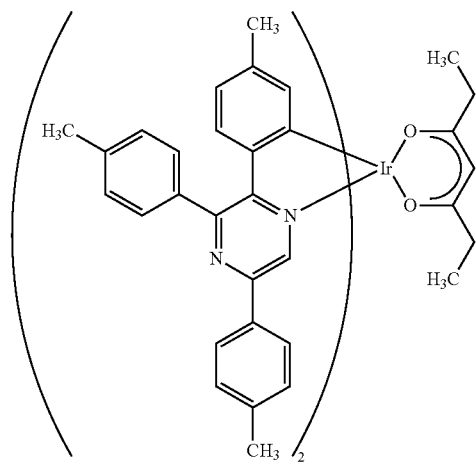
(29)
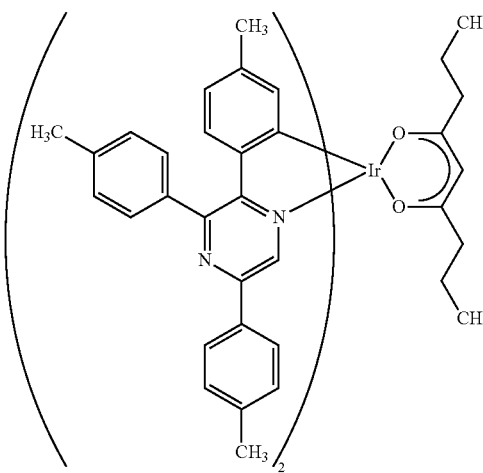
[Chemcial Formula 13]
(30)
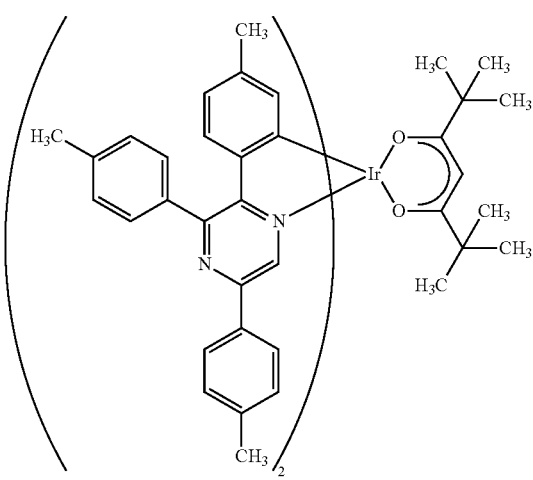
(31)
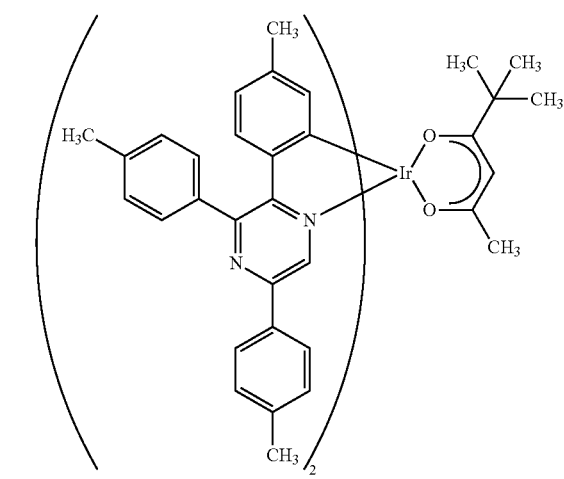
(32)
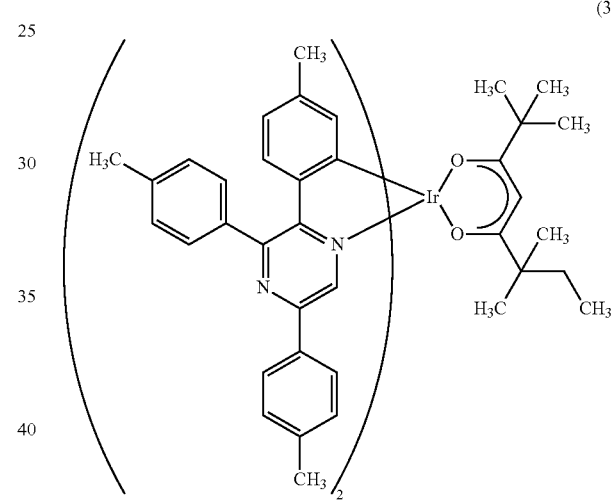
[Chemical Formula 14]
(33)
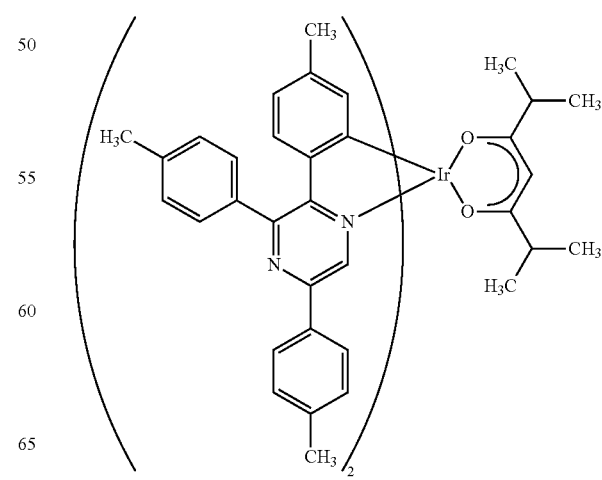

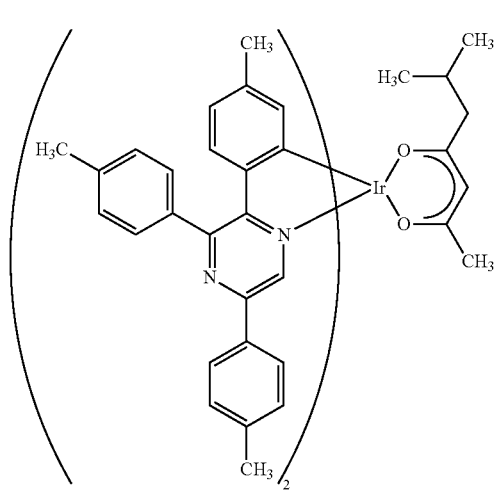
(34)
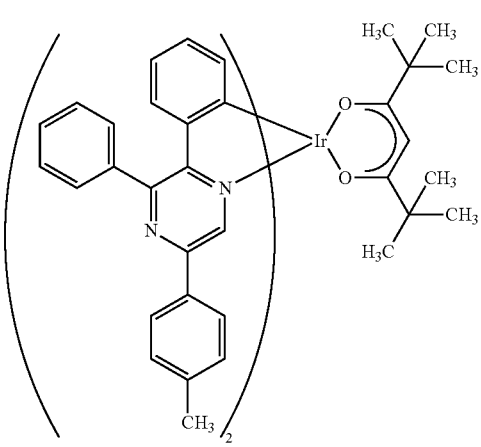
(37)
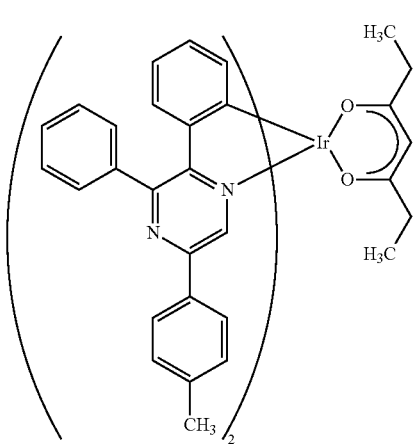
(35)
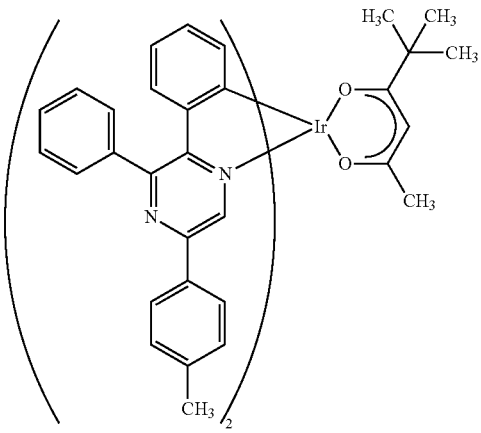
(38)
[Chemical Formula 15]
[Chemical Formula 16]
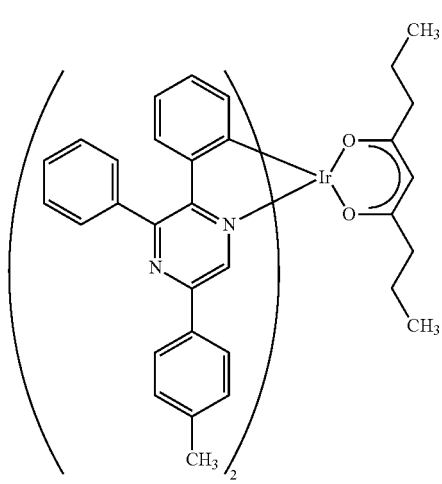
(36)
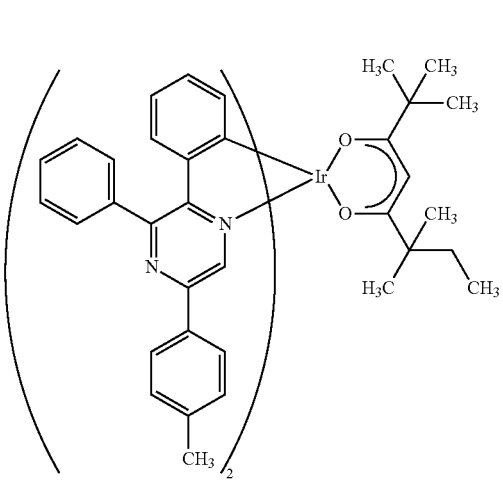
(39)

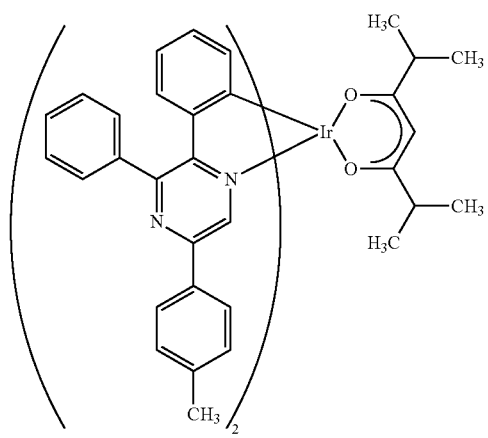

(40)

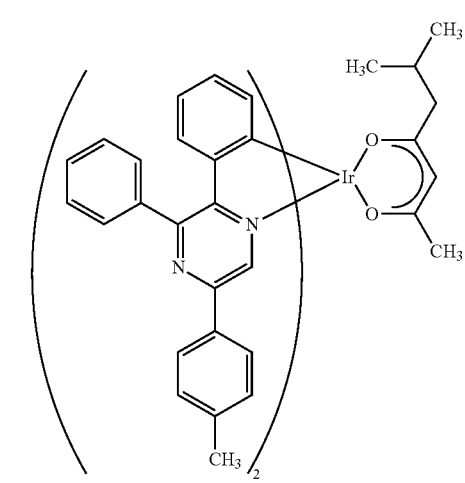

(41)

[Chemical Formula 17]

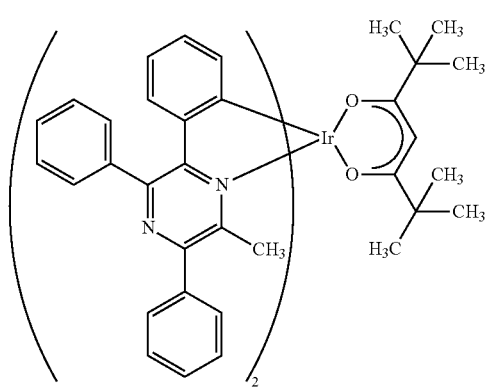

(42)

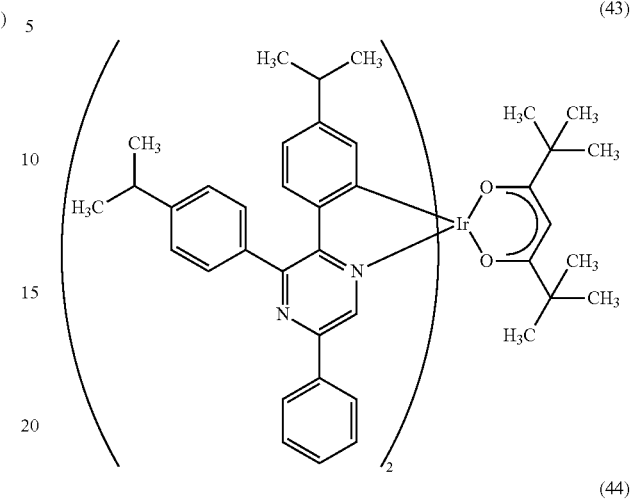

(43)

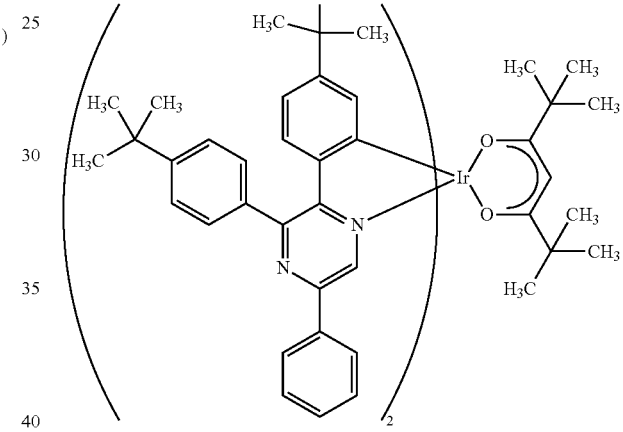

(44)

An example of a synthesis method of the organometallic complex represented by General Formula (G1) is described hereinafter.

First, as shown in a following synthesis scheme (a-1), the pyrazine derivative represented by General Formula (G0) and a metal compound including a metal belonging to Group 9 or Group 10 and including halogen (such as a metal halide or metal complex) are heated in an appropriate solvent to obtain a binuclear complex (A) which is a kind of organometallic complexes having the structure represented by General Formula (G1). A metal compound including a metal belonging to Group 9 or Group 10 and including halogen is, for example, rhodium chloride hydrate, palladium chloride, iridium chloride hydrate, iridium chloride hydrochloride hydrate, potassium tetrachloroplatinate(II), or the like. Note that in the synthesis scheme (a-1), M represents an element belonging to Group 9 or an element belonging to Group 10, and X represents a halogen element. In addition, n is 2 when M is an element belonging to Group 9, and n is 1 when M is an element belonging to Group 10. In addition, $R^1$ to $R^{15}$ individually represent hydrogen or an alkyl group having 1 to 4 carbon atoms.

[Chemical Formula 18]

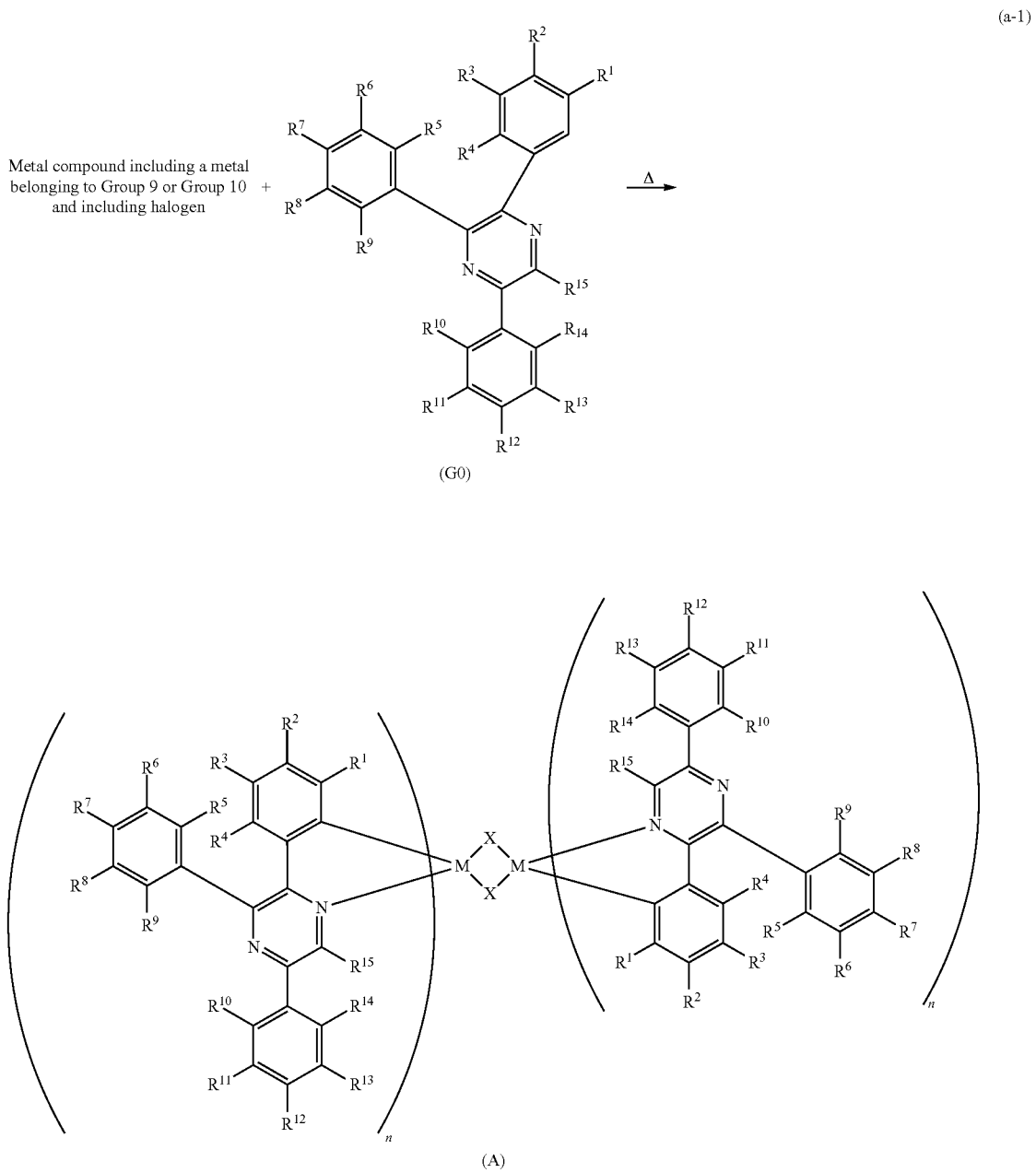

Next, as shown in a following synthesis scheme (a-2), the binuclear complex (A) obtained by the synthesis scheme (a-1) reacts with a monoanionic bidentate chelate ligand having a β-diketone structure and a proton of the ligand is separated to be coordinated to the central metal M. As a result, the organometallic complex represented by General Formula (G1) is obtained.

Note that, in the synthesis scheme (a-2), M represents an element belonging to Group 9 or Group 10 and X represents a halogen element. In addition, n is 2 when M is an element belonging to Group 9, and n is 1 when M is an element belonging to Group 10. In addition, $R^1$ to $R^{15}$ individually represent hydrogen or an alkyl group having 1 to 4 carbon atoms. Note that one of $R^{21}$ and $R^{22}$ represents an alkyl group having 2 to 10 carbon atoms and the other represents an alkyl group having 1 to 10 carbon atoms.

[Chemical Formula 19]

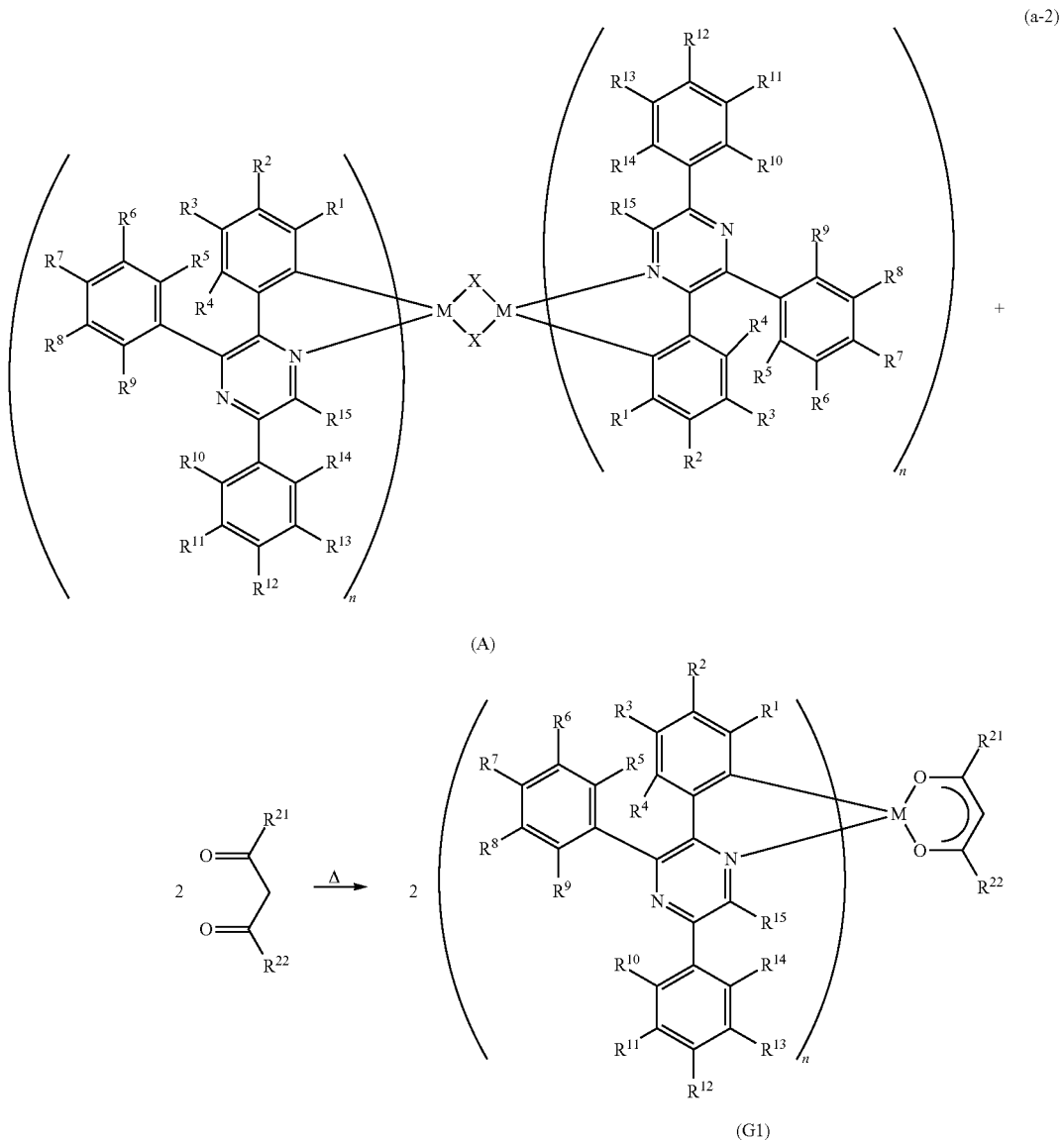

The above-described organometallic complex represented by General Formula (G1) has a light emission peak in the vicinity of 620 nm, and exhibits a favorable red light emission with high luminous efficiency. Thus, by applying the organometallic complex described in this embodiment to a light-emitting element, a light-emitting element which exhibits red light emission with high luminous efficiency can be obtained.

The above-described organometallic complex is a substance which is likely to sublime at a low temperature. Specifically, in this substance, when a measurement is conducted under a low pressure of approximately $10^{-3}$ Pa, the temperature at which the weight is reduced by 5% from the weight at the start of the measurement (hereinafter also referred to as 5% weight loss temperature) is 250° C. or lower in terms of the relation between the weight and temperature using a high vacuum differential type differential thermal balance. Thus, since the substance can sublime without pyrolysis, a light-emitting layer is formed by an evaporation method, and it can be avoided that decomposed matters are mixed in the light-emitting layer.

In addition, since the organometallic complex according to this embodiment can exhibit phosphorescence, in other words, it can convert triplet excitation energy into light emission, with the application of the organometallic complex to a light-emitting element, high efficiency can be achieved. Note that the organometallic complex according to this embodiment is effective when it is used for a light-emitting substance in terms of emission efficiency. In addition, the light-emitting element preferably includes a light-emitting layer between a pair of electrodes, and the light-emitting layer preferably has a structure in which the organometallic complex according to this embodiment is dispersed in a host material.

Note that, in the organometallic complexes represented by General Formulae (G1) and (G2), it is preferable that both $R^{21}$ and $R^{22}$ are alkyl groups each having 2 to 4 carbon atoms, more preferably, 3 to 4 carbon atoms. When a light-emitting element is manufactured using the organometallic complex represented by General Formula (G1) or (G2) in which both $R^{21}$ and $R^{22}$ fall in the above ranges, the operation voltage of the light-emitting element can be low.

Embodiment 2

In this embodiment, one embodiment of a light-emitting element is described with reference to FIG. 1.

A light-emitting element including a light-emitting layer 113 between a first electrode 101 and a second electrode 102 is illustrated in FIG. 1. Note that the first electrode 101 and the second electrode 102 serve as an anode and a cathode, respectively, in the light-emitting element of Embodiment 2. When voltage is applied to the first electrode 101 and the second electrode 102 so that a potential of the first electrode 101 is higher than that of the second electrode 102, holes are injected from the side of the first electrode 101, and electrons are injected from the side of the second electrode 102 to the light-emitting layer 113. Subsequently, holes and electrons injected to the light-emitting layer 113 are recombined. A light-emitting substance is included in the light-emitting layer 113, and the light-emitting substance becomes excited due to excitation energy generated by the recombination. The excited light-emitting substance emits light while returning to a ground state.

In addition, a hole-transporting layer 112 may be provided between the first electrode 101 and the light-emitting layer 113. Here, a hole-transporting layer is a layer which has a function of transporting holes injected from the first electrode 101 to the light-emitting layer 113. In such a manner, since the hole-transporting layer 112 is provided so as to separate the first electrode 101 from the light-emitting layer 113, quenching light emission due to a metal can be prevented. Note that the hole-transporting layer 112 is not necessarily provided.

Here, the light-emitting layer 113 includes an organometallic complex having the structure represented by General Formula (G1). The light-emitting layer 113 preferably includes a substance that has larger triplet excitation energy than the organometallic complex described in Embodiment 1 as a host and also includes the organometallic complex described in Embodiment 1, which is dispersed as a guest material. Thus, quenching of light emitted from the organometallic complex caused depending on the concentration can be prevented. Note that the triplet excited energy indicates an energy gap between a ground state and a triplet excited state.

Although there is no particular limitation on a method for forming the light-emitting layer 113, an evaporation method is preferably used. In a case where the light-emitting layer 113 is formed by an evaporation method, a shadow mask technique can be used when the light-emitting layer 113 is patterned; thus, minute patterning can be performed on the light-emitting layer. In addition, since the light-emitting layer can be formed in vacuum by a dry process, the purity of light-emitting materials can be kept.

There is no particular limitation on a substance (i.e., a host material) used for dispersing the organometallic complex described in Embodiment 1; however, it is preferable to use a compound having an arylamine skeleton such as 2,3-bis(4-diphenylaminophenyl)quinoxaline (abbr.: TPAQn) or 4,4'-bis[N-(1-naphthyl)-N-phenylamino]biphenyl (abbr.: NPB), a carbazole derivative such as 4,4'-di(N-carbazolyl)biphenyl (abbr.: CBP) or 4,4',4''-tris(N-carbazolyl)triphenylamine (abbr.: TCTA), or a metal complex such as bis[2-(2-hydroxyphenyl)pyridinato]zinc (abbr.: Znpp$_2$), bis[2-(2-hydroxyphenyl)benzoxazolato]zinc (abbr.: ZnBOX), bis(2-methyl-8-quinolinolato)(4-phenyphenolato)aluminum (abbr.: BAlq) or tris(8-quinolinolato)aluminum (abbr.: Alq$_3$). One or more of these materials can be selected to be mixed so that the organometallic complex described in Embodiment 1 becomes dispersed. Note that in a case where the light-emitting layer 113 is formed by an evaporation method, a low molecular compound is preferably used as the host material. The low molecular compound in this specification refers to a compound whose molecular weight is greater than or equal to 100 and less than or equal to 2000, preferably greater than or equal to 100 and less than or equal to 1500. In addition, in a case where a plurality of compounds are mixed to faint the light-emitting layer 113, a co-evaporation method can be used. Here, the co-evaporation method refers to an evaporation method in which raw materials from a plurality of evaporation sources provided in a single treatment chamber are each vaporized, the vaporized raw materials are mixed in a gaseous state, and then deposited over a treatment object.

Since the organometallic complex described in Embodiment 1 can emit a favorable red light, a light-emitting element which emits red light can be provided. In addition, since the organometallic complex described in Embodiment 1 exhibits phosphorescence, the emission efficiency is high. Accordingly, by using the organometallic complex for the light-emitting layer, a light-emitting element with high emission efficiency can be obtained. Furthermore, a light-emitting element which emits red light with high luminous efficiency (cd/A) can be provided because the light emission peak is in the vicinity of 620 nm.

The organometallic complex described in Embodiment 1 has a low sublimation temperature; thus, it can sublime without pyrolysis. Accordingly, in a case where a light-emitting layer is formed by an evaporation method, gas or decomposed matters which are generated by decomposition of evaporation materials can suppress reduction in the degree of vacuum in the evaporation atmosphere, and the decomposed matters can be prevented from being mixed in the light-emitting layer.

In addition, because the light-emitting element described in this embodiment has high emission efficiency, the power consumption can be reduced.

Further, although there is no particular limitation on the first electrode 101, it is preferably formed using a substance having a high work function to enable it to serve as an anode, as in this embodiment. Specifically, it is possible to use indium tin oxide (ITO), indium tin oxide containing silicon oxide (ITSO), indium oxide containing zinc oxide at 2 to 20 wt % (IZO), gold (Au), platinum (Pt), nickel (Ni), tungsten (W), chromium (Cr), molybdenum (Mo), iron (Fe), cobalt (Co), copper (Cu), palladium (Pd), or the like. Note that the first electrode 101 can be formed, for example, by a sputtering method, an evaporation method, or the like.

Furthermore, although there is no particular limitation on the second electrode 102, it is preferably formed using a substance having a low work function to enable it to serve as a cathode, as in this embodiment. Specifically, it is possible to use aluminum (Al), indium (In), an alkali metal such as lithium (Li) or cesium (Cs), an alkaline-earth metal such as magnesium (Mg) or calcium (Ca), a rare-earth metal such as erbium (Er) or ytterbium (Yb), or the like. Alternatively, an alloy such as aluminum-lithium alloy (AlLi) or magnesium-silver alloy (MgAg) can be used. Note that the second electrode 102 can be formed by, for example, a sputtering method, an evaporation method, or the like.

Note that in order to extract emitted light to the outside, it is necessary that either or both the first electrode 101 or/and the second electrode 102 be an electrode formed using a conductive film that can transmit visible light, such as ITO, or an electrode with a thickness of several to several tens of nanometers so as to transmit visible light.

Although there is no particular limitation on a substance included in the hole-transporting layer 112, for example, it is possible to use an aromatic amine compound such as 4,4'-bis[N-(1-naphthyl)-N-phenylamino]biphenyl (abbr.: NPB), 4,4'-bis[N-(3-methylphenyl)-N-phenylamino]biphenyl (abbr.: TPD), 4,4'-bis[N-(9,9-dimethylfluoren-2-yl)-N-phenylamino]biphenyl (abbr.: DFLDPBi), 4,4',4''-tris(N,N-diphenylamino)triphenylamine (abbr.: TDATA), or 4,4',4''-tris[N-(3-methylphenyl)-N-phenylamino]triphenylamine (abbr.: m-MTDATA), or a high molecular compound such as poly(4-vinyl triphenylamine) (abbr.: PVTPA).

Note that the hole-transporting layer 112 may have a multilayer structure in which two or more layers are stacked. In addition, the hole-transporting layer 112 may also be formed by mixing two or more types of substances.

Further, as illustrated in FIG. 1, an electron-transporting layer 114 may be provided between the second electrode 102 and the light-emitting layer 113. Here, the electron-transporting layer refers to a layer having the function of transporting electrons injected from the second electrode 102 to the light-emitting layer 113. By thus providing the electron-transporting layer 114 so as to separate the second electrode 102 from the light-emitting layer 113, quenching of emitted light due to metal can be prevented. Note that the electron-transporting layer 114 is not necessarily provided.

Although there is no particular limitation on a substance forming the electron-transporting layer 114, for example, it is possible to use a metal complex such as tris(8-quinolinolato)aluminum (abbr.: Alq$_3$), tris(4-methyl-8-quinolinolato)aluminum (abbr.: Almq$_3$), bis(10-hydroxybenzo[h]quinolinato)beryllium (abbr.: BeBq$_2$), bis(2-methyl-8-quinolinolato)(4-phenylphenolato)aluminum (abbr.: BAlq), bis[2-(2-hydroxyphenyl)benzoxazolato]zinc (abbr.: ZnBOX), or bis[2-(2-hydroxyphenyl)benzothiazolato]zinc (abbr.: Zn(BTZ)$_2$), a heteroaromatic compound such as 2-(4-biphenylyl)-5-(4-tert-butylphenyl)-1,3,4-oxadiazole (abbr.: PBD), 1,3-bis[5-(p-tert-butylphenyl)-1,3,4-oxadiazol-2-yl]benzene (abbr.: OXD-7), 3-(4-tert-butylphenyl)-4-phenyl-5-(4-biphenylyl)-1,2,4-triazole (abbr.: TAZ), 3-(4-tert-butylphenyl)-4-(4-ethylphenyl)-5-(4-biphenylyl)-1,2,4-triazole (abbr.: p-EtTAZ), bathophenanthroline (abbr.: BPhen), bathocuproine (abbr.: BCP), or 4,4'-bis(5-methylbenzoxazol-2-yl)stilbene (abbr.: BzOs), or a high molecular compound such as poly(2,5-pyridine-diyl) (abbr.: PPy).

Note that the electron-transporting layer 114 may have a multilayer structure in which two or more layers are stacked. In addition, the electron-transporting layer 114 may also be formed by mixing two or more types of substances.

Further, as illustrated in FIG. 1, a hole-injecting layer 111 may be provided between the first electrode 101 and the hole-transporting layer 112. Here, the hole-injecting layer refers to a layer having a function of assisting injection of holes from an electrode serving as an anode to the hole-transporting layer 112. Note that the hole-injecting layer 111 is not necessarily provided.

Although there is no particular limitation on a substance forming the hole-injecting layer 111, for example, it is possible to use metal oxide such as vanadium oxide, niobium oxide, tantalum oxide, chromium oxide, molybdenum oxide, tungsten oxide, manganese oxide, rhenium oxide, and ruthenium oxide, a phthalocyanine compound such as phthalocyanine (abbr.: H$_2$Pc), copper phthalocyanine (abbr.: CuPc), or the like. Alternatively, any of the substances for forming the hole-transporting layer 112 as described above can also be used. Further alternatively, a high molecular compound such as a mixture of poly(ethylenedioxythiophene) and poly(styrene sulfonate) (abbr.: PEDOT/PSS) can be used.

Still alternatively, for the hole-injecting layer 111, a composite material formed by combining an organic compound and an electron acceptor may be used. Such a composite material is superior in a hole-injecting property and a hole-transporting property, since holes are generated in the organic compound by the electron acceptor. In this case, the organic compound is preferably a material excellent in transporting the generated holes. Specifically, the above-described substances for forming the hole-transporting layer 112 (e.g., an aromatic amine compound) can be used for example. As the electron acceptor, a substance having an electron-accepting property to the organic compound may be used. Specifically, transition metal oxide is preferable and examples thereof include vanadium oxide, niobium oxide, tantalum oxide, chromium oxide, molybdenum oxide, tungsten oxide, manganese oxide, rhenium oxide, ruthenium oxide, and the like. Lewis acid such as iron chloride(III) or aluminum chloride (III) can also be used. Alternatively, an organic compound such as 7,7,8,8-tetracyano-2,3,5,6-tetrafluoroquinodimethane (abbr.: F$_4$-TCNQ) can also be used.

Note that the hole-injecting layer 111 may have a multilayer structure in which two or more layers are stacked. In addition, the hole-injecting layer 111 may also be formed by mixing two or more types of substances.

Further, as illustrated in FIG. 1, an electron-injecting layer 115 may also be provided between the second electrode 102 and the electron-transporting layer 114. Here, the electron-injecting layer refers to a layer which has the function of assisting injection of electrons from the electrode serving as a cathode to the electron-transporting layer 114. Note that the electron-injecting layer 115 is not necessarily provided.

Although there is no particular limitation on a substance forming the electron-injecting layer 115, for example, it is possible to use an alkali metal compound or an alkaline-earth metal compound such as lithium fluoride (LW), cesium fluoride (CsF), calcium fluoride (CaF$_2$), or lithium oxide and a rare earth metal compound such as erbium fluoride (ErF$_3$). Alternatively, the above-mentioned substances for forming the electron-transporting layer 114 can also be used.

Alternatively, for the electron-injecting layer 115, a composite material formed by combining an organic compound and an electron donor may be used. The composite material is superior in an electron-injecting property and an electron-transporting property, since electrons are generated in the organic compound by the electron donor. In this case, the organic compound is preferably a material excellent in transporting the generated electrons. Specifically, the above-described materials for forming the electron-transporting layer 114 (e.g., a metal complex or a heteroaromatic compound) can be used for example. As the electron donor, a substance exhibiting an electron-donating property to the organic compound may be used, and it is preferable to use an alkali metal, an alkaline-earth metal, or a rare earth metal, such as lithium, cesium, magnesium, calcium, erbium, or ytterbium. Further, it is also preferable to use an alkali metal oxide or an alkaline-earth metal oxide, such as lithium oxide (LiOx), calcium oxide (CaOx), or barium oxide (BaOx). Alternatively, Lewis acid such as magnesium oxide can also be used. Further alternatively, an organic compound such as tetrathiafulvalene (abbr.: TTF) can be used.

In the above-described light-emitting element described in this embodiment, each the hole-injecting layer 111, the hole-transporting layer 112, the light-emitting layer 113, the electron-transporting layer 114, and the electron-injecting layer 115 may be formed by any method, for example, an evaporation method, an inkjet method, an application method, or the like. In addition, each the first electrode 101 and the second electrode 102 may also be formed by any of a sputtering method, an evaporation method, an inkjet method or an application method.

Note that this embodiment can be implemented in free combination with any of the other embodiments.

Embodiment 3

In Embodiment 3, an example of an embodiment of a light-emitting element which is different from that of Embodiment 2 is described with reference to FIG. 2. The light-emitting element using an organometallic complex described in Embodiment 1 may have a plurality of light-emitting layers. For example, by providing a plurality of light-emitting layers, light which is a combination of the light emitted from the plurality of layers can be obtained. Thus, white light emission can be obtained, for example. In Embodiment 3, an embodiment of a light-emitting element having a plurality of light-emitting layers is described with reference to FIG. 2.

Figure 2:
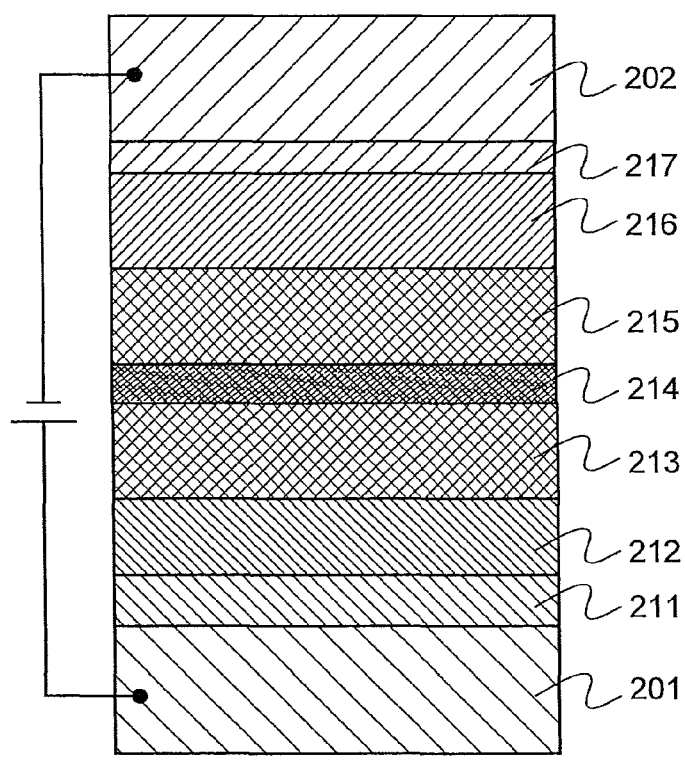
FIG. 2 illustrates a light-emitting element according to an embodiment of the present invention.

In FIG. 2, a first light-emitting layer 213 and a second light-emitting layer 215 are provided between a first electrode 201 and a second electrode 202. Light which is a combination of light emitted from the first light-emitting layer 213 and light emitted from the second light-emitting layer 215 can be obtained. A separation layer 214 is preferably formed between the first light-emitting layer 213 and the second light-emitting layer 215.

When voltage is applied so that a potential of the first electrode 201 is higher than a potential of the second electrode 202, current flows between the first electrode 201 and the second electrode 202, and holes and electrons are recombined in the first light-emitting layer 213, the second light-emitting layer 215, or the separation layer 214. Generated excitation energy is distributed to both the first light-emitting layer 213 and the second light-emitting layer 215 to excite a first light-emitting substance included in the first light-emitting layer 213 and a second light-emitting substance included in the second light-emitting layer 215. The excited first and second light-emitting substances emit light while returning to the ground state.

The first light-emitting layer 213 includes the first light-emitting substance typified by a fluorescent compound such as perylene, 2,5,8,11-tetra(tert-butyl)perylene (abbr.: TBP), 4,4'-bis(2,2-diphenylvinyl)biphenyl (abbr.: DPVBi), 4,4'-bis[2-(N-ethylcarbazol-3-yl)vinyl]biphenyl (abbr.: BCzVBi), bis(2-methyl-8-quinolinolato)(4-phenylphenolato)aluminum (abbr.: BAlq), or bis(2-methyl-8-quinolinolato)gallium-chloride (abbr.: Gamq$_2$Cl), or a phosphorescent substance such as bis{2-[3,5-bis(trifluoromethyl)phenyl]pyridinato-N, C$^{2'}$}iridium(III)picolinate (abbr.: Ir(CF$_3$ ppy)$_2$(pic)), bis[2-(4,6-difluorophenyppyridinato-N,C$^{2'}$]iridium(III)acetylacetonate (abbr.: FIr(acac)), bis[2-(4,6-difluorophenyppyridinato-N,C$^{2'}$]iridium(III)picolimate (abbr.: FIrpic), or bis[2-(4,6-difuluorophenyl)pyridinato-N, C$^{2'}$]iridium(III)tetra(1-pyrazolyl)borate (abbr.:. FIr6), from which light emission with a peak at 450 nm to 510 nm in an emission spectrum (i.e., blue light to blue green light) can be obtained. In addition, when the first light-emitting substance is a fluorescent compound, the first light-emitting layer 213 preferably has a structure in which a substance that has larger singlet excitation energy than the first light-emitting sub-stance is used as a first host and the first light-emitting substance is dispersed as a guest. Further, when the first light-emitting substance is a phosphorescent compound, the first light-emitting layer 213 preferably has a structure in which a substance that has larger triplet excitation energy than the first light-emitting substance is used as a first host and the first light-emitting substance is dispersed as a guest. As the first host, 9,10-di(2-naphthyl)anthracene (abbr.: DNA), 2-tert-butyl-9,10-di(2-naphthyl)anthracene (abbr.: t-BuDNA) or the like can be used as well as NPB, CBP, TCTA or the like. Note that the singlet excitation energy is an energy difference between a ground state and a singlet excited state. In addition, the triplet excitation energy is an energy difference between a ground state and a triplet excited state.

On the other hand, the second light-emitting layer 215 includes any of the organometallic complexes described in Embodiment 1 and can emit red light. Further, since any of the organometallic complexes described in Embodiment 1 has high emission efficiency, a light-emitting element with high emission efficiency can be obtained. In addition, a light-emitting element with reduced power consumption can be obtained.

The second light-emitting layer 215 may have a structure similar to that of the light-emitting layer 113 described in Embodiment 2.

Specifically, the separation layer 214 can be formed using TPAQn, NPB, CBP, TCTA, Znpp$_2$, ZnBOX or the like described above. By thus providing the separation layer 214, a defect that emission intensity of one of the first light-emitting layer 213 and the second light-emitting layer 215 is stronger than that of the other can be prevented. Note that the separation layer 214 is not necessarily provided, and it may be provided as appropriate so that the ratio in emission intensity of the first light-emitting layer 213 and the second light-emitting layer 215 can be adjusted.

Note that in Embodiment 3, any of the organometallic complexes described in Embodiment 1 is used for the second light-emitting layer 215, and another light-emitting substance is used for the first light-emitting layer 213; however, any of the organometallic complexes described in Embodiment 1 may be used for the first light-emitting layer 213, and another light-emitting substance may be used for the second light-emitting layer 215.

Further, in Embodiment 3, a light-emitting element including two light-emitting layers is described as illustrated in FIG. 2; however, the number of the light-emitting layers is not limited to two, and may be more than two, for example, three as long as light emission from each light-emitting layer can be mixed. As a result, white light emission can be obtained, for example.

Note that the first electrode 201 may have a structure similar to that of the first electrode 101 described in Embodiment 2. Further, the second electrode 202 may also have a structure similar to that of the second electrode 102 described in Embodiment 2.

Further, in Embodiment 3, as illustrated in FIG. 2, a hole-injecting layer 211, a hole-transporting layer 212, an electron-transporting layer 216, and an electron-injecting layer 217 are provided. The structures of the respective layers described in Embodiment 2 may be applied to these layers. However, these layers are not necessarily provided and may be provided as appropriate according to element characteristics.

Note that this embodiment can be implemented in free combination with any of the other embodiments.

Embodiment 4

In Embodiment 4, a light-emitting element in which a plurality of light-emitting layers are provided and light is emitted from these layers with a different element structure from that in Embodiment 3 is exemplified. Accordingly, also in Embodiment 4, light which is a combination of light emitted from the plurality of layers can be obtained. In other words, white light can be obtained. Hereinafter, description is made with reference to FIG. 3.

Figure 3:
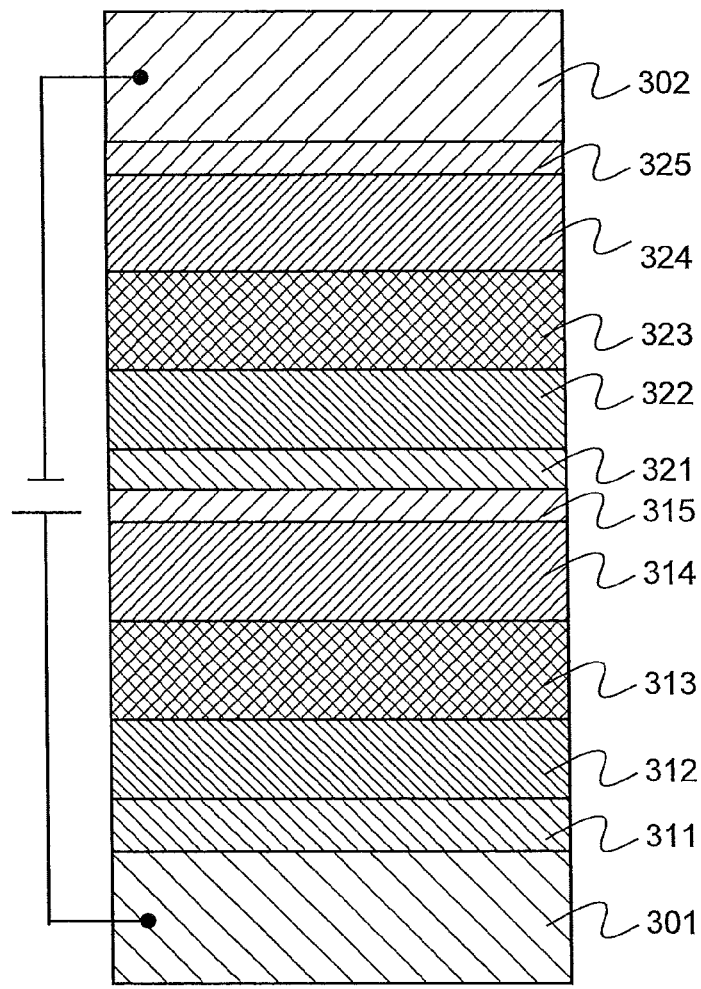
FIG. 3 illustrates a light-emitting element according to an embodiment of the present invention.

In the light-emitting element in FIG. 3, a first light-emitting layer 313 and a second light-emitting layer 323 are provided between a first electrode 301 and a second electrode 302. An N layer 315 and a P layer 321 as charge-generating layers are provided between the first light-emitting layer 313 and the second light-emitting layer 323.

The N layer 315 is a layer for generating electrons, and the P layer 321 is a layer for generating holes. When voltage is applied so that a potential of the first electrode 301 is higher than that of the second electrode 302, holes injected from the first electrode 301 and electrons injected from the N layer 315 are recombined in the first light-emitting layer 313, and thus, a first light-emitting substance included in the first light-emitting layer 313 emits light. Further, electrons injected from the second electrode 302 and holes injected from the P layer 321 are recombined in the second light-emitting layer 323, and thus, a second light-emitting substance included in the second light-emitting layer 323 emits light.

The first light-emitting layer 313 may have a structure similar to that of the first light-emitting layer 213 of Embodiment 3, and light with a peak of emission spectrum at 450 nm to 510 nm (i.e., blue light to blue green light) can be obtained. The second light-emitting layer 323 may have the same structure as the second light-emitting layer 215 in Embodiment 3, and includes an organometallic complex described in Embodiment 1 and red light emission can be obtained. Since the organometallic complex described in Embodiment 1 has high emission efficiency, a light-emitting element with high emission efficiency can be obtained. In addition, a light-emitting element with reduced power consumption can be obtained.

Since the N layer 315 is a layer for generating electrons, it may be formed using a composite material in which the organic compound and the electron donor described in Embodiment 2 are combined. By adopting such a structure, electrons can be injected to the first light-emitting layer 313 side.

The P layer 321 is a layer for generating holes, and thus, may be formed using a composite material in which the organic compound and the electron donor described in Embodiment 2 are combined. By adopting such a structure, holes can be injected to the second light-emitting layer 323 side. For the P layer 321, metal oxide having an excellent hole-injecting property, such as molybdenum oxide, vanadium oxide, ITO, or ITSO, can be used.

Further, in Embodiment 3, a light-emitting element including two light-emitting layers is described as illustrated in FIG. 3; however, the number of the light-emitting layers is not limited to two, and may be more than two, for example, three as long as light emission from each light-emitting layer may be mixed. As a result, white light emission can be obtained, for example.

The first electrode 301 may have a structure similar to the first electrode 101 described above in Embodiment 2. The second electrode 302 may also have a structure similar to the second electrode 102 described above in Embodiment 2.

In Embodiment 4, as illustrated in FIG. 3, a hole-injecting layer 311, hole-transporting layers 312 and 322, electron-transporting layers 314 and 324, and an electron-injecting layer 325 are provided. The structures of the respective layers described in Embodiment 2 may also be applied. However, these layers are not necessarily provided and may be provided as appropriate according to element characteristics.

Note that this embodiment can be implemented in free combination with any of the other embodiments.

Embodiment 5

In Embodiment 5, an embodiment of a light-emitting element using any of the organometallic complexes described in Embodiment 1 as a sensitizer is described with reference to FIG. 1.

A light-emitting element including a light-emitting layer 113 between a first electrode 101 and a second electrode 102 is illustrated in FIG. 1. The light-emitting layer 113 includes the organometallic complex described in Embodiment 1, and a fluorescent compound which can emit light with a longer wavelength than the organometallic complex.

In the light-emitting element like this, holes injected from the first electrode 101 and electrons injected from the second electrode 102 are recombined in the light-emitting layer 113 to bring the fluorescent compound to an excited state. The excited fluorescent compound emits light while returning to the ground state. In this case, the organometallic complex described in Embodiment 1 serves as a sensitizer for the fluorescent compound to make more molecules of the fluorescent compound be in the singlet excited state. From the above, a light-emitting element with high emission efficiency can be obtained by using the organometallic complex described in Embodiment 1 as a sensitizer. Note that the first electrode 101 and the second electrode 102 serve as an anode and a cathode, respectively, in the light-emitting element of Embodiment 5.

Here, the light-emitting layer 113 includes the organometallic complex described in Embodiment 1, and a fluorescent compound which can emit light with a longer wavelength than the organometallic complex. The light-emitting layer 113 preferably has a structure in which a substance having larger triplet excitation energy than the organometallic complex described in Embodiment 1 and larger singlet excitation energy than that of the fluorescent compound is used as a host, and the organometallic complex described in Embodiment 1 and the fluorescent compound are dispersed as a guest.

There is no particular limitation on the substance used for dispersing the organometallic complex described in Embodiment 1 and the fluorescent compound (i.e., host), and the substances given above as examples of the host in Embodiment 2, or the like can be used.

In addition, there is also no particular limitation on the fluorescent complex; however, a compound which can exhibit emission of red light to infrared light is preferable; for example, 4-dicyanomethylene-2-isopropyl-6-[2-(1,1,7,7-tetramethyljulolidin-9-yl)ethenyl]-4H-pyran (abbr.: DCJTI), magnesium phthalocyanine, magnesium porphyrin, phthalocyanine and the like are preferable.

The first electrode 101 and the second electrode 102 may have structures similar to those described in Embodiment 2.

In Embodiment 5, as illustrated in FIG. 1, the hole-injecting layer 111, the hole-transporting layer 112, the electron-transporting layer 114, and the electron-injecting layer 115 are provided. The structures of the respective layers described in Embodiment 2 may be applied. However, these layers are not necessarily provided and may be provided as appropriate according to element characteristics.

The above-described light-emitting element can emit light highly efficiently by using the organometallic complex described in Embodiment 1 as a sensitizer.

Note that this embodiment can be implemented in free combination with any of the other embodiments.

Embodiment 6

Figure 4A:
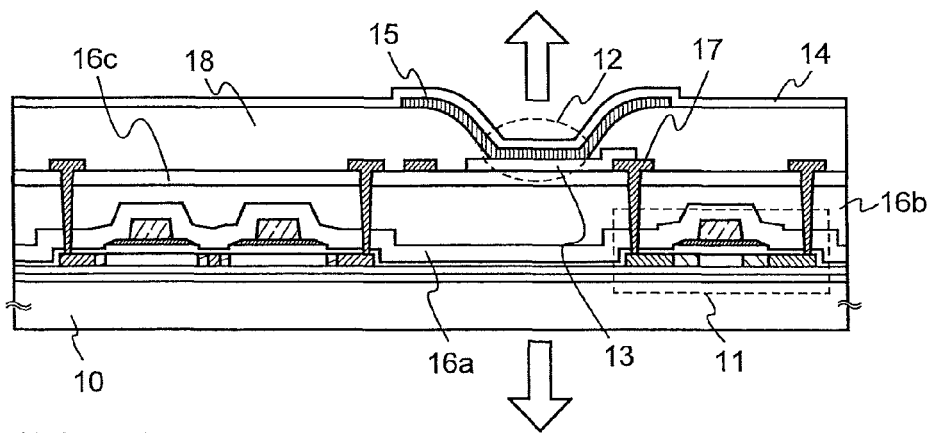
FIGS. 4A to 4C each illustrate a light-emitting device according to an embodiment of the present invention.
Figure 4B:
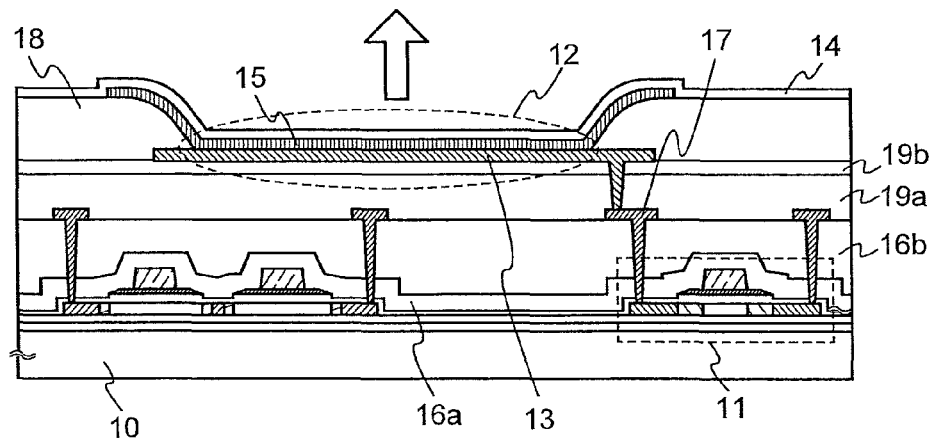
Figure 4C:
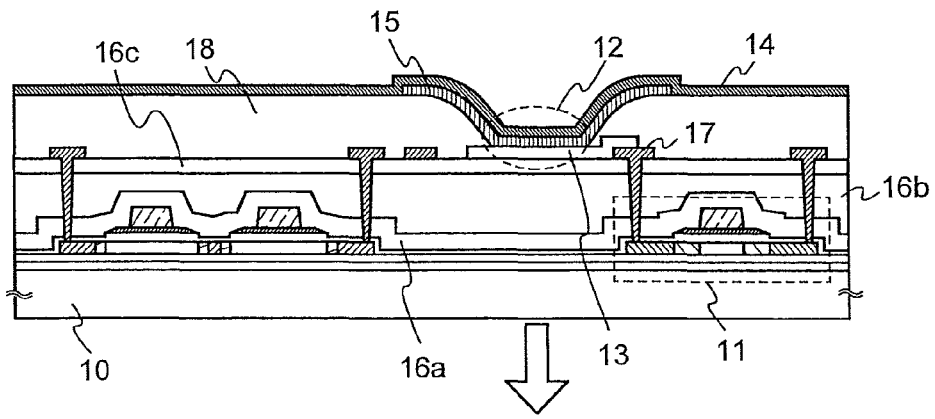

In Embodiment 6, one embodiment of light-emitting devices each including any of the light-emitting elements described in the above embodiments is described with reference to FIGS. 4A to 4C. FIGS. 4A to 4C are cross-sectional views illustrating the light-emitting devices.

In FIGS. 4A to 4C, a portion surrounded by dotted lines of a rectangular shape is a transistor 11 which is provided to drive a light-emitting element 12. The light-emitting element 12 includes a layer 15 in which a light-emitting layer is formed between a first electrode 13 and a second electrode 14, and the light-emitting layer includes the organometallic complex described in Embodiment 1. Specifically, the light-emitting element 12 has the structure as described in Embodiments 2 to 5. A drain region of the transistor 11 is electrically connected to the first electrode 13 with a wiring 17 penetrating a first interlayer insulating film 16 (16a, 16b, and 16c). The light-emitting element 12 is separated from other adjacently-provided light-emitting elements by a partition layer 18. The light-emitting device of this embodiment having such a structure is provided over a substrate 10 in this embodiment.

The transistors 11 illustrated in FIGS. 4A to 4C each are a top gate type in which a gate electrode is provided on a side opposite to a substrate, regarding the semiconductor layer as a center. Note that there is no particular limitation on the structure of the transistor 11; for example, a bottom gate type may be used. In the case of a bottom gate type, the transistor 11 may have a structure in which a protective film is formed over a semiconductor layer for forming a channel (a channel protective type) or a structure in which part of the semiconductor layer for forming a channel has a depression (a channel etch type).

In addition, the semiconductor layer included in the transistor 11 may be either crystalline or amorphous. Alternatively, the semiconductor layer may be formed using a microcrystalline semiconductor, an oxide semiconductor, or the like.

A composite oxide of an element selected from indium, gallium, aluminum, zinc, and tin can be used for the oxide semiconductor layer. Examples include zinc oxide (ZnO), indium oxide containing zinc oxide (IZO), and oxide containing indium oxide, gallium oxide, and zinc oxide (IGZO). In addition, specific examples of the crystalline semiconductor layer include a layer formed using single-crystal or polycrystalline silicon, silicon germanium, or the like. The above examples may be formed by laser crystallization or may be formed by crystallization through a solid-phase growth method using, for example, nickel.

In the case of using an amorphous substance, for example, amorphous silicon for forming the semiconductor layer, it is preferable that the light-emitting device have a circuit in which the transistor 11 and other transistors (transistors included in a circuit for driving the light-emitting element) are all n-channel transistors. Many oxide semiconductors such as zinc oxide (ZnO), indium oxide containing zinc oxide (IZO), oxide containing indium oxide, gallium oxide, and zinc oxide (IGZO), and the like are n-type semiconductors; therefore, a transistor which includes any of these compounds in an active layer is an n-channel transistor. Other than that case, the light-emitting device may have a circuit including either n-channel transistors or p-channel transistors, or may have a circuit including both n-channel transistors and p-channel transistors.

The first interlayer insulating films 16a to 16c may have a multilayer structure as illustrated in FIGS. 4A and 4C, or a single-layer structure. Note that the interlayer insulating film 16a is formed using an inorganic material such as silicon oxide or silicon nitride; the interlayer insulating film 16b is formed using acrylic, siloxane (an organic group including a skeleton formed by a bond of silicon (Si) and oxygen (O) and including at least hydrogen as a substituent) or a self-planarizing substance which can be formed by an application method, such as silicon oxide. In addition, the interlayer insulating film 16c is formed using a silicon nitride film including argon (Ar). Note that there is no particular limitation on materials forming each layer, and a material other than the above-described materials may also be used. A layer fainted using a material other than the above-described materials may be further combined. As described above, the first interlayer insulating films 16a to 16c may be formed using either an inorganic material or an organic material, or both of them.

The partition layer 18 preferably has a shape in an edge portion, in which a curvature radius changes continuously. In addition, acrylic, siloxane, resist, silicon oxide or the like is used to form the partition layer 18. Note that the partition layer 18 may be formed using either an inorganic material or an organic material, or both of them.

In FIGS. 4A and 4C, only the first interlayer insulating films 16a to 16c are provided between the transistor 11 and the light-emitting element 12. However, as illustrated in FIG. 4B, a second interlayer insulating film 19 (19a and 19b) may also be provided in addition to the first interlayer insulating film 16 (16a and 16b). In the light-emitting device illustrated in FIG. 4B, the first electrode 13 penetrates the second interlayer insulating film 19 and is connected to the wiring 17.

The second interlayer insulating film 19 may have a multilayer structure or a single-layer structure like the first interlayer insulating film 16. The second interlayer insulating film 19a is Banned using acrylic, siloxane (an organic group including a skeleton formed by a bond of silicon (Si) and oxygen (O) and including at least hydrogen as a substituent) or a self-planarizing substance which can be, formed by an application method, such as silicon oxide. The second interlayer insulating film 19b is formed using a silicon nitride film including argon (Ar). Note that there is no particular limitation on materials forming each layer, and a material other than the above-described materials may also be used. A layer formed using a material other than the above-described materials may be further combined. As described above, the second interlayer insulating film 19 may be formed using either an inorganic material or an organic material, or both of them.

When both the first electrode 13 and the second electrode 14 are formed using light-transmitting substances in the light-emitting element 12, light emission can be extracted from both the first electrode 13 side and the second electrode 14 side as indicated by the outlined arrows in FIG. 4A. When only the second electrode 14 is formed using a light-transmitting substance, light emission can be extracted from only the second electrode 14 side as indicated by the outlined arrow in FIG. 4B. In this case, it is preferable to form the first electrode 13 using a highly reflective material or to provide a film formed from a highly reflective material (reflective film) below the first electrode 13. When only the first electrode 13 is formed using a light-transmitting substance, light emission can be extracted from only the first electrode 13 side as indicated by the outlined arrow in FIG. 4C. In this case, it is preferable to form the second electrode 14 using a highly reflective material or to provide a reflective film above the second electrode 14.

In the light-emitting element 12, the layer 15 may have a stacked structure so as to operate the light-emitting element 12 when voltage is applied so that a potential of the second electrode 14 is higher than that of the first electrode 13, or the layer 15 may have a stacked structure so as to operate the light-emitting element 12 when voltage is applied so that a potential of the second electrode 14 is lower than that of the first electrode 13. In the former case, the transistor 11 is an n-channel transistor, and in the latter case, the transistor 11 is a p-channel transistor.

In this embodiment, an active-matrix light-emitting device in which operation of a light-emitting element is controlled by a transistor is described. In addition, a passive-matrix light-emitting device in which a light-emitting element is operated without provision of an element for driving a transistor or the like on the substrate over which the light-emitting element is formed may be manufactured.

Since any of the light-emitting elements described in the above embodiments is used in the light-emitting device described in Embodiment 6, the light-emitting device can emit light of a color with high purity. In addition, the light-emitting device can have high emission efficiency and consume a small amount of power.

Embodiment 7

In Embodiment 7, electronic devices each of which includes, as a part thereof, the light-emitting device described in Embodiment 6 is described. The electronic device described in this embodiment has a display portion with high emission efficiency and reduced power consumption since the display portion includes the organometallic complex described in Embodiment 1. Further, the electric device described in this embodiment includes the display portion also with excellent color reproducibility. In the case where the organometallic complex described in Embodiment 1 is used for a full-color display, various light-emitting substances can be used for a light-emitting element of a color other than red and a light-emitting element having a structure similar to those described in Embodiments 2 to 5 can be employed as the light-emitting element of a color other than red.

Electronic devices each including a light-emitting element manufactured using the organometallic complex of the present invention can be a camera such as a video camera or a digital camera, a goggle type display, a navigation system, an audio reproducing device (car audio component stereo, audio component stereo, or the like), a computer, a game machine, a portable information terminal (mobile computer, mobile phone, portable game machine, electronic book, or the like), and an image reproducing device provided with a recording medium (specifically, a device capable of reproducing a recording medium such as a digital versatile disc (DVD) and provided with a display device that can display the image), and the like. Specific examples of these electronic devices are illustrated in FIGS. 5A to 5E.

Figure 5A:
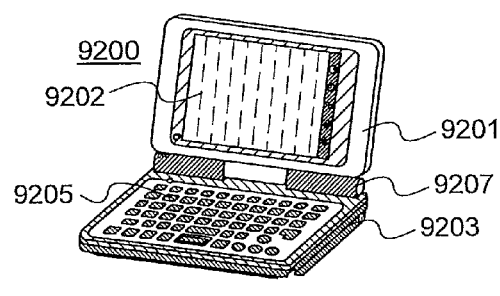
FIGS. 5A to 5E each illustrate an electronic device according to an embodiment of the present invention.

An example of a portable information terminal device 9200 is illustrated in FIG. 5A. The portable information terminal device 9200 incorporates a computer and thus can process various types of data. An example of the portable information terminal device 9200 is a personal digital assistant (PDA).

The portable information terminal device 9200 has a housing 9201 and a housing 9203. The housing 9201 and the housing 9203 are joined to each other with a joining portion 9207 so that the portable information terminal device 9200 can be foldable. A display portion 9202 is incorporated in the housing 9201, and the housing 9203 is provided with a keyboard 9205. Needless to say, the structure of the portable information terminal device 9200 is not limited to the above, and may be provided with an additional accessory as appropriate. In the display portion 9202, light-emitting elements similar to those described in the above embodiments are arranged in a matrix form. Features of the light-emitting element include high emission efficiency and low power consumption. In addition, light emission of red with high luminous efficiency can be realized. The display portion 9202 including the light-emitting element has a similar feature; therefore, in this portable information terminal device, there is no deterioration of image quality and low power consumption is achieved. With such features, deterioration compensating function circuits and power supply circuits can be greatly reduced in number or in size in the portable information terminal device. Therefore, the portable information terminal device can be reduced in size and weight.

Figure 5B:
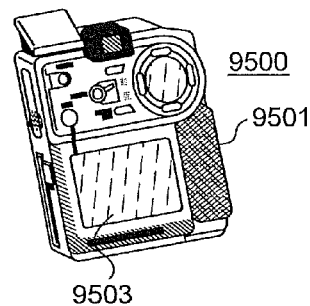

An example of a digital video camera 9500 is illustrated in FIG. 5B. In the digital video camera 9500, a display portion 9503 is incorporated in a housing 9501 and various operation portions are also provided. Note that the structure of the digital video camera 9500 is not limited to the above, and may be provided with an additional accessory as appropriate.

In this video camera, the display portion 9503 includes light-emitting elements similar to those described in the above embodiments, which are arranged in a matrix form. Features of the light-emitting element include high emission efficiency and low power consumption. In addition, light emission of red with high luminous efficiency can be realized. The display portion 9503 including the light-emitting element has a similar feature; therefore, in this digital video camera, there is no deterioration of image quality and low power consumption is achieved. With such features, deterioration compensating function circuits and power supply circuits can be greatly reduced in number or in size in the digital video camera. Therefore, the digital video camera can be reduced in size and weight.

Figure 5C:
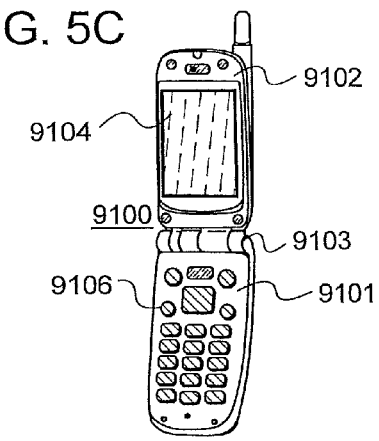

An example of a cellular phone 9100 is illustrated in FIG. 5C. The cellular phone 9100 has a housing 9102 and a housing 9101. The housing 9102 and the housing 9101 are joined with a joining portion 9103 so that the cellular phone is foldable. A display portion 9104 is incorporated in the housing 9102, and operation keys 9106 are included in the housing 9101. Note that the structure of the cellular phone 9100 is not limited to the above, and may be provided with an additional accessory as appropriate.

In this cellular phone, the display portion 9104 includes light-emitting elements similar to those described in the above embodiments, which are arranged in a matrix form. Features of the light-emitting element include high emission efficiency and low power consumption. In addition, light emission of red with high luminous efficiency can be realized. The display portion 9104 including the light-emitting element has a similar feature; therefore, in this cellular phone, there is no deterioration of image quality and low power consumption is achieved. With such features, deterioration compensating function circuits and power supply circuits can be greatly reduced in number or in size in a cellular phone. Therefore, the cellular phone can be reduced in size and weight. In addition, any of the light-emitting elements described in the above embodiments may also be used as a backlight of a display of a cellular phone or the like.

Figure 5D:
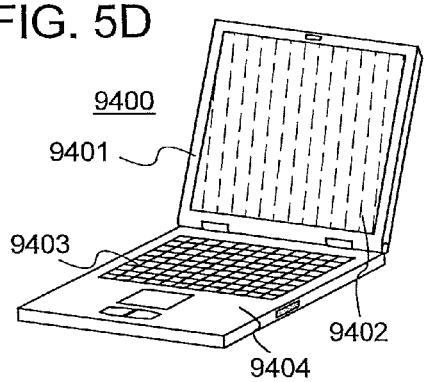

An example of a portable computer 9400 is illustrated in FIG. 5D. The computer 9400 has a housing 9401 and a housing 9404, which are joined so that the computer can be open and closed. A display portion 9402 is incorporated in the housing 9401, and the housing 9404 is provided with a keyboard 9403 and the like. Note that the structure of the computer 9400 is not limited to the above, and may be provided with an additional accessory as appropriate.

In this computer, the display portion 9402 includes light-emitting elements similar to those described in the above embodiments, which are arranged in a matrix form. Features of the light-emitting element include high emission efficiency and low power consumption. In addition, light emission of red with high luminous efficiency can be realized. The display portion 9402 including the light-emitting element has a similar feature; therefore, in this computer, there is no deterioration of image quality and low power consumption is achieved. With such features, deterioration compensating function circuits and power supply circuits can be greatly reduced in number or in size in cellular phone. Therefore, the cellular phone can be reduced in size and weight.

Figure 5E:
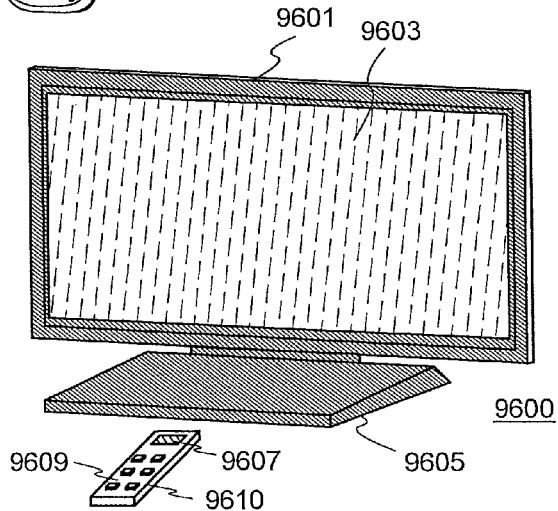

An example of a television set 9600 is illustrated in FIG. 5E. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

In at least either the display portion 9607 or the display portion 9603 of this television device, light-emitting elements similar to those described in the above embodiments are arranged in a matrix form. Features of the light-emitting element include high emission efficiency and low power consumption. In addition, light emission of red with high luminous efficiency can be realized. The display portions including such light-emitting elements also have similar features.

From the above, the application range of the light-emitting device described in above embodiment is so wide that the light-emitting device can be applied to electronic devices of a variety of fields. With the use of the organometallic complex described in Embodiment 1, electronic devices which have display portions with low power consumption and excellent color reproducibility can be provided.

The light-emitting device described in the above embodiment can also be used as a lighting device. An embodiment in which the light-emitting element described in the above embodiments, is applied to as a lighting device is described with reference to FIG. 6.

Figure 6:
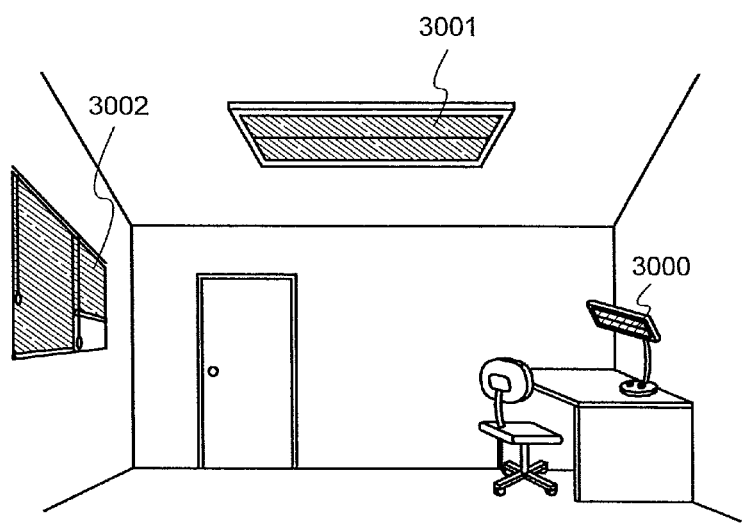
FIG. 6 illustrates lighting devices according to an embodiment of the present invention.

Lighting devices such as a table lamp and a room light are illustrated in FIG. 6 as an application of the light-emitting device whose example is described in the above embodiment. The table lamp illustrated in FIG. 6 includes a light source 3000. The light-emitting device, whose example is described in the above embodiment, is used as the light source 3000. Accordingly, a light-emitting device with low power consumption can be obtained. Since this light-emitting device can have a large area, the lighting device can be used as a light having a large area. In addition, since this light-emitting device is thin and consumes small amount of power, the light-emitting device can be used as a lighting device that is thin and consumes small amount of power. Further, since this light-emitting device can be flexible, for example, a light device can be manufactured in a shape of a roll screen as a lighting device 3002. The television device illustrated in FIG. 5E may be placed in a room where the light-emitting device described in this embodiment can be applied to the indoor lighting devices 3001 and 3002 in this manner.

Example 1

In Example 1, a specific example of synthesis of bis(2,3,5-triphenylpyrazinato) (2,2-dimethyl-3,5-hexanedionato)iridium(III) (abbr.: [Ir(tppr)$_2$(pac)]), which is an organometallic complex represented by Structural Formula (13) in Embodiment 1, is given.

[Chemical Formula 20]

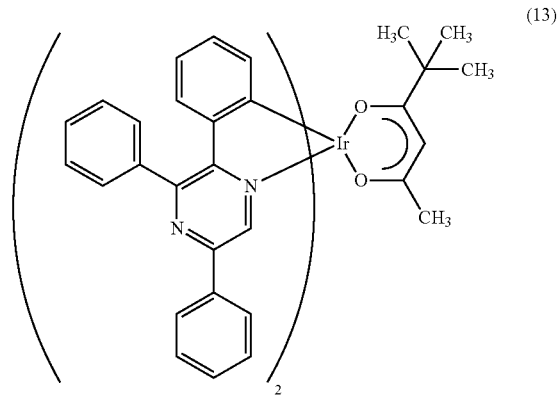

(13)

First, 20 mL of 2-ethoxyethanol, 0.78 g of a binuclear complex di-μ-chloro-bis[bis(2,3,5-triphenylpyrazinato)iridium(III)] (abbr.: [Ir(tppr)$_2$Cl]$_2$), 0.20 g of 2,2-dimethyl-3,5-hexanedion, and 0.49 g of sodium carbonate were put in a recovery flask with a reflux pipe, and the air in the flask was replaced with argon. Then, irradiation with microwaves (2.45 GHz, 100 W) for 30 minutes was performed to cause reaction. Dichloromethane was added to the reacted solution and filtration was carried out. The obtained filtrate was concentrated to precipitate red powder. The powder was obtained by filtration and washed with ethanol, and then, ether to obtain a red powdery solid, which was an object, in a yield of 93%. Note that the irradiation with microwaves was performed using a microwave synthesis system (Discover, manufactured by CEM Corporation). The synthetic scheme of this step is represented by (E-1) below.

[Chemical Formula 21]

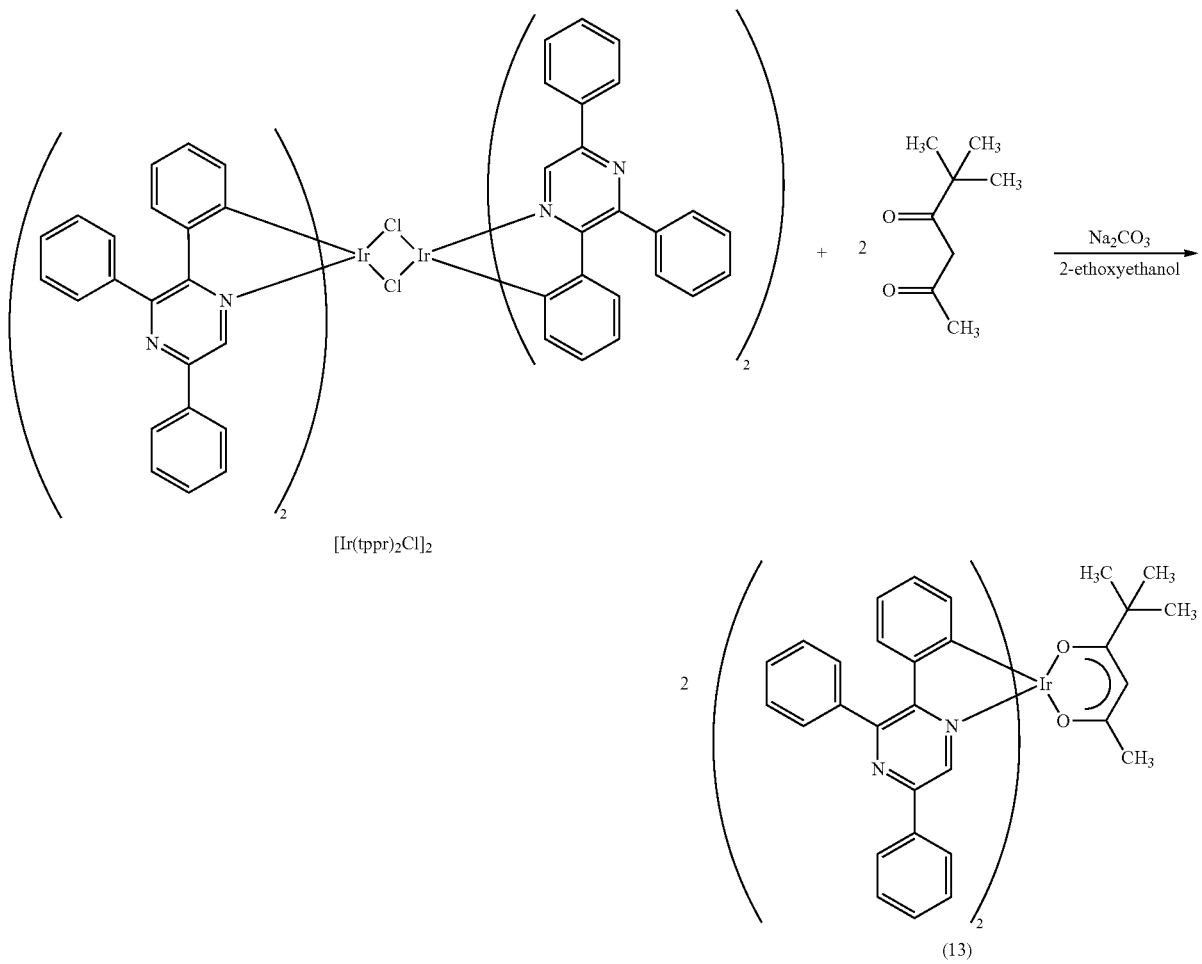

Figure 7:
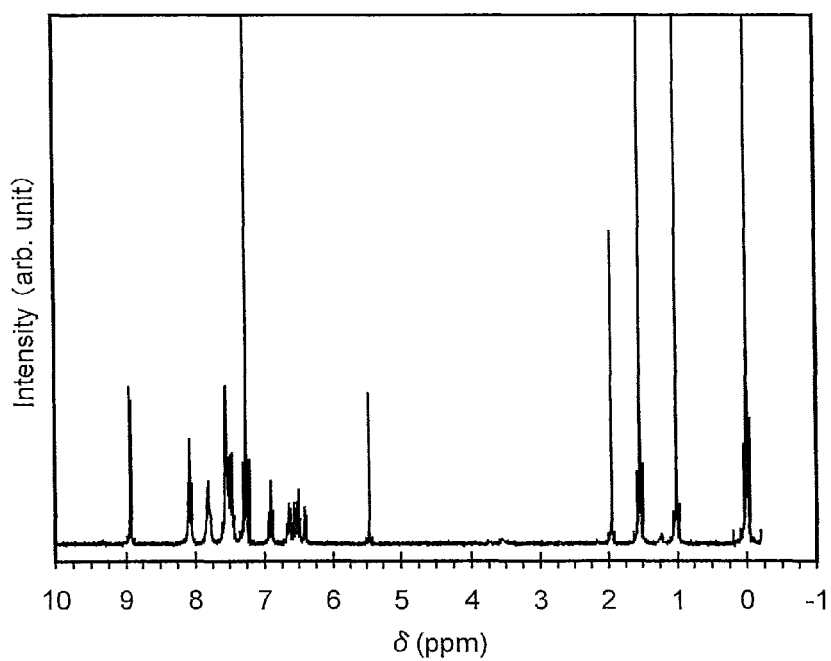
FIG. 7 shows a $^1$H-NMR chart of bis(2,3,5-triphenylpyrazinato)(2,2-dimethyl-3,5-hexanedionato)iridium (III)

Nuclear magnetic resonance spectrometry ($^1$H-NMR) revealed that the compound was [Ir(tppr)$_2$(pac)], which was an object. The obtained analysis result by $^1$H-NMR is shown below and the $^1$H-NMR chart is shown in FIG. 7.

$^1$H-NMR. δ (CDCl$_3$): 1.02 (s, 9H), 1.96 (s, 3H), 5.46 (s, 1H), 6.40 (d, 1H), 6.48-6.57 (m, 3H), 6.65 (t, 2H), 6.91 (dt, 2H), 7.47-7.61 (m, 12H), 7.82 (m, 4H), 8.08 (dt, 4H), 8.93 (d, 2H).

From these measurement results, it is known that in Example 1, the organometallic complex represented by above Structural Formula (13), [Ir(tppr)$_2$(pac)], was obtained.

The sublimation temperature of the obtained organometallic complex, [Ir(tppr)$_2$(pac)], was measured with a high vacuum differential type differential thermal balance (TG-DTA2410SA, manufactured by Braker AXS K.K.). The degree of vacuum was 2.5×10$^{-3}$ Pa and the temperature increase rate was 10° C./min, and the temperature was increased. Under such conditions, reduction in weight by 5% was observed at 226° C., which is indicative of a favorable sublimation property.

Next, an analysis of [Ir(tppr)$_2$(pac)] was conducted by an ultraviolet-visible spectrometry. The ultraviolet spectrum was measured with an ultraviolet-visible spectrophotometer (V-550, manufactured by JASCO Corporation), using a dichloromethane solution (0.057 mmol/L) at room temperature. Further, the emission spectrum of [Ir(tppr)$_2$(pac)] was measured with a fluorescence spectrophotometer (FS920, manufactured by Hamamatsu Photonics K.K.), using a degassed dichloromethane solution (0.34 mmol/L) at room temperature. A measurement result is shown in FIG. 8 in which the horizontal axis indicates a wavelength (nm) and the vertical axes indicate an absorption intensity (arbitrary unit) and an emission intensity (arbitrary unit).

Figure 8:
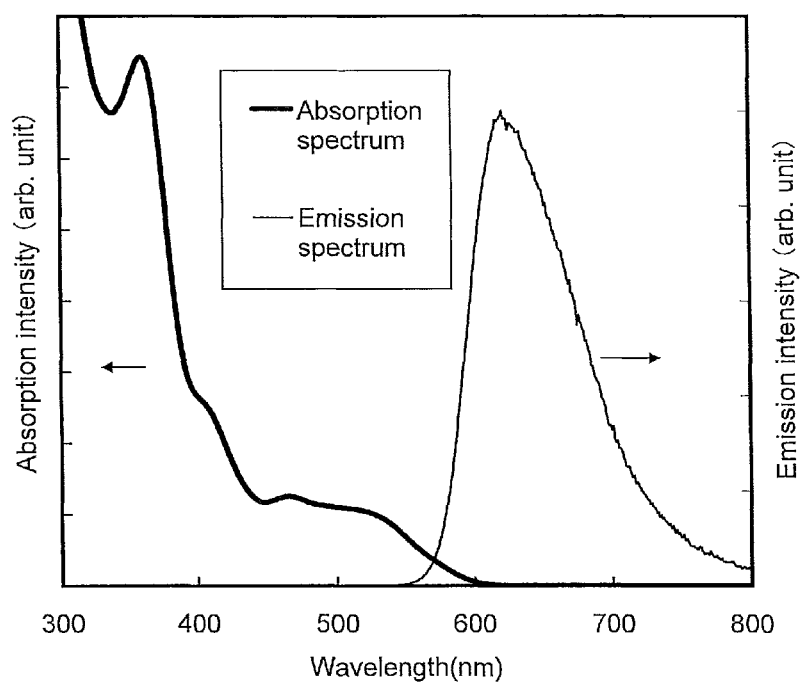
FIG. 8 shows an absorption spectrum and an emission spectrum of bis(2,3,5-triphenylpyrazinato)(2,2-dimethyl-3,5-hexanedionato)iridium(III)

As is shown in FIG. 8, an organometallic complex [Ir(tppr)$_2$(pac)] has a light emission peak at 622 nm and red light emission was observed from the dichloromethane solution.

Example 2

In Example 2, a specific example of synthesis of bis(2,3,5-triphenylpyrazinato) (2,6-dimethyl-3,5-heptanedionato) iridium(III) (abbr.: [Ir(tppr)$_2$(dibm)]), which is an organometallic complex represented by Structural Formula (15) in Embodiment 1, is given.

[Chemical Formula 22]

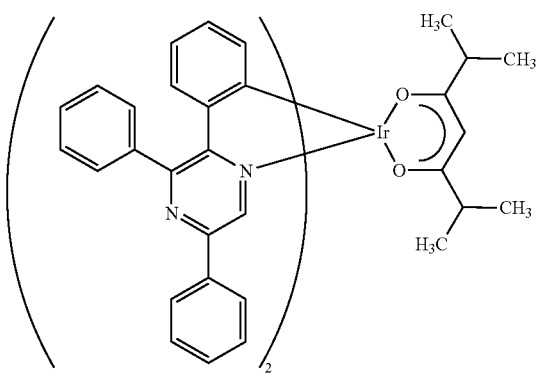

(15)

First, 20 mL of 2-ethoxyethanol, 0.65 g of a binuclear complex di-μ-chloro-bis[bis(2,3,5-triphenylpyrazinato)iridium(III)] (abbr.: [Ir(tppr)$_2$Cl]$_2$), 0.18 g of 2,6-dimethyl-3,5-heptanedione, and 0.41 g of sodium carbonate were put in a recovery flask with a reflux pipe, and the air in the flask was replaced with argon. Then, irradiation with microwaves (2.45 GHz, 100 W) for 30 minutes was performed to cause reaction. Dichloromethane was added to the reacted solution and filtration was carried out. The obtained filtrate was concentrated to precipitate red powder. The powder was obtained by filtration and washed with ethanol, and then, ether to obtain a red powdery solid, which was an object, in a yield of 92%. Note that the irradiation with microwaves was performed using a microwave synthesis system (Discover, manufactured by CEM Corporation). The synthetic scheme of this step is represented by (E-2) below.

[Chemical Formula 23]

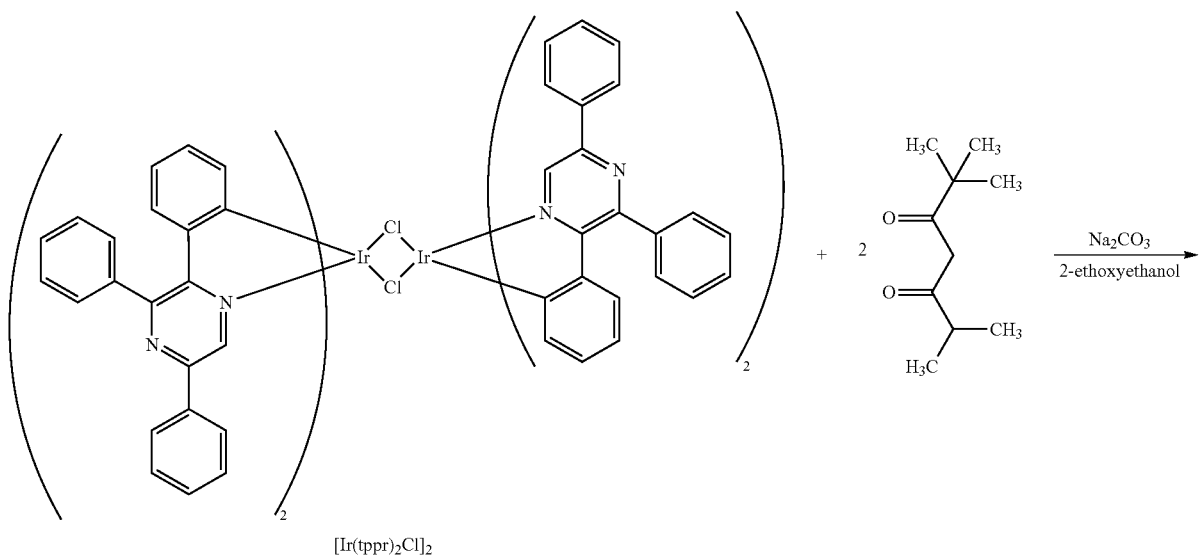

(E-2)

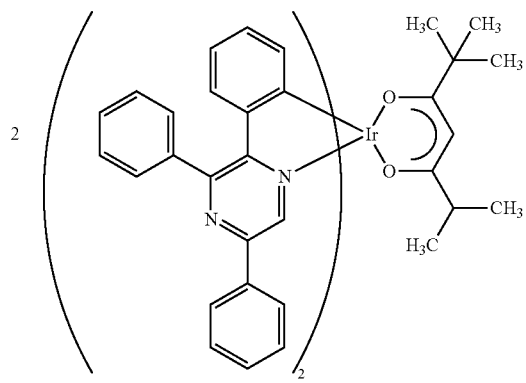

(15)

Figure 9:
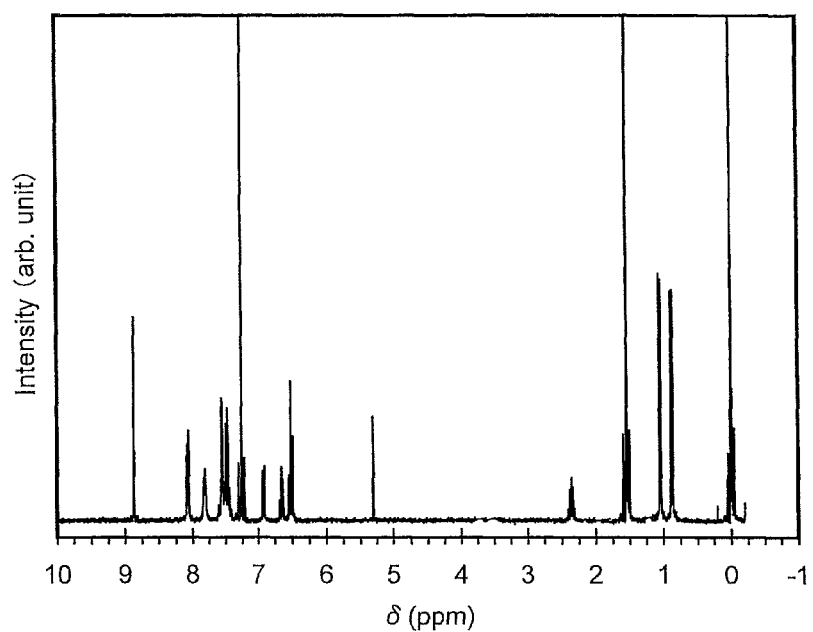
FIG. 9 shows a $^1$H-NMR chart of bis(2,3,5-triphenylpyrazinato)(2,6-dimethyl-3,5-heptanedionato)iridium (III)

Nuclear magnetic resonance spectrometry ($^1$H-NMR) revealed that the compound was [Ir(tppr)$_2$(dibm)], which was an object. An analysis result by $^1$H-NMR is shown below and the $^1$H-NMR chart is shown in FIG. 9.

$^1$H-NMR. δ (CDCl$_3$): 0.88 (d, 6H), 1.05 (d, 6H), 2.36 (sep, 2H), 5.30 (s, 1H), 6.51 (t, 4H), 6.64 (dt, 2H), 6.92 (d, 2H), 7.45-7.56 (m, 12H), 7.81 (brm, 4H), 8.07 (dd, 4H), 8.87 (s, 2H).

From these measurement results, it is known that in Example 2, the organometallic complex represented by above Structural Formula (15), [Ir(tppr)$_2$(dibm)], was obtained.

The sublimation temperature of the obtained organometallic complex, [Ir(tppr)$_2$(dibm)], was measured with a high vacuum differential type differential thermal balance (TG-DTA2410SA, manufactured by Bruker AXS K.K.). The degree of vacuum was $2.5 \times 10^{-3}$ Pa and the temperature increase rate was 10° C./min, and the temperature was increased. Under such conditions, reduction in weight by 5% was observed at 230° C., which is indicative of a favorable sublimation property.

Next, an analysis of [Ir(tppr)$_2$(dibm)] was conducted by an ultraviolet-visible spectrometry. The ultraviolet spectrum was measured with an ultraviolet-visible spectrophotometer (V-550, manufactured by JASCO Corporation), using a dichloromethane solution (0.056 mmol/L) at room temperature. Further, the emission spectrum of [Ir(tppr)$_2$(dibm)] was measured with a fluorescence spectrophotometer (FS920, manufactured by Hamamatsu Photonics K.K.), using a degassed dichloromethane solution (0.33 mmol/L) at room temperature. A measurement result is shown in FIG. 10 in which the horizontal axis indicates a wavelength (nm) and the vertical axes indicate an absorption intensity (arbitrary unit) and an emission intensity (arbitrary unit).

Figure 10:
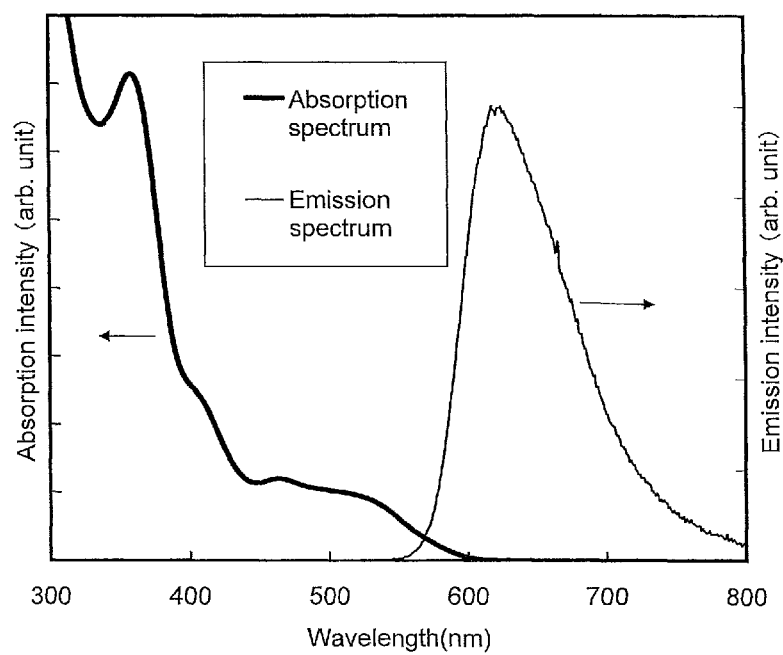
FIG. 10 shows an absorption spectrum and an emission spectrum of bis(2,3,5-triphenylpyrazinato)(2,6-dimethyl-3,5-heptanedionato)iridium(III)

As is shown in FIG. 10, an organometallic complex [Ir(tppr)$_2$(dibm)] has a light emission peak at 620 nm and red light emission was observed from the dichloromethane solution.

Example 3

In Example 3, a specific example of synthesis of bis(2,3,5-triphenylpyrazinato) (dipivaloylmethanato)iridium(III) (abbr.: [Ir(tppr)$_2$(dpm)]), which is an organometallic complex represented by Structural Formula (12) in Embodiment 1, is given.

[Chemical Formula 24]

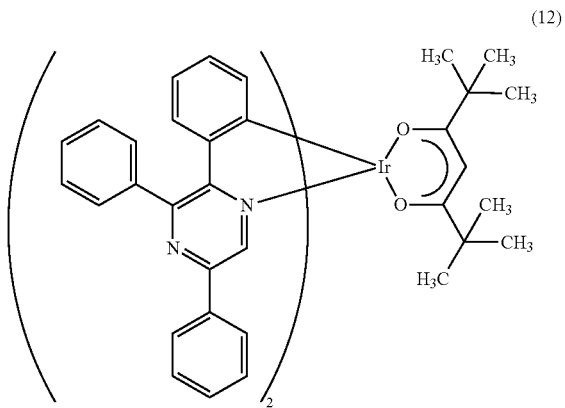

(12)

First, 25 mL of 2-ethoxyethanol, 0.40 g of a binuclear complex [Ir(tppr)$_2$Cl]$_2$, 0.14 ml of dipivaloylmethane, and 0.25 g of sodium carbonate were put in a recovery flask with a reflux pipe, and the air in the flask was replaced with argon. Then, irradiation with microwaves (2.45 GHz, 150 W) for 15 minutes was performed to cause reaction. The reacted solution was filtered and the obtained filtrate was recrystallized with ethanol to precipitate red powder. The obtained powder was washed with ethanol, and then, diethylether to obtain a red powdery solid, which was an object, in a yield of 75%. Note that the irradiation with microwaves was performed using a microwave synthesis system (Discover, manufactured by CEM Corporation). The synthetic scheme of this step is represented by (E-3) below.

[Chemical Formula 25]

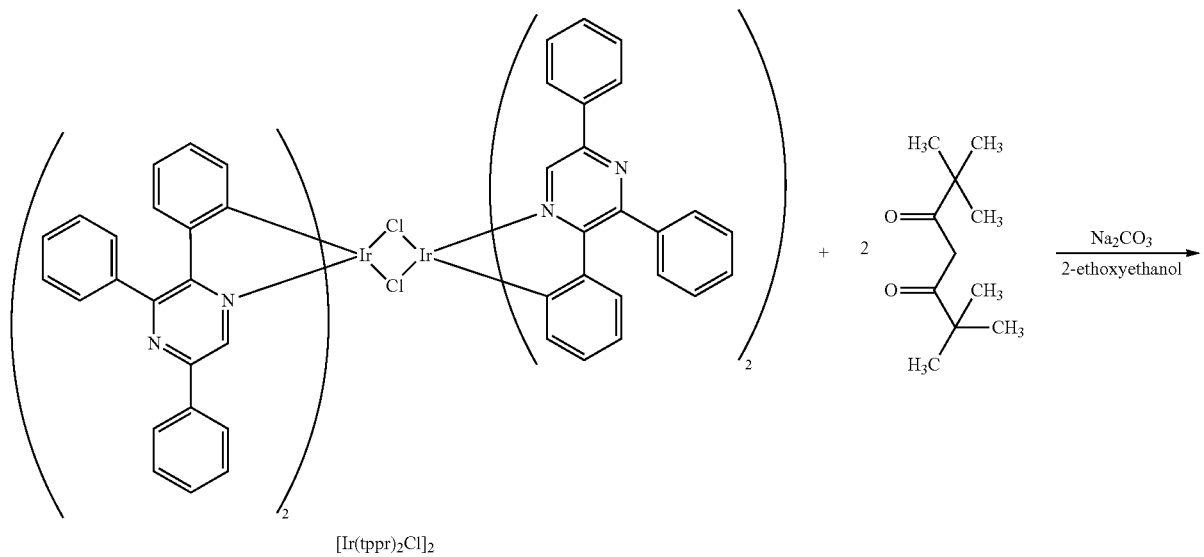

(E-3)

[Ir(tppr)$_2$Cl]$_2$

-continued

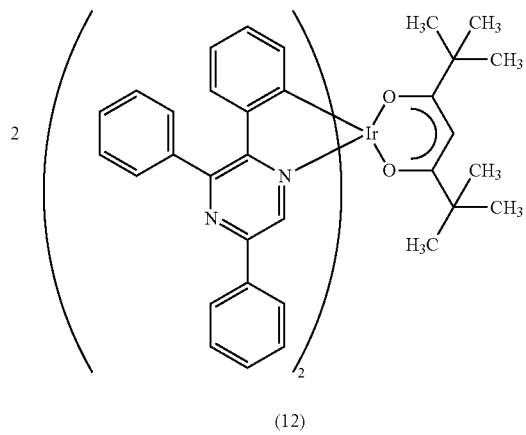

(12)

Figure 11:
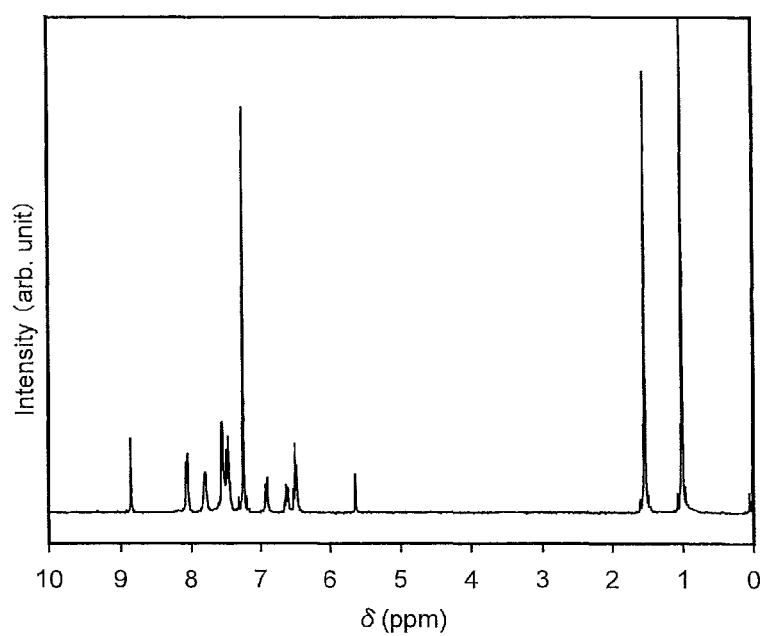
FIG. 11 shows a $^1$H-NMR chart of bis(2,3,5-triphenylpyrazinato)(dipivaloylmethanato)iridium(III)

Nuclear magnetic resonance spectrometry ($^1$H-NMR) revealed that the compound was [Ir(tppr)$_2$(dpm)], which was an object. An analysis result by $^1$H-NMR is shown below and the $^1$H-NMR chart is shown in FIG. 11.

$^1$H-NMR. δ (CDCl$_3$): 1.02 (s, 18H), 5.64 (s, 1H), 6.51 (m, 4H), 6.64 (m, 2H), 6.92 (d, 2H), 7.44-7.56 (m, 12H), 7.80 (brs, 4H), 8.06 (d, 4H), 8.86 (s, 2H).

From these measurement results, it is known that in Example 3, the organometallic complex represented by above Structural Formula (12), [Ir(tppr)$_2$(dpm)], was obtained.

The sublimation temperature of the obtained organometallic complex, [Ir(tppr)$_2$(dpm)], was measured with a high vacuum differential type differential thermal balance (TG-DTA2410SA, manufactured by Bruker AXS K.K.). The degree of vacuum was 2.5×10$^{-3}$ Pa and the temperature increase rate was 10° C./min, and the temperature was increased. Under such conditions, reduction in weight by 5% was observed at 220° C., which is indicative of a favorable sublimation property.

Next, an analysis of [Ir(tppr)$_2$(dpm)] was conducted by an ultraviolet-visible spectrometry. The ultraviolet spectrum was measured with an ultraviolet-visible spectrophotometer (V-550, manufactured by JASCO Corporation), using a dichloromethane solution (0.094 mmol/L) at room temperature. Further, the emission spectrum of [Ir(tppr)$_2$(dpm)] was measured with a fluorescence spectrophotometer (FS920, manufactured by Hamamatsu Photonics K.K.), using a degassed dichloromethane solution (0.33 mmol/L) at room temperature. The excitation wavelength was 465 nm A measurement result is shown in FIG. 12 in which the horizontal axis indicates a wavelength (nm) and the vertical axes indicate an absorption intensity (arbitrary unit) and an emission intensity (arbitrary unit).

Figure 12:
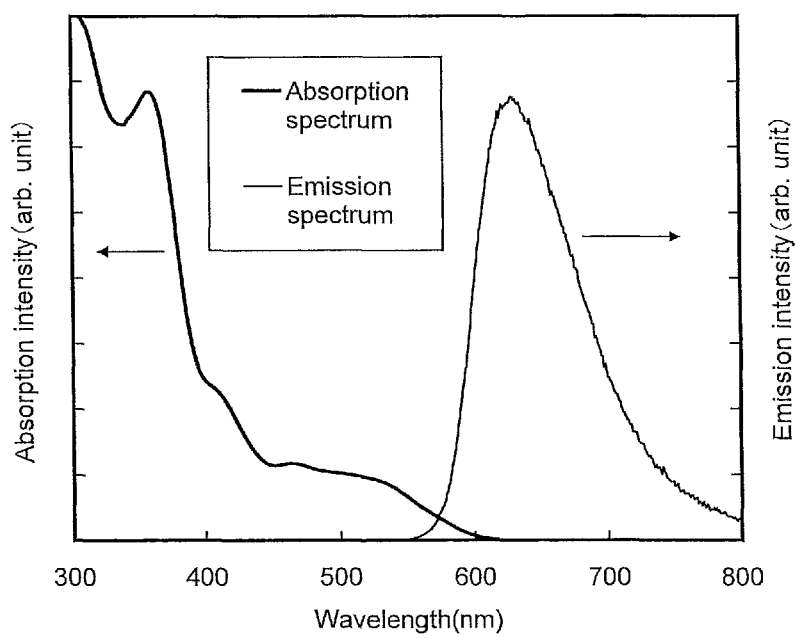
FIG. 12 shows an absorption spectrum and an emission spectrum of bis(2,3,5-triphenylpyrazinato)(dipivaloylmethanato)iridium(III)

As is shown in FIG. 12, an organometallic complex [Ir(tppr)$_2$(dpm)] has a light emission peak at 630 nm and red light emission was observed from the dichloromethane solution.

Example 4

Figure 13:
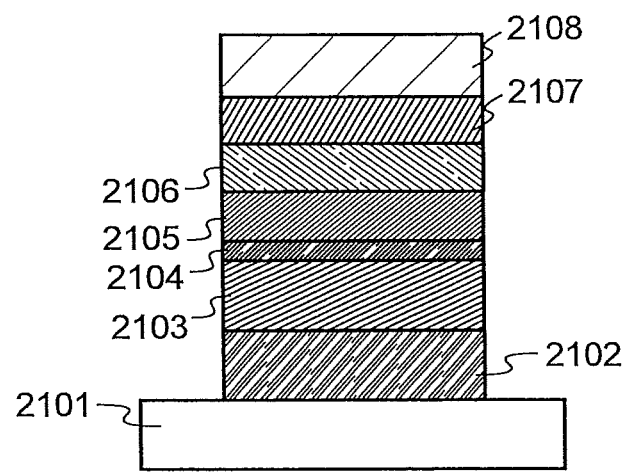
FIG. 13 illustrates a light-emitting element according to Example 4.

In Example 4, a light-emitting element according to one embodiment of the present invention is described with reference to FIG. 13. A chemical formula of the material used in this example and Example 5 are shown below.

[Chemical Formula 26]

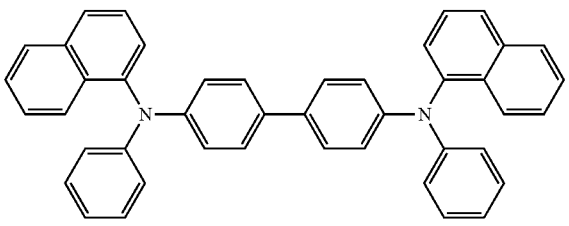
NPB

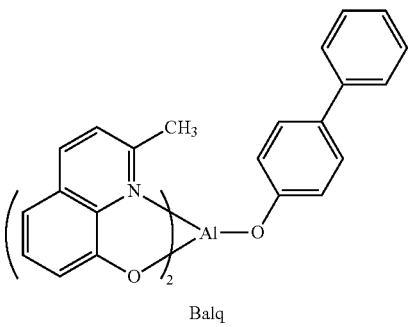
Balq

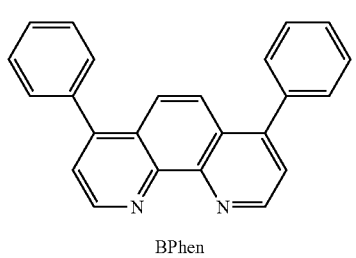
BPhen

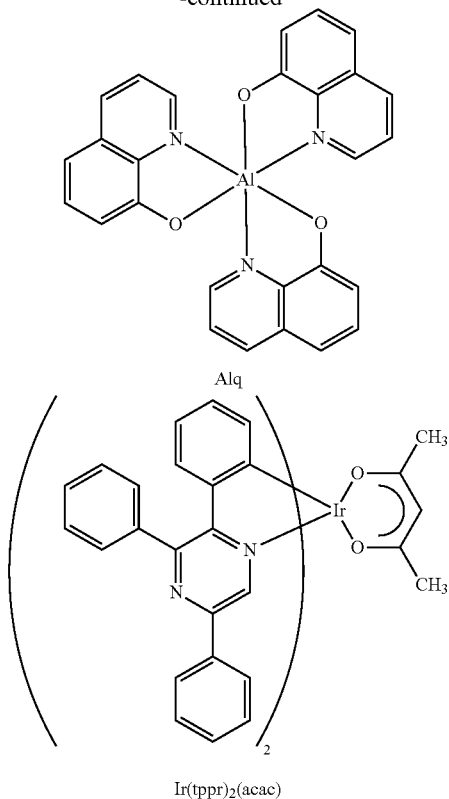

Alq

Ir(tppr)₂(acac)

A manufacturing method of light-emitting elements 1 to 3 of this example and a comparative light-emitting element 1 is described below.

First, the light-emitting element 1 is described. Indium tin oxide containing silicon oxide was deposited over a glass substrate 2101 by sputtering to form a first electrode 2102 with a thickness of 110 nm and an electrode area of 2 mm×2 mm.

Then, the substrate provided with the first electrode was fixed on a substrate holder which was provided in a vacuum evaporation apparatus, in such a manner that a surface provided with the first electrode faced downward. After that, the pressure in the vacuum evaporation apparatus was reduced to approximately $10^{-4}$ Pa. Then, a layer 2103 including a composite material of an organic compound and an inorganic compound was formed on the first electrode 2102 by co-evaporation of NPB and molybdenum(VI) oxide. The thickness of the layer 2103 was 50 nm, and the weight ratio of NPB to molybdenum(VI) oxide was 4:1 (=NPB:molybdenum oxide). Note that the co-evaporation method refers to an evaporation method in which evaporation is carried out from a plurality of evaporation sources at the same time in one treatment chamber.

Then, a film of 4,4'-bis[N-(1-naphthyl)-N-phenylamino] biphenyl (abbr.: NPB) was formed to a thickness of 10 nm over the layer 2103 including the composite material by the evaporation method using resistance heating to form a hole-transporting layer 2104.

In addition, bis(2-methyl-8-quinolinolato)(4-phenylphenolato)aluminum (abbr.: BAlq), NPB, and bis(2,3,5-triphenylpyrazinato)(2,2-dimethyl-3,5-hexanedionato)iridium (III) (abbr.: [Ir(tppr)₂(pac)]) represented by Structural Formula (13) were co-evaporated to form the light-emitting layer 2105 having a thickness of 50 nm over the hole-transporting layer 2104. Here, the weight ratio of BAlq, NPB, and [Ir(tppr)₂(pac)] was adjusted to 1:0.1:0.06 (=BAlq:NPB:[Ir(tppr)₂(pac)]).

Then, tris(8-quinolinolato)aluminum(III) (abbr.: Alq) was deposited over the light-emitting layer 2105 to a thickness of 10 nm, and bathophenanthroline (abbr.: BPhen) was deposited thereover to a thickness of 20 nm by an evaporation method using resistance heating to form an electron-transporting layer 2106.

Further, an electron-injecting layer 2107 was formed on the electron-transporting layer 2106 by evaporating lithium fluoride to a thickness of 1 nm.

Lastly, by forming a film of aluminum with a film thickness of 200 nm over the electron-injecting layer 2107 by the evaporation method using resistance heating, a second electrode 2108 was formed. Thus, the light-emitting element 1 was manufactured.

Next, the light-emitting element 2 is described. The light-emitting element 2 was manufactured in a manner similar to that of the light-emitting element 1 except for the light-emitting layer 2105. As for the light-emitting element 2, BAlq, NPB, and bis(2,3,5-triphenylpyrazinato)(2,6-dimethyl-3,5-heptanedionato)iridium(III) (abbr.: [Ir(tppr)₂(dipm)]) represented by Structural Formula (15) were co-evaporated to form the light-emitting layer 2105 having a thickness of 50 nm over the hole-transporting layer 2104. Here, the weight ratio of BAlq, NPB, and [Ir(tppr)₂(dipm)] was adjusted to 1:0.1:0.06 (=BAlq:NPB:[Ir(tppr)₂(dipm)]). Thus, the light-emitting element 2 of this example was obtained.

Next, the light-emitting element 3 is described. The light-emitting element 3 was manufactured in a manner similar to that of the light-emitting element 1 except for the light-emitting layer 2105. As for the light-emitting element 3, BAlq, NPB, and bis(2,3,5-triphenylpyrazinato)(dipivaloylmethanato)iridium(III) (abbr.: [Ir(tppr)₂(dpm)]) represented by Structural Formula (12) were co-evaporated to faint the light-emitting layer 2105 having a thickness of 50 nm over the hole-transporting layer 2104. Here, the weight ratio of BAlq, NPB, and [Ir(tppr)₂(dpm)] was adjusted to 1:0.1:0.06 (=BAlq:NPB:[Ir(tppr)₂(dpm)]). Thus, the light-emitting element 3 of this example was obtained.

Next, the comparative light-emitting element 1 is described. The comparative light-emitting element 1 was manufactured in a manner similar to that of the light-emitting element 1 except for the light-emitting layer 2105. As for the comparative light-emitting element 1, BAlq, NPB, and (acetylacetonato)bis(2,3,5-triphenylpyrazinato)iridium(III) (abbr.: [Ir(tppr)₂(acac)]) represented by Structural Formula (50) were co-evaporated to form the light-emitting layer 2105 having a thickness of 50 nm over the hole-transporting layer 2104. Here, the weight ratio of BAlq, NPB, and [Ir(tppr)₂(acac)] was adjusted to 1:0.1:0.06 (=BAlq:NPB:[Ir(tppr)₂(acac)]). Thus, the comparative light-emitting element 1 of this example was obtained.

The thus obtained light-emitting elements 1 to 3 and the comparative light-emitting element 1 were put into a glove box under a nitrogen atmosphere so that each of the light-emitting elements was sealed so as not to be exposed to the air. Then, the operation characteristics of these light-emitting elements were measured. The measurement was carried out at room temperature (under an atmosphere maintaining 25° C.).

Figure 14:
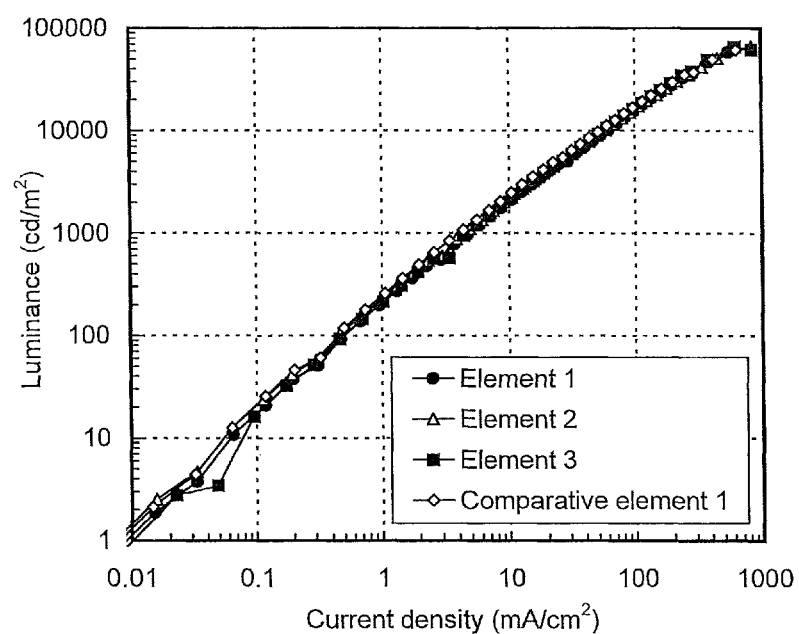
FIG. 14 shows a graph of current density-luminance characteristics of light-emitting elements 1 to 3 and a comparative light-emitting element 1.
Figure 15:
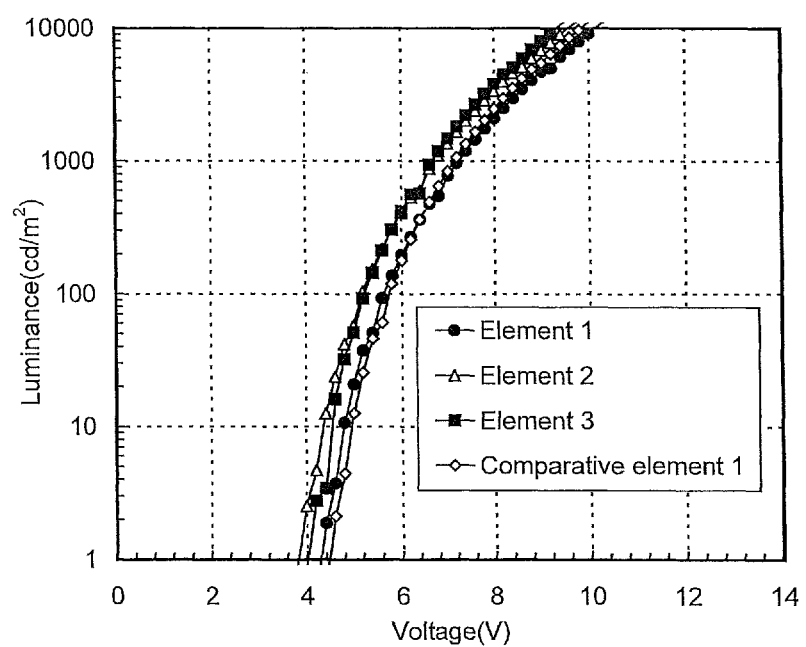
FIG. 15 shows a graph of voltage-luminance characteristics of the light-emitting elements 1 to 3 and the comparative light-emitting element 1.

Current density-luminance characteristics of the light-emitting elements 1 to 3 and the comparative light-emitting element 1 are shown in FIG. 14. In FIG. 14, the horizontal axis represents current density (mA/cm²) and the vertical axis represents luminance (cd/m²). In addition, voltage-luminance characteristics thereof are shown in FIG. 15. In FIG.

15, the horizontal axis represents applied voltage (V) and the vertical axis represents luminance ($cd/m^2$).

Figure 16A:
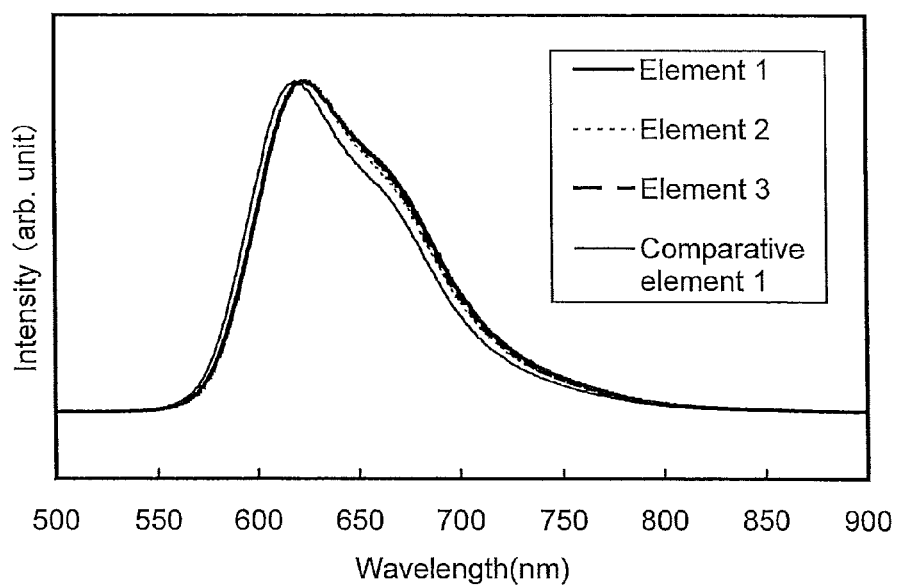
FIGS. 16A and 16B show emission spectra of the light-emitting elements 1 to 3 and the comparative light-emitting element 1.
Figure 16B:
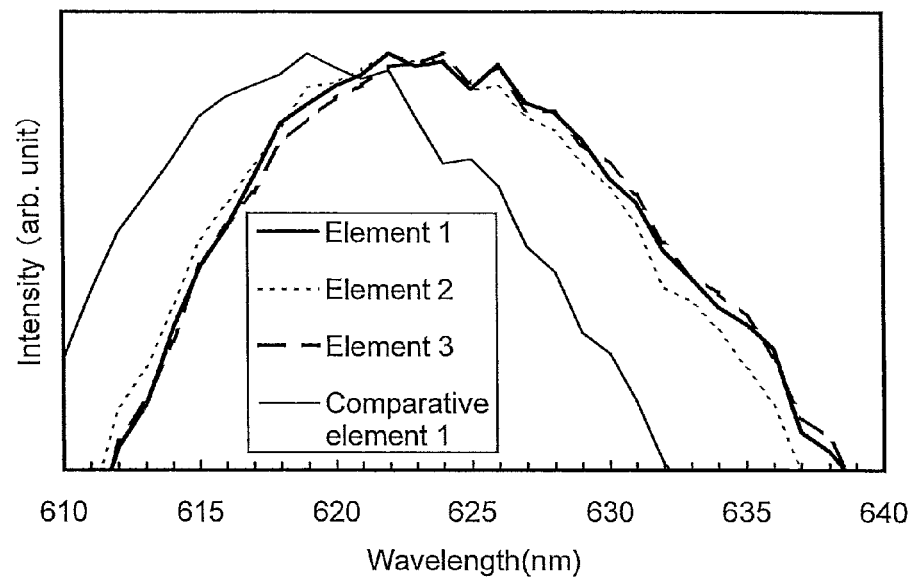

Further, emission spectra of the light-emitting elements 1 to 3 and the comparative light-emitting element 1 at a current of 0.5 mA are shown in FIGS. 16A and 16B. Note that FIG. 16B shows enlarged parts of the emission spectra in the range of 610 nm to 640 nm in FIG. 16A. From FIG. 16, the emission peak of the light-emitting elements 1 and 3 is 622 nm, the emission peak of the light-emitting element 3 is 624 nm, and the emission peak of the comparative light-emitting element 1 is 619 nm. In addition, a CIE chromaticity coordinate of the light-emitting element 1 at a luminance of 970 $cd/m^2$ was (x=0.67, y=0.33). A CIE chromaticity coordinate of the light-emitting element 2 at a luminance of 1100 $cd/m^2$ was (x=0.67, y=0.33). A CIE chromaticity coordinate of the light-emitting element 3 at a luminance of 940 $cd/m^2$ was (x=0.67, y=0.33). A CIE chromaticity coordinate of the comparative light-emitting element 1 at a luminance of 1070 $cd/m^2$ was (x=0.66, y=0.34). Accordingly, while any of the manufactured light-emitting elements 1 to 3 and the comparative light-emitting element 1 exhibited red light emission, the light-emitting elements 1 to 3 exhibited more favorable red light emission than the comparative light-emitting element 1.

Further, as for the light-emitting element 1, when the luminance was 970 $cd/m^2$, the voltage was 7.2 V and the external quantum efficiency was 20%. As for the light-emitting element 2, when the luminance was 1100 $cd/m^2$, the voltage was 6.8 V and the external quantum efficiency was 22%. As for the light-emitting element 3, when the luminance was 940 $cd/m^2$, the voltage was 6.6 V and the external quantum efficiency was 21%. As for the comparative light-emitting element 1, when the luminance was 1070 $cd/m^2$, the voltage was 7.2 V and the external quantum efficiency was 21%.

Figure 21:
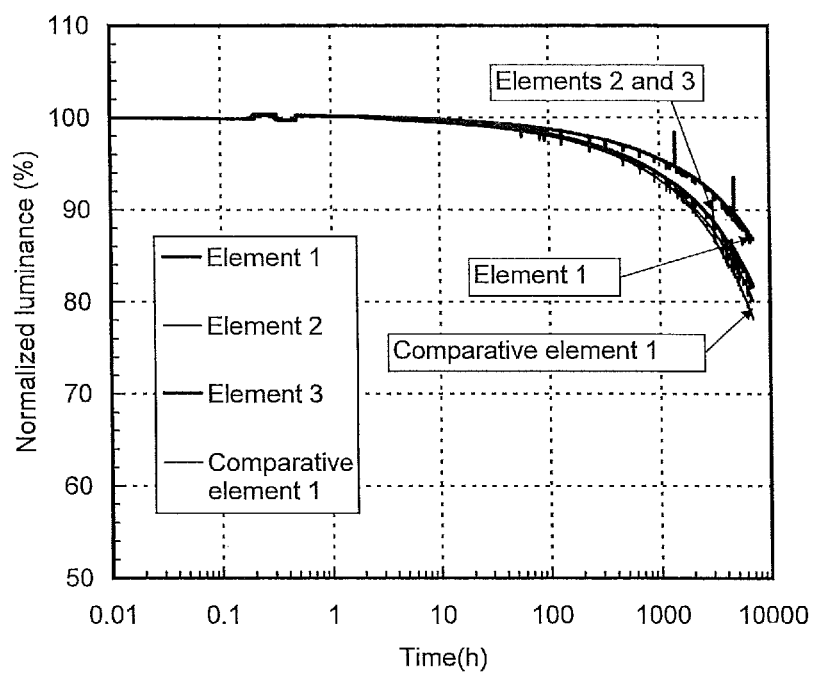
FIG. 21 shows results obtained by reliability tests of the light-emitting elements 1 to 3 and the comparative light-emitting element 1.

Further, reliability tests of the light-emitting element 1, the light-emitting element 2, the light-emitting element 3, and the comparative light-emitting element 1 which were formed were carried out. In the reliability tests, the initial luminance was set at 1000 $cd/m^2$, these elements were operated at constant current density, and the luminance was measured at regular intervals. Results of the reliability tests are shown in FIG. 21. In FIG. 21, the horizontal axis represents current flow time (hour) and the vertical axis represents the proportion of luminance with respect to the initial luminance at each time, that is, normalized luminance (%).

As shown in FIG. 21, the light-emitting element 1, the light-emitting element 2, the light-emitting element 3, and the comparative light-emitting element 1 are light-emitting elements whose luminance is hardly reduced with time, and which have a long lifetime. The light-emitting elements 1 to 3 kept 82%, 80%, and 87% of the initial luminance, respectively, after 7000-hour-operation. The luminance of the comparative light-emitting element 1 after 7000-hour-operation was 78% of the initial luminance. Therefore, reduction in the luminance over time of the light-emitting elements 1 to 3 is less likely to occur than that of the comparative light-emitting element 1 and the light-emitting elements 1 to 3 have a long lifetime.

Accordingly, it was confirmed that each of the light-emitting elements 1 to 3 of this example had sufficient characteristics to serve as a light-emitting element. In addition, the light-emitting elements 1 to 3 exhibited favorable red light emission and had a long lifetime. Further, it was confirmed that the light-emitting element 2 using [Ir(tppr)$_2$(dibm)], an organometallic complex in which both $R^{21}$ and $R^{22}$ are isopropyl groups each having 3 carbon atoms represented by General Formula (G1), and the light-emitting element 3 using [Ir(tppr)$_2$(dpm)], an organometallic complex in which both $R^{21}$ and $R^{22}$ are tert-butyl groups each having 4 carbon atoms represented by General Formula (G1) are light-emitting elements capable of being operated at a low voltage.

Figure 25:
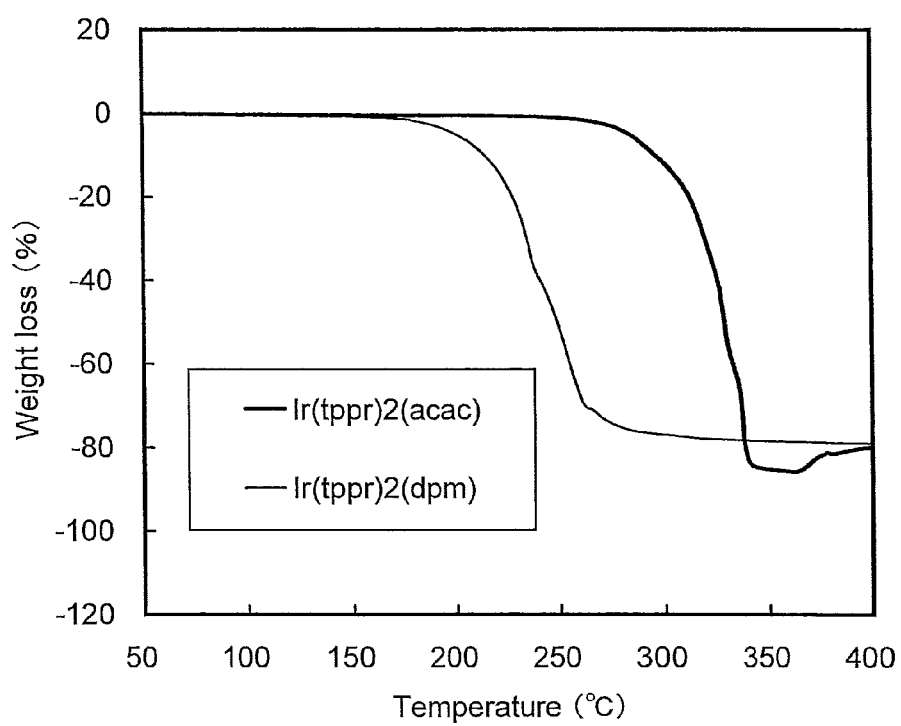
FIG. 25 shows sublimation properties of bis(2,3,5-triphenylpyrazinato) (dipivaloylmethanato)iridium(III) and (acetylacetonato)bis(2,3,5-triphenylpyrazinato)iridium(III).

In FIG. 25, sublimation properties of [Ir(tppr)$_2$(dpm)], an organometallic complex used for the light-emitting element 3, and [Ir(tppr)$_2$(acac)], an organometallic complex used for the comparative light-emitting element 1, are shown. The sublimation temperatures were measured with a high vacuum differential type differential thermal balance (TG-DTA2410SA, manufactured by Bruker AXS K.K.) under the condition that the degree of vacuum was 2.5×10 Pa and the temperature increase rate was 10° C./min.

As shown in FIG. 25, [Ir(tppr)$_2$(dpm)], the organometallic complex used for the light-emitting element 3, is likely to sublime at a lower temperature than [Ir(tppr)$_2$(acac)], the organometallic complex used for the comparative light-emitting element 1, and has a favorable sublimation property. Thus, [Ir(tppr)$_2$(dpm)], the organometallic complex, can sublime without pyrolysis, and in a case where a light-emitting layer including a low molecular compound is formed by an evaporation method, it can be avoided that decomposed matters are mixed in the light-emitting layer. Accordingly, the light-emitting element 3 according to this embodiment, which used the organometallic compound, can be a light-emitting element with a long lifetime.

Example 5

Figure 17:
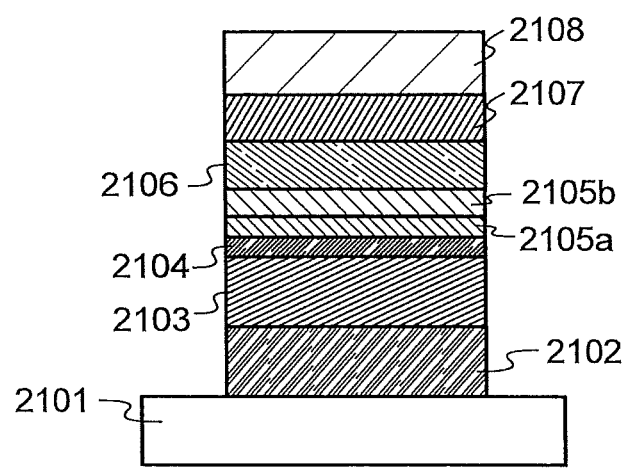
FIG. 17 illustrates a light-emitting element according to Example 5.

In Example 5, a light-emitting element according to one embodiment of the present invention is described with reference to FIG. 17.

A manufacturing method of the light-emitting element 4 and the comparative light-emitting element 2 of this example is described below.

First, the light-emitting element 4 is described. Indium tin oxide containing silicon oxide was deposited over a glass substrate 2101 by sputtering to form a first electrode 2102 with a thickness of 110 nm and an electrode area of 2 mm×2 mm.

Then, the substrate provided with the first electrode was fixed on a substrate holder which was provided in a vacuum evaporation apparatus, in such a manner that a surface provided with the first electrode faced downward. After that, the pressure in the vacuum evaporation apparatus was reduced to approximately $10^{-4}$ Pa. Then, a layer 2103 including a composite material of an organic compound and an inorganic compound was formed on the first electrode 2102 by co-evaporation of NPB and molybdenum(VI) oxide. The thickness of the layer 2103 was 50 nm, and the weight ratio of NPB to molybdenum(VI) oxide was 4:1 (=NPB:molybdenum oxide). Note that the co-evaporation method refers to an evaporation method in which evaporation is carried out from a plurality of evaporation sources at the same time in one treatment chamber.

Then, a film of 4,4'-bis[N-(1-naphthyl)-N-phenylamino] biphenyl (abbr.: NPB) was formed to a thickness of 10 nm over the layer 2103 including the composite material by the evaporation method using resistance heating to form a hole-transporting layer 2104.

In addition, bis(2-methyl-8-quinolinolato)(4-phenylphenolato)aluminum (abbr.: BAlq), NPB, and bis(2,3,5-triphenylpyrazinato)(dipivaloylmethanato)iridium(III) (abbr.: [Ir (tppr)$_2$(dpm)]) represented by Structural Formula (12) were co-evaporated to form a first light-emitting layer 2105a having a thickness of 20 nm over the hole-transporting layer 2104. Here, the weight ratio of BAlq, NPB, and [Ir(tppr)$_2$(dpm)] was adjusted to 1:0.25:0.06 (=BAlq:NPB:[Ir(tppr)$_2$(dpm)]).

Then, as in the formation of the first light-emitting layer 2105a, BAlq, NPB, and [Ir(tppr)$_2$(dpm)] represented by Structural Formula (12) were co-evaporated to form a second light-emitting layer 2105b having a thickness of 30 nm over the first light-emitting layer 2105a. Here, the weight ratio of BAlq, NPB, and [Ir(tppr)$_2$(dpm)] was adjusted to 1:0.1:0.06 (=BAlq:NPB:[Ir(tppr)$_2$(dpm)]).

Then, tris(8-quinolinolato)aluminum (abbr.: Alq$_a$) was deposited over the second light-emitting layer 2105b to a thickness of 10 nm, and bathophenanthroline (abbr.: BPhen) was deposited thereover to a thickness of 20 nm by an evaporation method using resistance heating to form an electron-transporting layer 2106.

Further, an electron-injecting layer 2107 was fainted on the electron-transporting layer 2106 by evaporating lithium fluoride to a thickness of 1 nm.

Lastly, by forming a film of aluminum with a film thickness of 200 nm over the electron-injecting layer 2107 by the evaporation method using resistance heating, a second electrode 2108 was formed. Thus, the light-emitting element 4 was manufactured.

Next, the comparative light-emitting element 2 is described. The comparative light-emitting element 2 was manufactured in a manner similar to that of the light-emitting element 4 except for the first light-emitting layer 2105a and the second light-emitting layer 2105b. As for the comparative light-emitting element 2, BAlq, NPB, and (acetylacetonato)bis(2,3,5-triphenylpyrazinato)iridium(III) (abbr.: [Ir(tppr)$_2$(acac)]) represented by Structural Formula (50) were co-evaporated to form the first light-emitting layer 2105a having a thickness of 20 nm over the hole-transporting layer 2104. Here, the weight ratio of BAlq, NPB, and [Ir(tppr)$_2$(acac)] was adjusted to 1:0.25:0.06 (=BAlq:NPB:[Ir(tppr)$_2$(acac)]).

Then, BAlq, NPB, and [Ir(tppr)$_2$(acac)] were co-evaporated to form the second light-emitting layer 2105b having a thickness of 30 nm over the first light-emitting layer 2105a. Here, the weight ratio of BAlq, NPB, and [Ir(tppr)$_2$(acac)] was adjusted to 1:0.1:0.06 (=BAlq:NPB:[Ir(tppr)$_2$(acac)]). Thus, the comparative light-emitting element 2 of this example was obtained.

The thus obtained light-emitting element 4 and the comparative light-emitting element 2 were put into a glove box under a nitrogen atmosphere so that each of the light-emitting elements was sealed so as not to be exposed to the air. Then, the operation characteristics of these light-emitting elements were measured. The measurement was carried out at room temperature (under an atmosphere maintaining 25° C.).

Figure 18:
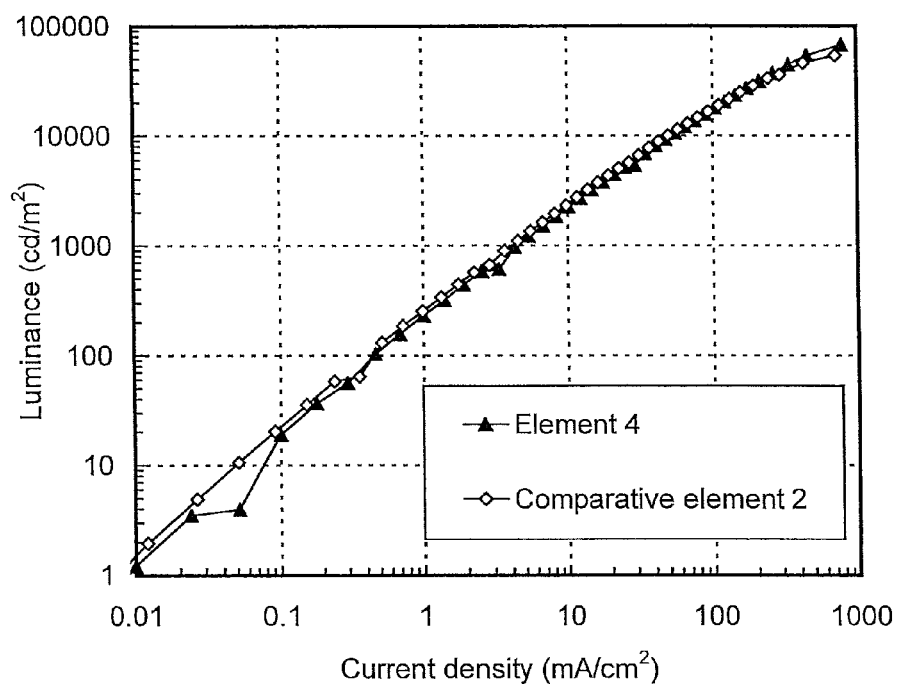
FIG. 18 shows a graph of current density-luminance characteristics of a light-emitting element 4 and a comparative light-emitting element 2.
Figure 19:
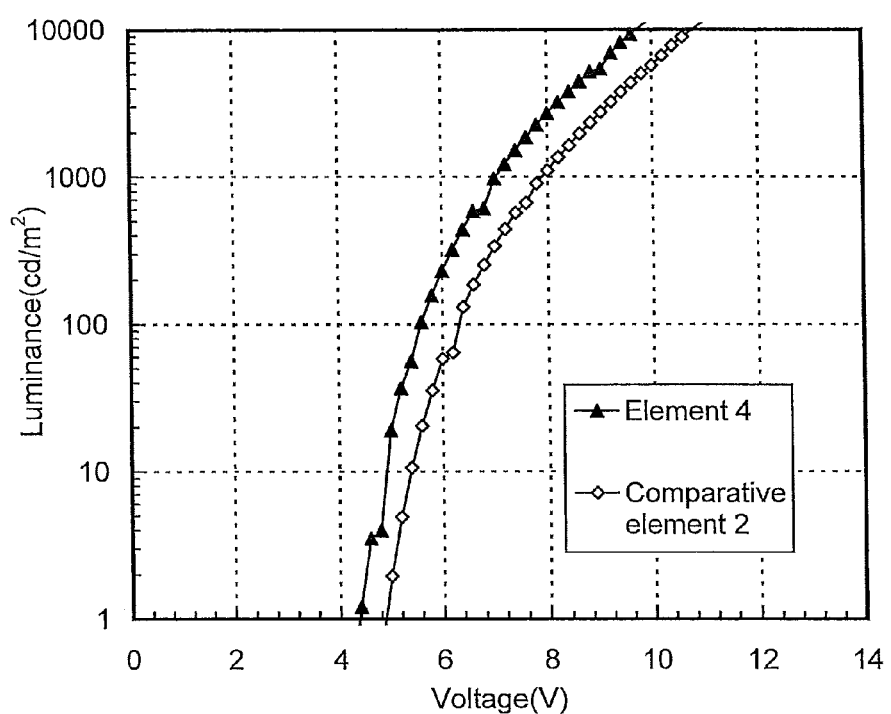
FIG. 19 shows a graph of voltage-luminance characteristics of the light-emitting element 4 the comparative light-emitting element 2.

Current density-luminance characteristics of the light-emitting element 4 and the comparative light-emitting element 2 are shown in FIG. 18. In FIG. 18, the horizontal axis represents current density (mA/cm$^2$) and the vertical axis represents luminance (cd/m$^2$). In addition, voltage-luminance characteristics thereof are shown in FIG. 19. In FIG. 19, the horizontal axis represents applied voltage (V) and the vertical axis represents luminance (cd/m$^2$). From FIG. 19, the light-emitting element 4 can be operated at a lower voltage than the comparative light-emitting element 2.

Figure 20:
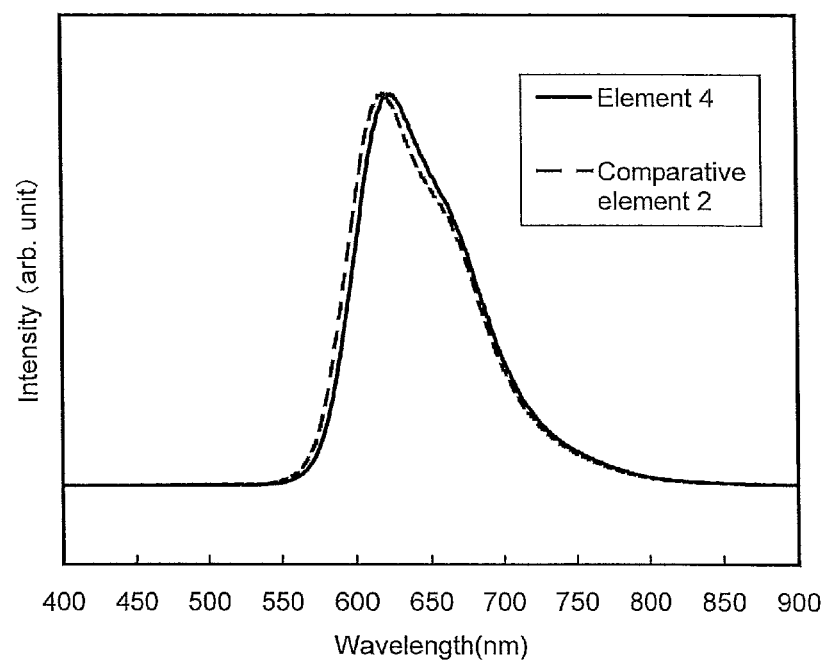
FIG. 20 shows emission spectra of the light-emitting element 4 and the comparative light-emitting element 2.

Further, emission spectra of the light-emitting element 4 and the comparative light-emitting element 2 at a current of 0.5 mA are shown in FIG. 20. From FIG. 20, the emission peak of the light-emitting element 4 is 624 nm, the emission peak of the comparative light-emitting element 2 is 619 nm. In addition, a CIE chromaticity coordinate of the light-emitting element 4 at a luminance of 970 cd/m$^2$ was (x=0.66, y=0.34). A CIE chromaticity coordinate of the comparative light-emitting element 2 at a luminance of 900 cd/m$^2$ was (x=0.65, y=0.35). Accordingly, while any of the manufactured light-emitting element 4 and the comparative light-emitting element 2 exhibited red light emission, the light-emitting element 4 exhibited more favorable red light emission than the comparative light-emitting element 2.

Further, as for the light-emitting element 4, when the luminance was 970 cd/m$^2$, the voltage was 7.0 V and the external quantum efficiency was 22%. As for the comparative light-emitting element 2, when the luminance was 900 cd/m$^2$, the voltage was 7.8 V and the external quantum efficiency was 21%.

Figure 22:
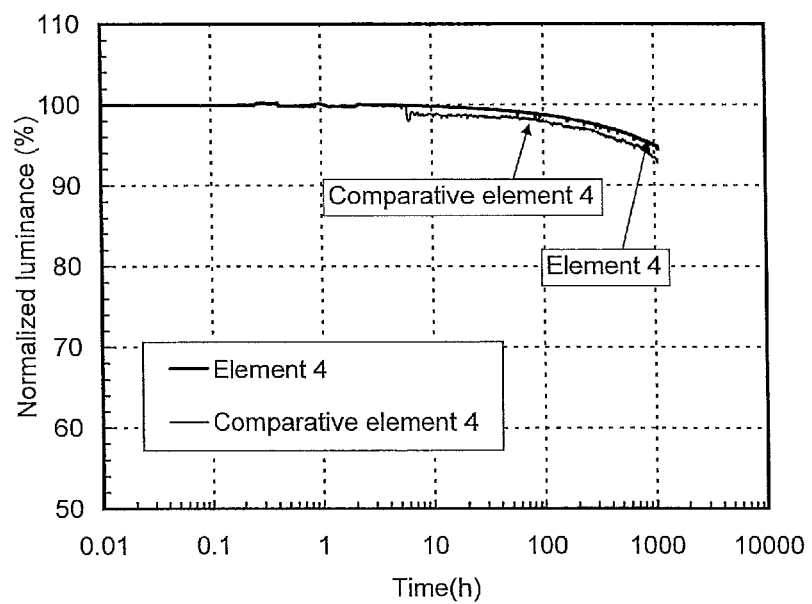
FIG. 22 shows results obtained by reliability tests of the light-emitting element 4 and the comparative light-emitting element 2.

Further, reliability tests of the light-emitting element 4 and the comparative light-emitting element 2 which were formed were carried out. In the reliability tests, the initial luminance was set at 1000 cd/m$^2$, these elements were operated at the constant current density, and the luminance was measured at regular intervals. Results of the reliability tests are shown in FIG. 22. In FIG. 22, the horizontal axis represents current flow time (hour) and the vertical axis represents the proportion of luminance with respect to the initial luminance at each time, that is, normalized luminance (%).

As shown in FIG. 22, the light-emitting element 4 and the comparative light-emitting element 2 are light-emitting elements whose luminances are hardly reduced with time, and has a long lifetime. The light-emitting element 4 kept 94% of the initial luminance after 1100-hour-operation. The luminance of the comparative light-emitting element 2 after 1100-hour-operation was 93% of the initial luminance. Therefore, decline in the luminance over time of the light-emitting element 4 is less likely to occur than that of the comparative light-emitting element 2 and the light-emitting element 4 has a long lifetime.

Accordingly, it was confirmed that the light-emitting element 4 of this example has sufficient characteristics to serve as a light-emitting element. In addition, the light-emitting element 4 exhibited favorable red light emission and had a long lifetime. Further, it was confirmed that the light-emitting element 4 using [Ir(tppr)$_2$(acac)], an organometallic complex in which both $R^{21}$ and $R^{22}$ are tert-butyl groups each having 4 carbon atoms represented by General Formula (G1) is a light-emitting element capable of being operated at a lower voltage than the comparative light-emitting element 2 using [Ir(tppr)$_2$(acac)], an organometallic complex in which both $R^{21}$ and $R^{22}$ are methyl groups each having 1 carbon atom represented by General Formula (G1).

Example 6

In this example, a specific example of synthesis of bis(5-phenyl-2,3-di-m-tolylpyrazinato)(dipivaloylmethanato)iridium(III) (abbr.: [Ir(5dmtppr)$_2$(dpm)]), which is an organometallic complex represented by following Structural Formula (45), according to an embodiment of the present invention, is described. The organometallic complex [Ir(5dmtppr)$_2$(dpm)] represented by Structural Formula (45) has a structure represented by General Formula (G1) in Embodiment 1, in which $R^1$, $R^2$, $R^4$ to $R^7$, and $R^9$ to $R^{15}$ are hydrogen, $R^3$ and $R^8$ are methyl groups each having 1 carbon atom, and $R^{21}$ and $R^{22}$ are tert-butyl groups each having 4 carbon atoms.

[Chemical Formula 27]

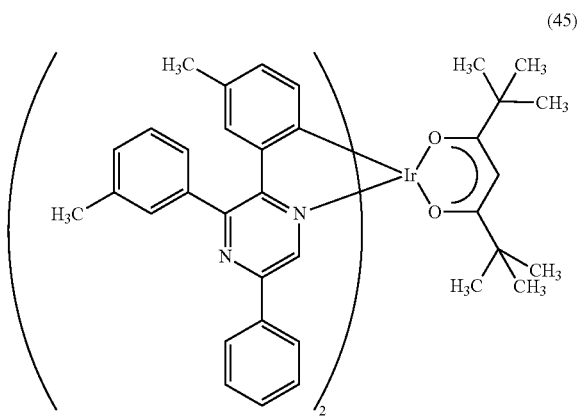

(45)

Note that the irradiation with microwaves was performed using a microwave synthesis system (Discover, manufactured by CEM Corporation) in this example described below.

Step 1: Synthesis of 2,3-di-m-tolylpyrazine

First, 2.39 g of 2,3-dichloropyrazine, 4.51 g of 3-methylphenyl boronic acid, 3.74 g of sodium carbonate, 0.17 g of bis(triphenylphosphine)palladium(II)dichloride (abbr.: Pd(PPh$_3$)$_2$Cl$_2$), 15 mL of water, and 15 mL of acetonitrile were put in a round-bottomed flask with a reflux pipe, and the air in the flask was replaced with argon. This reaction container was subjected to irradiation with microwaves (2.45 GHz, 100 W) for 3 hours and 40 minutes to be heated. Then, water was added to this solution and an organic layer was extracted with dichloromethane. The obtained organic layer was washed with water and dried with magnesium sulfate. After the drying, the solution was filtrated. The solvent of this solution was distilled off to obtain 2,3-di-m-tolylpyradine (a white powder, yield: 80%). A synthetic scheme of Step 1 is represented by (E4-1) below.

[Chemical Formula 28]

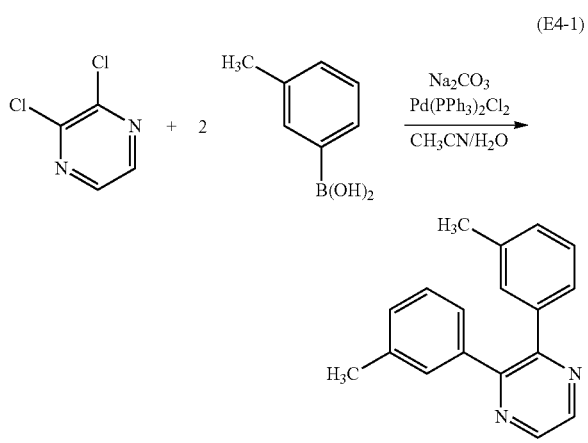

(E4-1)

Step 2: Synthesis of 2,3-di-m-tolylpyrazine-1-oxide

In a nitrogen atmosphere, 3.32 g of 2,3-di-m-tolylpyradine that was obtained by Step 1 above was dissolved in 50 mL of dichloromethane, 4.42 g of 3-chlorobenzoic acid (abbr.: mCPBA) was added, and the solution was stirred for 24 hours at room temperature. Then, water was added to this solution and an organic layer was extracted with dichloromethane. The obtained organic layer was washed with a saturated sodium hydrogencarbonate water solution and dried with magnesium sulfate. After the drying, the solution was filtrated. The solvent of this solution was distilled off and purification was conducted by silica gel column chromatography which uses ethyl acetate as a developing solvent. Further, recrystallization was caused with a mixed solvent of dichloromethane and hexane to obtain 2,3-di-m-tolylpyrazine-1-oxide (a white powder, yield: 59%). A synthesis scheme of Step 2 is represented by (E4-2) below.

[Chemical Formula 29]

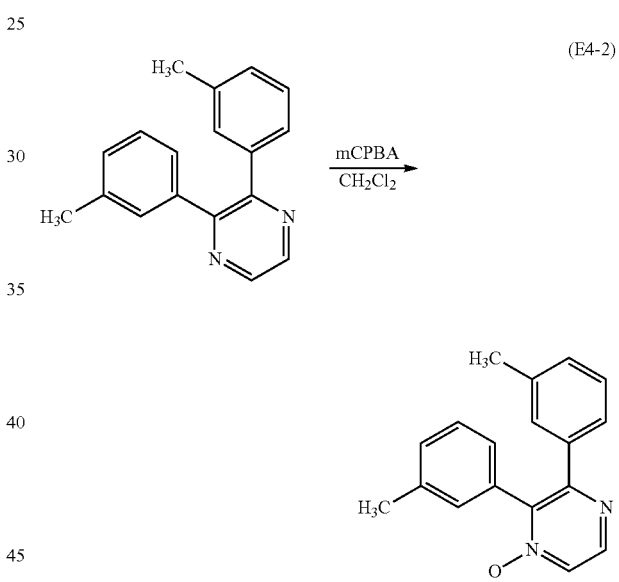

(E4-2)

Step 3: Synthesis of 5-chloro-2,3-di-m-tolylpyrazine

In a nitrogen atmosphere, to 2.08 g of 2,3-di-m-tolylpyradine-1-oxide that was obtained by Step 2 above, 12 mL of phosphoryl chloride was added and reflux for 1 hour was performed by heating. Then, this solution was added to ice water. Potassium carbonate was added to this aqueous solution to adjust the aqueous solution so that it is neutral, and an organic layer was extracted with dichloromethane. The obtained organic layer was washed with water and dried with magnesium sulfate. After the drying, the solution was filtrated. The solvent of this solution was distilled off to obtain 5-chloro-2,3-di-m-tolylpyrazine (a yellow oily substance, yield: 100%). A synthesis scheme of Step 3 is represented by (E4-3) below.

[Chemical Formula 30]

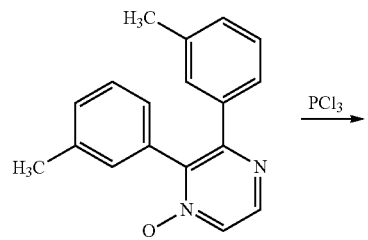

(E4-3)

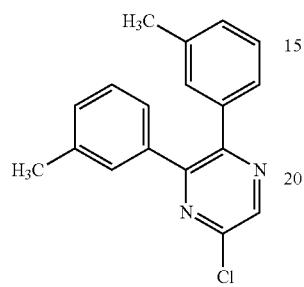

[Chemical Formula 31]

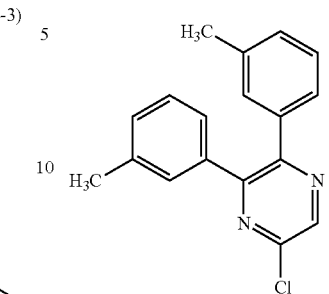

(E4-4)

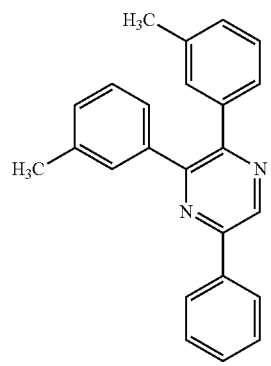

H5dmtppr

Step 4: Synthesis of 5-phenyl-2,3-di-m-tolylpyrazine (abbr.: H5dmtppr)

2.36 g of 5-chloro-2,3-di-m-tolylpyrazine that was obtained by Step 3 above, 0.98 g of phenylboronic acid, 0.85 g of sodium carbonate, 0.036 g of bis(triphenylphosphine)palladium(H)dichloride (abbr.: Pd(PPh$_3$)$_2$Cl$_2$), 15 mL of water, and 15 mL of acetonitrile were put in a recovery flask with a reflux pipe, and the air in the flask was replaced with argon. This reaction container was subjected to irradiation with microwaves (2.45 GHz, 100 W) for 1 hour and 30 minutes to be heated. Then, water was added to this solution and an organic layer was extracted with dichloromethane. The obtained organic layer was washed with water and dried with magnesium sulfate. After the drying, the solution was filtrated. The solvent of this solution was distilled off to obtain H5dmtppr (an orange oily substance, yield: 100%). A synthesis scheme of Step 4 is represented by (E4-4) below.

Step 5: Synthesis of di-μ-chloro-bis[bis(5-phenyl-2,3-di-m-tolylpyrazinato)iridium(III)] (abbr.: [Ir(5dmtppr)$_2$Cl]$_2$)

Then, 15 mL of 2-ethoxyethanol, 5 mL of water, 2.84 g of 5-phenyl-2,3-di-m-tolylpyrazine that was obtained by Step 4 above, 1.01 g of iridium chloride hydrate (IrCl$_3$·nH$_2$O) (manufactured by Furuya Metal Co., Ltd.) were put in a recovery flask with a reflux pipe, and the atmosphere in the flask was substituted by argon. Then, irradiation with microwaves (2.45 GHz, 100 W) for 30 minutes was performed to cause reaction. The reacted solution was concentrated and the obtained residue was washed with ethanol to obtain a binuclear complex [Ir(5dmtppr)$_2$Cl]$_2$ (a red powder, yield: 88%). A synthetic scheme of Step 5 is represented by (E4-5) below.

[Chemical Formula 32]

(E4-5)

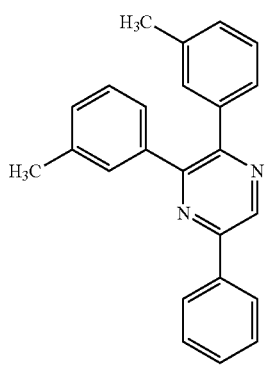

H5dmtppr

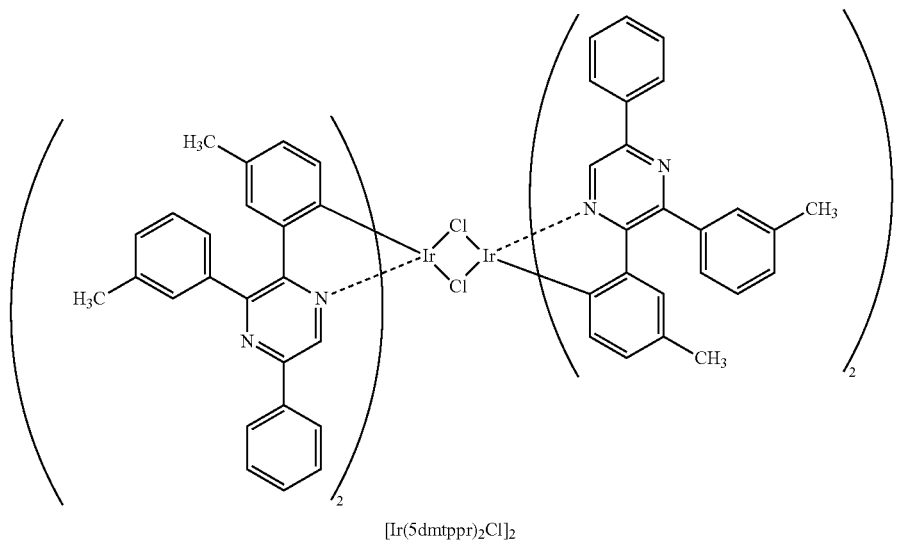

[Ir(5dmtppr)₂Cl]₂

Step 6: Synthesis of bis(5-phenyl-2,3-di-m-tolylpyrazinato)(dipivaloylmethanato) iridium(III) (abbr.: [Ir(5dmtppr)₂(dpm)])

First, 25 mL of 2-ethoxyethanol, 2.66 g of [Ir(5dmtppr)₂Cl]₂, which is a binuclear complex obtained in Step 2 above, 0.91 mL of dipivaloylmethane, and 1.57 g of sodium carbonate were put in a recovery flask with a reflux pipe, and the air in the flask was replaced with argon. Then, irradiation with microwaves (2.45 GHz, 100 W) for 30 minutes was performed to cause reaction. The reacted solution was filtered and the obtained solvent of the filtrate was distilled off and purification was conducted by silica gel column chromatography which uses toluene as a developing solvent. Further, recrystallization was caused with methanol to obtain a dark red powder in a yield of 77%, which was an object. A synthetic scheme of Step 6 is represented by (E4-6) below.

[Chemical Formula 33]

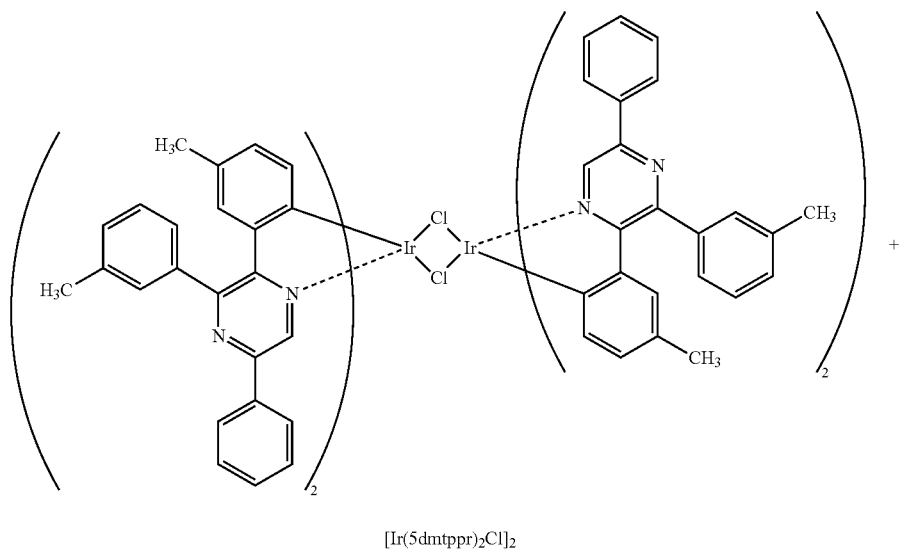

(E4-6)

[Ir(5dmtppr)₂Cl]₂

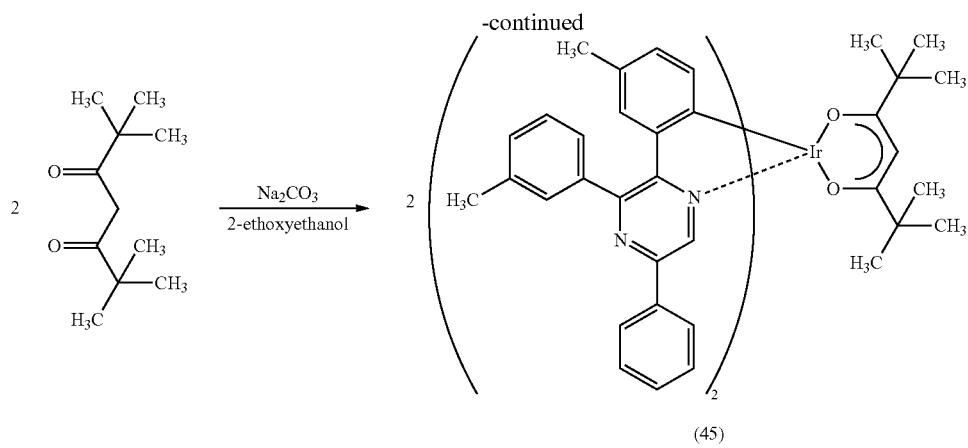

(45)

Figure 23:
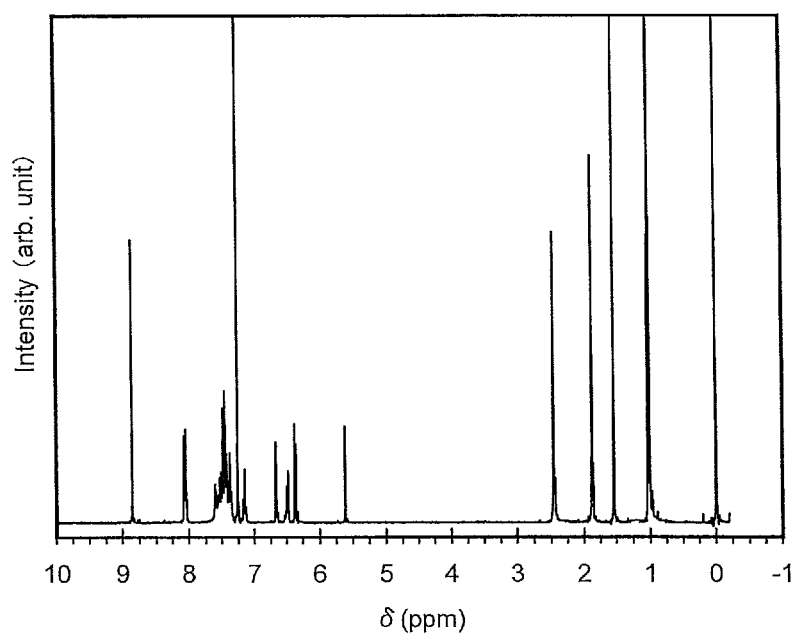
FIG. 23 shows a $^1$H-NMR chart of bis(5-phenyl-2,3-di-m-tolylpyrazinato)(dipivaloylmethanato)iridium(III)

Note that the dark red power obtained by Step 6 above was confirmed to be an object [Ir(5dmtppr)$_2$(dpm)] by nuclear magnetic resonance spectrometry ($^1$H-NMR). The $^1$H-NMR analysis result of the obtained substance is shown below. A $^1$H-NMR chart is shown in FIG. 23.

$^1$H-NMR. δ (CDCl$_3$): 1.02 (m, 18H), 1.88 (s, 6H), 2.46 (s, 6H), 5.16 (s, 1H), 6.36 (d, 2H), 6.48 (dd, 2H), 6.67 (s, 2H), 7.60-7.35 (m, 14H), 8.06 (m, 4H), 8.85 (s, 2H).

From these measurement results, it is understood that in this example, [Ir(5dmtppr)$_2$(dpm)], the organometallic complex represented by above Structural Formula (45) was obtained.

Figure 24:
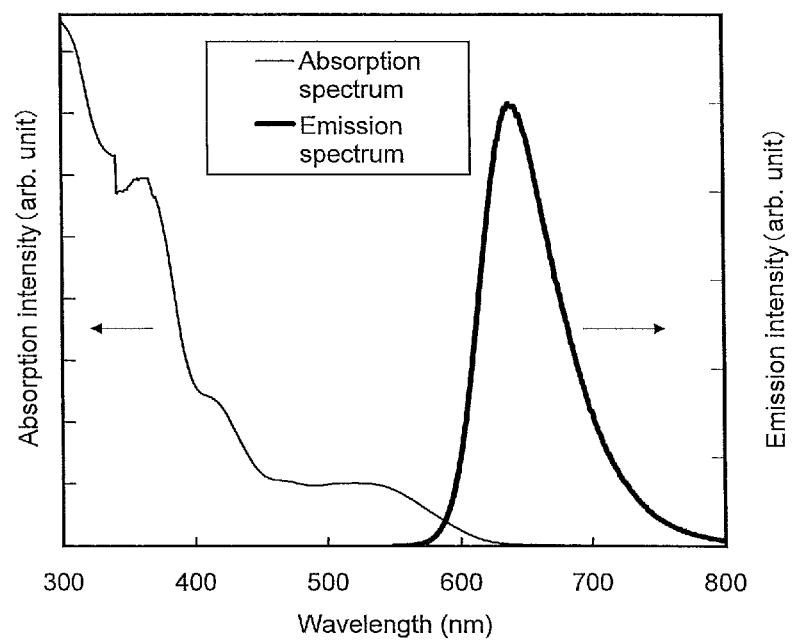
FIG. 24 shows an absorption spectrum and an emission spectrum of bis(5-phenyl-2,3-di-m-tolylpyrazinato)(dipivaloylmethanato)iridium(III)

Next, [Ir(5dmtppr)$_2$(dpm)] was analyzed by ultraviolet-visible (UV) absorption spectroscopy. The UV spectrum was measured with an ultraviolet-visible spectrophotometer (V-550, manufactured by JASCO Corporation), using a dichloromethane solution (0.091 mmol/L) at room temperature. Further, an emission spectrum of [Ir(5dmtppr)$_2$(dpm)] was measured. The emission spectrum was measured with use of a fluorescence spectrophotometer (FS920, manufactured by Hamamatsu Photonics K.K.), using a degassed dichloromethane solution (0.55 mmol/L) at room temperature. The measurement results are shown in FIG. 24. The horizontal axis indicates a wavelength (nm) and the vertical axes indicate an absorption intensity (arbitrary unit) and an emission intensity (arbitrary unit).

As shown in FIG. 24, [Ir(5dmtppr)$_2$(dpm)], the organometallic complex according to an embodiment of the present invention, has a peak of emission spectrum at 639 nm, and red light was observed from the dichloromethane solution.

This application is based on Japanese Patent Application serial No. 2008-293731 filed with Japan Patent Office on Nov. 17, 2008, the entire contents of which are hereby incorporated by reference.

What is claimed is:

1. A method for manufacturing a light-emitting device, comprising the steps of:
   forming a light-emitting layer comprising a host material and a guest material over a first electrode; and
   forming a second electrode over the light-emitting layer,
   wherein the light-emitting layer is formed by a dry process,
   wherein the guest material is an organometallic complex represented by General Formula (G1),

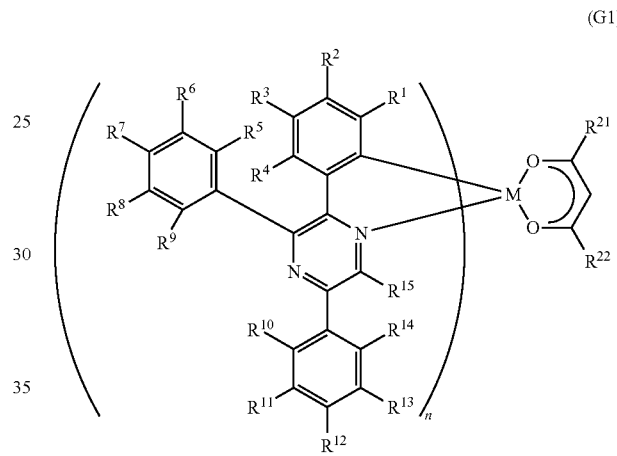

(G1)

wherein each of $R^1$ to $R^{15}$ represents hydrogen or an alkyl group having 1 to 4 carbon atoms,
wherein one of $R^{21}$ and $R^{22}$ represents an alkyl group having 2 to 10 carbon atoms and the other of $R^{21}$ and $R^{22}$ represents an alkyl group having 1 to 10 carbon atoms,
wherein M is a central metal and represents an element belonging to Group 9 or Group 10, and
wherein n is 1 or 2.

2. The method for manufacturing a light-emitting device, according to claim 1, wherein the dry process is an evaporation method.

3. The method for manufacturing a light-emitting device, according to claim 1, wherein the host material has a molecular weight greater than or equal to 100 and less than or equal to 2000.

4. The method for manufacturing a light-emitting device, according to claim 1, further comprising the steps of:
   forming a hole-injecting layer between the first electrode and the light-emitting layer;
   forming a hole-transporting layer between the hole-injecting layer and the light-emitting layer;
   forming an electron-transporting layer between the light-emitting layer and the second electrode, and
   forming an electron-injecting layer between the electron-transporting layer and the second electrode.

5. The method for manufacturing a light-emitting device, according to claim 1, wherein the each of $R^1$ to $R^{15}$ represents hydrogen.

6. The method for manufacturing a light-emitting device, according to claim 1, wherein the central metal is iridium.

7. A method for manufacturing a light-emitting device, comprising the steps of:
   forming a first light-emitting layer over a first electrode;
   forming a second light-emitting layer comprising a host material and a guest material over the first light-emitting layer; and
   forming a second electrode over the second light-emitting layer,
   wherein the second light-emitting layer is formed by a dry process,
   wherein the guest material is an organometallic complex represented by General Formula (G1),

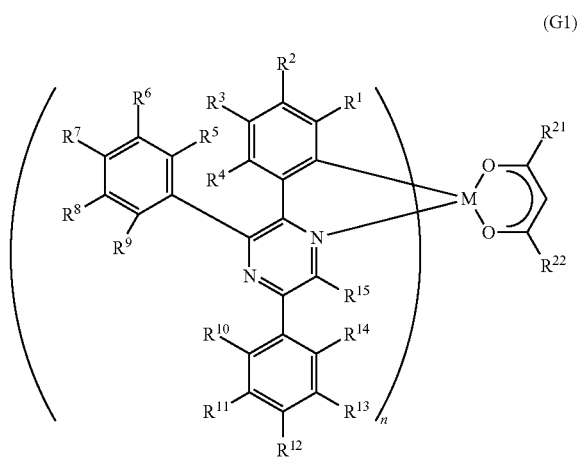

(G1)

wherein each of $R^1$ to $R^{15}$ represents hydrogen or an alkyl group having 1 to 4 carbon atoms,
wherein one of $R^{21}$ and $R^{22}$ represents an alkyl group having 2 to 10 carbon atoms and the other of $R^{21}$ and $R^{22}$ represents an alkyl group having 1 to 10 carbon atoms,
wherein M is a central metal and represents an element belonging to Group 9 or Group 10, and
wherein n is 1 or 2.

8. The method for manufacturing a light-emitting device, according to claim 7, wherein the dry process is an evaporation method.

9. The method for manufacturing a light-emitting device, according to claim 7, wherein the host material has a molecular weight greater than or equal to 100 and less than or equal to 2000.

10. The method for manufacturing a light-emitting device, according to claim 7, further comprising the steps of:
   forming a hole-injecting layer between the first electrode and the first light-emitting layer;
   forming a hole-transporting layer between the hole-injecting layer and the first light-emitting layer;
   forming an electron-transporting layer between the second light-emitting layer and the second electrode, and
   forming an electron-injecting layer between the electron-transporting layer and the second electrode.

11. The method for manufacturing a light-emitting device, according to claim 7, wherein the each of $R^1$ to $R^{15}$ represents hydrogen.

12. The method for manufacturing a light-emitting device, according to claim 7, wherein the central metal is iridium.

13. A method for manufacturing a light-emitting device, comprising the steps of:
   forming a first light-emitting layer over a first electrode;
   forming a charge-generating layer over the first light-emitting layer;
   forming a second light-emitting layer comprising a host material and a guest material over the charge-generating layer; and
   forming a second electrode over the second light-emitting layer,
   wherein the second light-emitting layer is formed by a dry process,
   wherein the guest material is an organometallic complex represented by General Formula (G1),

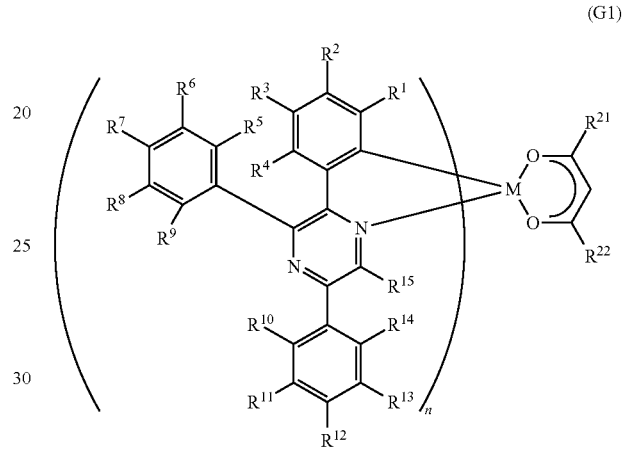

(G1)

wherein each of $R^1$ to $R^{15}$ represents hydrogen or an alkyl group having 1 to 4 carbon atoms,
wherein one of $R^{21}$ and $R^{22}$ represents an alkyl group having 2 to 10 carbon atoms and the other of $R^{21}$ and $R^{22}$ represents an alkyl group having 1 to 10 carbon atoms,
wherein M is a central metal and represents an element belonging to Group 9 or Group 10, and
wherein n is 1 or 2.

14. The method for manufacturing a light-emitting device, according to claim 13, wherein the dry process is an evaporation method.

15. The method for manufacturing a light-emitting device, according to claim 13, wherein the host material has a molecular weight greater than or equal to 100 and less than or equal to 2000.

16. The method for manufacturing a light-emitting device, according to claim 13, further comprising the steps of:
   forming a hole-injecting layer between the first electrode and the first light-emitting layer;
   forming a hole-transporting layer between the hole-injecting layer and the first light-emitting layer;
   forming an electron-transporting layer between the second light-emitting layer and the second electrode, and
   forming an electron-injecting layer between the electron-transporting layer and the second electrode.

17. The method for manufacturing a light-emitting device, according to claim 13, wherein the each of $R^1$ to $R^{15}$ represents hydrogen.

18. The method for manufacturing a light-emitting device, according to claim 13, wherein the central metal is iridium.

* * * * *